(12) United States Patent
Kim et al.

(10) Patent No.: US 12,356,661 B2
(45) Date of Patent: Jul. 8, 2025

(54) SEMICONDUCTOR DEVICE AND METHOD OF FABRICATING THE SAME

(71) Applicant: SAMSUNG ELECTRONICS CO., LTD., Suwon-si (KR)

(72) Inventors: Kyungsoo Kim, Hwaseong-si (KR); Jinyoung Park, Anyang-si (KR); Kyen-Hee Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 546 days.

(21) Appl. No.: 17/804,397

(22) Filed: May 27, 2022

(65) Prior Publication Data

US 2023/0081783 A1    Mar. 16, 2023

(30) Foreign Application Priority Data

Sep. 16, 2021    (KR) .......................... 10-2021-0123811

(51) Int. Cl.
*H10D 30/67*    (2025.01)
*H01L 21/02*    (2006.01)
(Continued)

(52) U.S. Cl.
CPC ..... *H10D 30/6729* (2025.01); *H01L 21/0259* (2013.01); *H10D 30/031* (2025.01);
(Continued)

(58) Field of Classification Search
CPC ........... H01L 29/41733; H01L 29/0665; H01L 29/66439; H01L 21/823864; H01L 29/78618; H01L 29/775; H01L 29/42392; H01L 21/823814; H01L 29/78696; H01L 29/0847; H01L 29/66545;
(Continued)

(56) References Cited

U.S. PATENT DOCUMENTS 9,324,709 B2    4/2016    Basker et al.
10,121,874 B2   11/2018   Zhang
(Continued)

FOREIGN PATENT DOCUMENTS

KR       10-2195406        12/2020
KR       10-2022-0163538   12/2022

*Primary Examiner* — Mouloucoulaye Inoussa
(74) *Attorney, Agent, or Firm* — MORGAN, LEWIS & BOCKIUS LLP

(57) ABSTRACT

A semiconductor device includes an active pattern on a substrate, a source/drain pattern on the active pattern, a gate electrode on a channel pattern connected to the source/drain pattern, an active contact on the source/drain pattern, a first lower interconnection line on the active contact, a second lower interconnection line on the gate electrode, a first spacer between the gate electrode and the active contact, and a second spacer between the first spacer and the gate electrode or the active contact. The gate electrode includes an electrode body portion and an electrode protruding portion protruding from a top surface thereof and contacting the second lower interconnection line. The active contact includes a contact body portion and a contact protruding portion protruding from a top surface thereof and contacting the first lower interconnection line. A top surface of the first spacer is higher than a top surface of the second spacer.

20 Claims, 30 Drawing Sheets

(51) Int. Cl.
*H10D 30/01* (2025.01)
*H10D 62/10* (2025.01)
*H10D 64/01* (2025.01)
*H10D 84/01* (2025.01)
*H10D 84/03* (2025.01)
*H10D 84/85* (2025.01)

(52) U.S. Cl.
CPC ..... *H10D 30/6713* (2025.01); *H10D 30/6735* (2025.01); *H10D 30/6757* (2025.01); *H10D 62/118* (2025.01); *H10D 64/017* (2025.01); *H10D 84/0167* (2025.01); *H10D 84/017* (2025.01); *H10D 84/0186* (2025.01); *H10D 84/038* (2025.01); *H10D 84/85* (2025.01)

(58) Field of Classification Search
CPC ....... H01L 21/823871; H01L 29/66742; H01L 21/0259; H01L 29/0673; H01L 27/092; H01L 21/823807; H01L 29/665; H01L 29/41766; H01L 29/1079; H01L 29/7848; H01L 29/161; H01L 29/165; H01L 21/76883; H01L 29/41791; H01L 23/5226; H01L 29/6681; H01L 21/76834; H01L 29/785; H01L 27/0924; H01L 29/41775; H01L 21/76897; H01L 21/76832; H01L 23/5283; H01L 21/823821; H01L 21/823828; H01L 23/485; H01L 27/0886; H01L 27/0207; H01L 27/11807; H01L 21/823431; H01L 2029/7858; H01L 2027/11861; H01L 2027/11864; H01L 2027/11831; H01L 2027/11875; H01L 2027/11887; H01L 2027/11812; H01L 2027/11874; B82Y 10/00

See application file for complete search history.

(56) References Cited

U.S. PATENT DOCUMENTS

| | | |
|---|---|---|
| 10,497,612 B2 | 12/2019 | Xie et al. |
| 10,784,363 B2 | 9/2020 | Cheng et al. |
| 10,923,475 B2 | 2/2021 | Shin et al. |
| 2015/0194427 A1 | 7/2015 | Sengupta et al. |
| 2016/0079354 A1* | 3/2016 | Park ............... H01L 27/0924 257/386 |
| 2018/0033890 A1* | 2/2018 | Park ............... H01L 29/7856 |
| 2019/0139955 A1* | 5/2019 | Kim ............... H01L 29/4238 |
| 2020/0075595 A1* | 3/2020 | Shin ............... H01L 21/823871 |
| 2020/0176575 A1* | 6/2020 | Lee ............... H01L 21/823431 |
| 2021/0233847 A1* | 7/2021 | Kim ............... H01L 23/535 |
| 2021/0257474 A1* | 8/2021 | Lee ............... H01L 21/845 |
| 2022/0020859 A1* | 1/2022 | Cho ............... H01L 21/76895 |
| 2022/0077162 A1* | 3/2022 | Hong ............... H01L 29/78696 |
| 2022/0165729 A1* | 5/2022 | Shin ............... H01L 21/823468 |
| 2022/0165857 A1* | 5/2022 | Park ............... H01L 29/775 |
| 2022/0302274 A1* | 9/2022 | Kim ............... H01L 27/088 |
| 2022/0302310 A1* | 9/2022 | Choi ............... H01L 23/5283 |
| 2022/0320115 A1* | 10/2022 | Bae ............... H01L 27/0207 |
| 2022/0384591 A1* | 12/2022 | Lee ............... H01L 27/088 |
| 2022/0399330 A1* | 12/2022 | Choi ............... H01L 29/775 |
| 2023/0047343 A1* | 2/2023 | Lee ............... H01L 21/76895 |

* cited by examiner

SEMICONDUCTOR DEVICE AND METHOD OF FABRICATING THE SAME

CROSS-REFERENCE TO RELATED APPLICATIONS

This U.S. non-provisional patent application claims priority under 35 U.S.C. § 119 to Korean Patent Application No. 10-2021-0123811, filed on Sep. 16, 2021, in the Korean Intellectual Property Office, the entire contents of which are herein incorporated by reference.

TECHNICAL FIELD

The present inventive concept relates to a semiconductor device, and more particularly, to a semiconductor device including a field effect transistor and a method of fabricating the same.

DISCUSSION OF RELATED ART

A semiconductor device includes an integrated circuit containing metal-oxide-semiconductor field-effect transistors (MOSFETs). To meet an increasing demand for a semiconductor device with a smaller pattern size and higher performance fabricated using a reduced design rule, the MOSFETs are being aggressively scaled down. The scale-down of the MOSFETs may lead to deterioration in operational properties of the semiconductor device. For example, short margin may be reduced when two conductive components of the MOSFET are closely placed due to the scale-down. A variety of studies are being conducted to overcome technical limitations associated with the scale-down of the semiconductor device and to realize high performance semiconductor devices.

SUMMARY

An example embodiment of the present inventive concept provides a semiconductor device with enhanced electric characteristics.

An example embodiment of the present inventive concept provides a method of reducing a process failure, which may occur in a process of fabricating a semiconductor device.

According to an example embodiment of the present inventive concept, a semiconductor device may include an active pattern on a substrate, a source/drain pattern on the active pattern, a channel pattern connected to the source/drain pattern, a gate electrode on the channel pattern, an active contact on the source/drain pattern, a first lower interconnection line on the active contact, a second lower interconnection line provided on the gate electrode and disposed at a level the same as that of the first lower interconnection line, a first spacer between the gate electrode and the active contact, and a second spacer spaced apart from the first spacer with the gate electrode or the active contact interposed therebetween. The gate electrode may include an electrode body portion and an electrode protruding portion, which protrudes from a top surface of the electrode body portion and is in contact with a bottom surface of the second lower interconnection line. The active contact may include a contact body portion and a contact protruding portion, which protrudes from a top surface of the contact body portion and is in contact with a bottom surface of the first lower interconnection line. A top surface of the first spacer may be higher than a top surface of the second spacer.

According to an example embodiment of the present inventive concept, a semiconductor device may include an active pattern on a substrate, a source/drain pattern on the active pattern, a channel pattern connected to the source/drain pattern, a gate electrode on the channel pattern, an active contact on the source/drain pattern, a first lower interconnection line on the active contact, a second lower interconnection line provided on the gate electrode and disposed at a level the same as that of the first lower interconnection line, and a first spacer between the gate electrode and the active contact. The gate electrode may include an electrode body portion and an electrode protruding portion, which protrudes from a top surface of the electrode body portion and is in contact with a bottom surface of the second lower interconnection line, and the active contact may include a contact body portion and a contact protruding portion, which protrudes from a top surface of the contact body portion and is in contact with a bottom surface of the first lower interconnection line. The first spacer may include a first portion adjacent to the electrode protruding portion, a second portion adjacent to the contact protruding portion, and a third portion between the first portion and the second portion. A top surface of the first portion and a top surface of the second portion may be higher than a top surface of the third portion.

According to an example embodiment of the present inventive concept, a semiconductor device may include a substrate including a PMOSFET region and an NMOSFET region, which are adjacent to each other in a first direction, a first active pattern and a second active pattern provided on the PMOSFET and NMOSFET regions, respectively, a first source/drain pattern on the first active pattern and a second source/drain pattern on the second active pattern, active contacts on the first source/drain pattern and the second source/drain pattern, a first channel pattern and a second channel pattern, which are respectively connected to the first source/drain pattern and the second source/drain pattern, each of the first and second channel patterns including a first semiconductor pattern, a second semiconductor pattern, and a third semiconductor pattern, which are sequentially stacked and spaced apart from each other, a first gate electrode and a second gate electrode, which extend in the first direction to cross the first and second active patterns, respectively, and each of which includes a first portion interposed between the substrate and the first semiconductor pattern, a second portion interposed between the first semiconductor pattern and the second semiconductor pattern, a third portion interposed between the second semiconductor pattern and the third semiconductor pattern, and a fourth portion on the third semiconductor pattern, a first gate insulating layer and a second gate insulating layer, which are respectively interposed between the first channel pattern and the first gate electrode and between the second channel pattern and the second gate electrode, a first metal layer on the first and second gate electrodes, a first spacer between the first gate electrode and one of the active contacts, a second spacer spaced apart from the first spacer with the first gate electrode or one of the active contacts interposed therebetween, and a second metal layer provided on the first metal layer. The first metal layer may include first interconnection lines, and the second metal layer may include second interconnection lines, which are electrically and respectively connected to the first interconnection lines. Each of the active contacts may include a contact body portion and a contact protruding portion, which protrudes from a top surface of the contact body portion and is in contact with a bottom surface of one of the first interconnection lines, and each of the first and second gate electrodes may include an electrode body portion and an electrode protruding portion, which protrudes from a top surface of the electrode body portion and is in contact with a bottom surface of an other one of the first interconnection line. A top surface of the first spacer may be higher than a top surface of the second spacer.

According to an example embodiment of the present inventive concept, a method of fabricating a semiconductor device may include forming a device isolation layer on a substrate to define an active pattern, forming a source/drain pattern and a channel pattern on the active pattern, forming a gate electrode on the channel pattern, forming an active contact on the source/drain pattern, forming a mask pattern to cover the gate electrode and the active contact, and patterning the gate electrode and the active contact using the mask pattern as an etch mask. As a result of the patterning, the active contact may be formed to include a contact body portion and a contact protruding portion, which protrudes from a top surface of the contact body portion and is in contact with a bottom surface of a first lower interconnection line. As a result of the patterning, the gate electrode may be formed to include an electrode body portion and an electrode protruding portion, which protrudes from a top surface of the electrode body portion and is in contact with a bottom surface of a second lower interconnection line. The mask pattern may include a first portion formed on the active contact to define the contact protruding portion, a second portion formed on the gate electrode to define the electrode protruding portion, and a third portion connecting the first portion to the second portion.

BRIEF DESCRIPTION OF THE DRAWINGS

Example embodiments of the present inventive concept will be more clearly understood from the following detailed description taken in conjunction with the accompanying drawings, in which.

Figure 1:
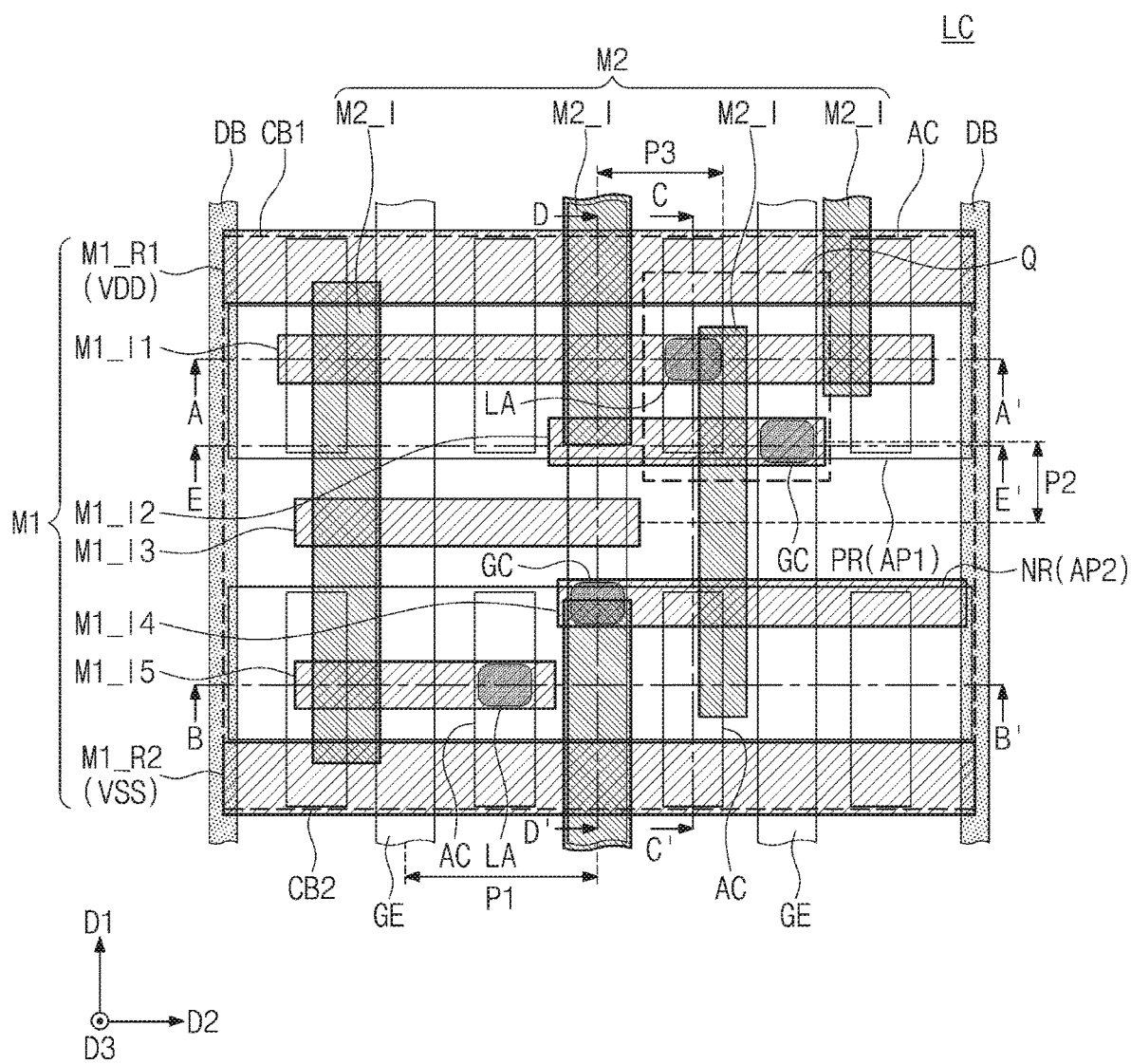
FIG. 1 is a plan view illustrating a semiconductor device according to an example embodiment of the present inventive concept.

Since the drawings in FIGS. 1-13D are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Example embodiments of the present inventive concept will now be described more fully with reference to the accompanying drawings, in which example embodiments are shown.

Figure 2A:
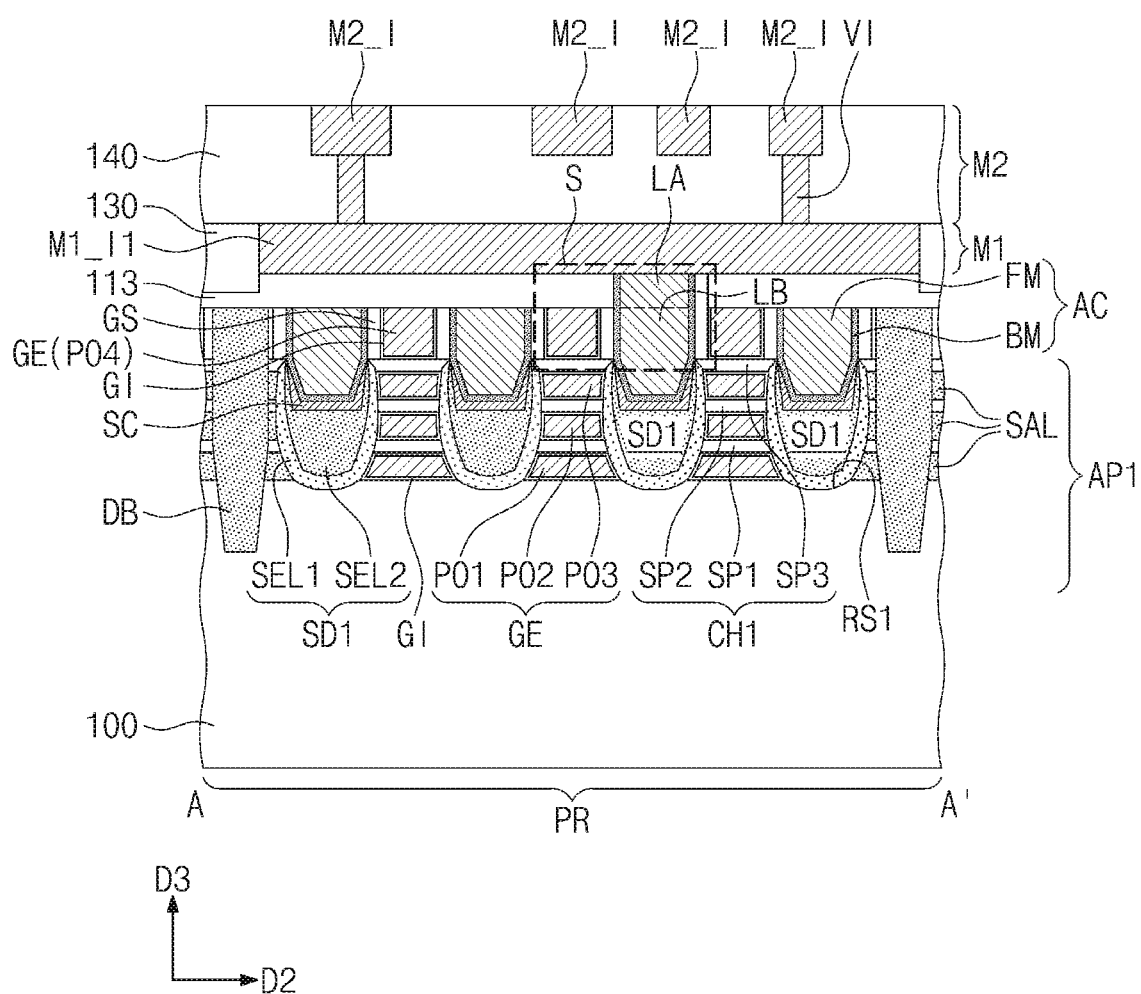
FIGS. 2A to 2E are cross-sectional views taken along lines A-A', B-B', C-C', D-D', and E-E', respectively, of FIG. 1.
Figure 2B:
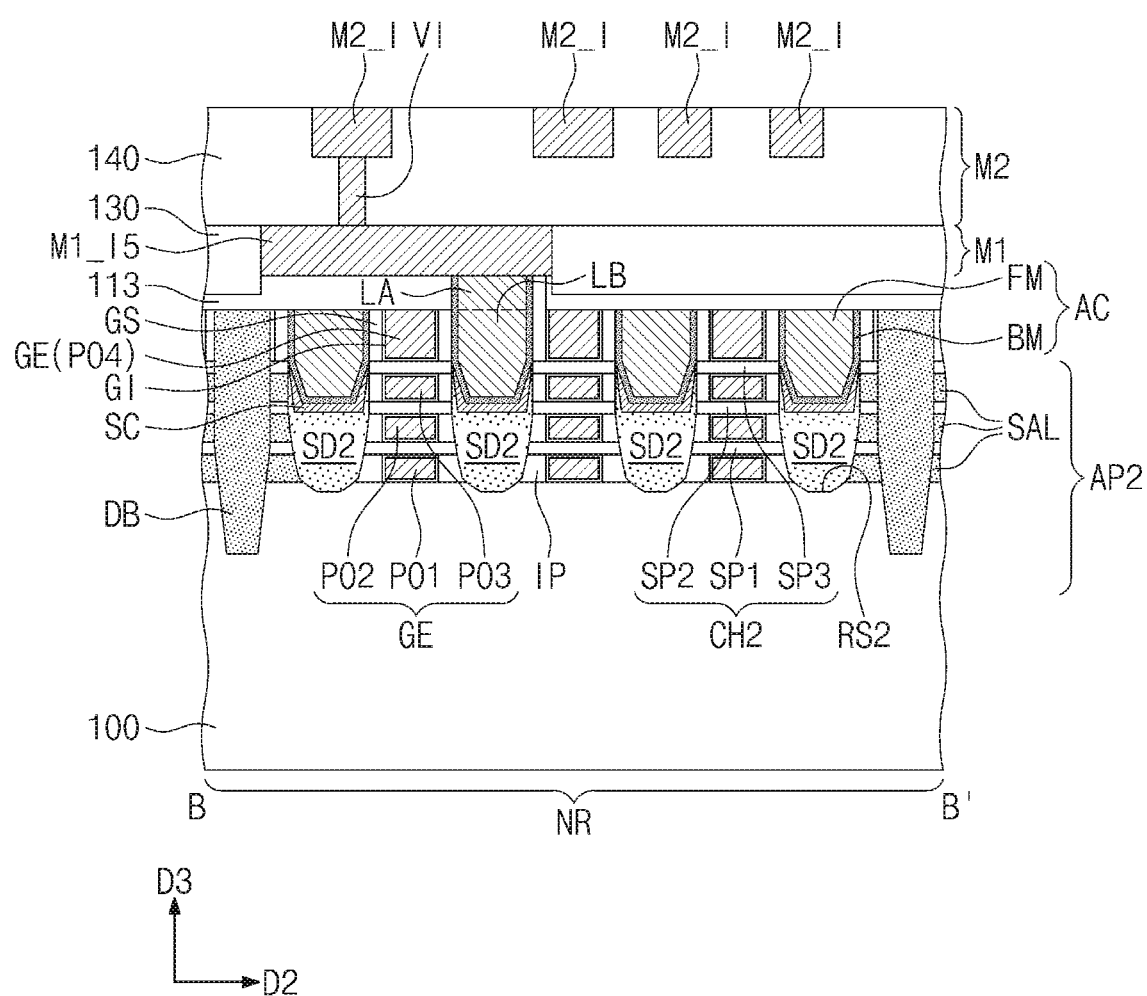
Figure 2C:
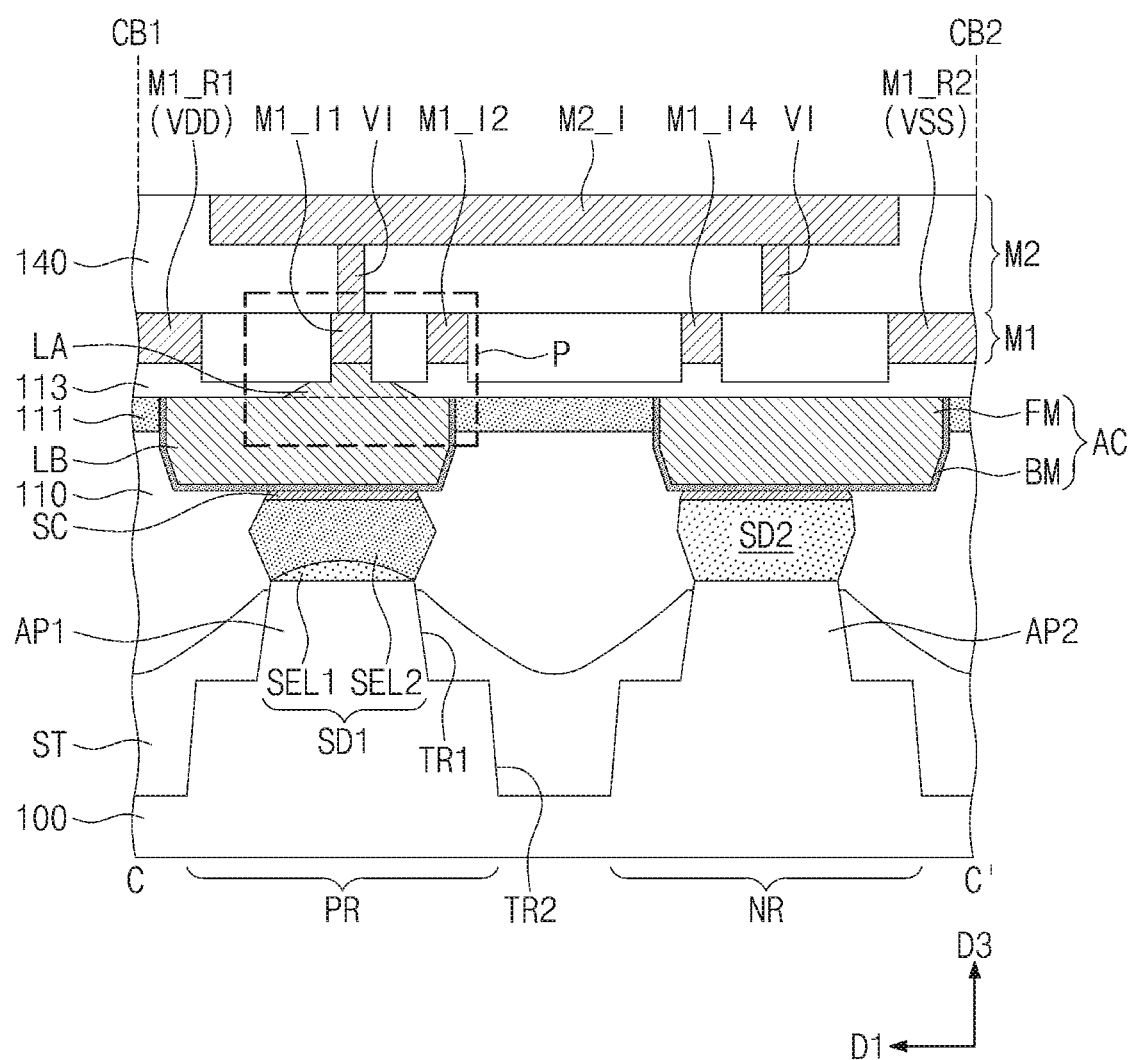
Figure 2D:
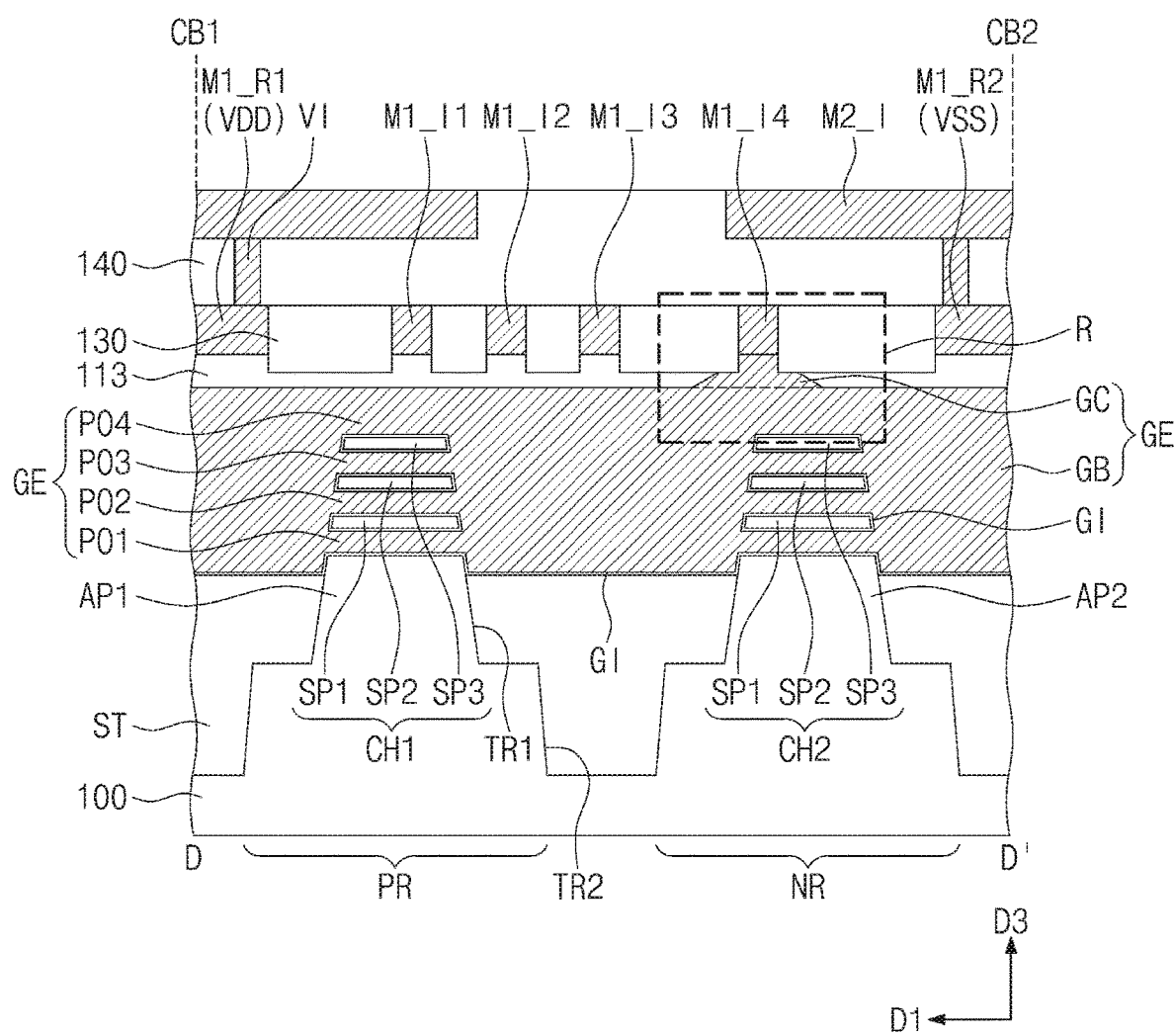
Figure 2E:
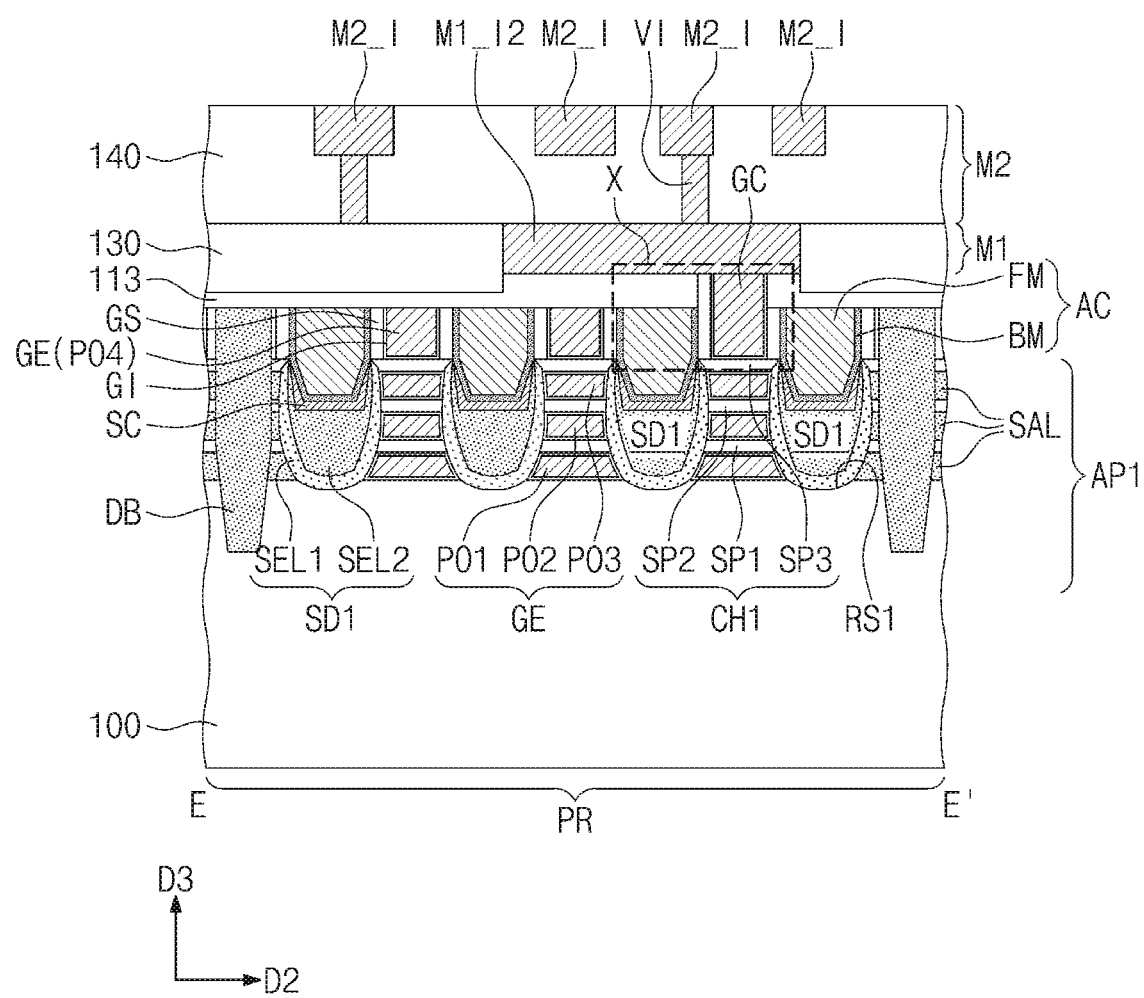
Figure 3A:
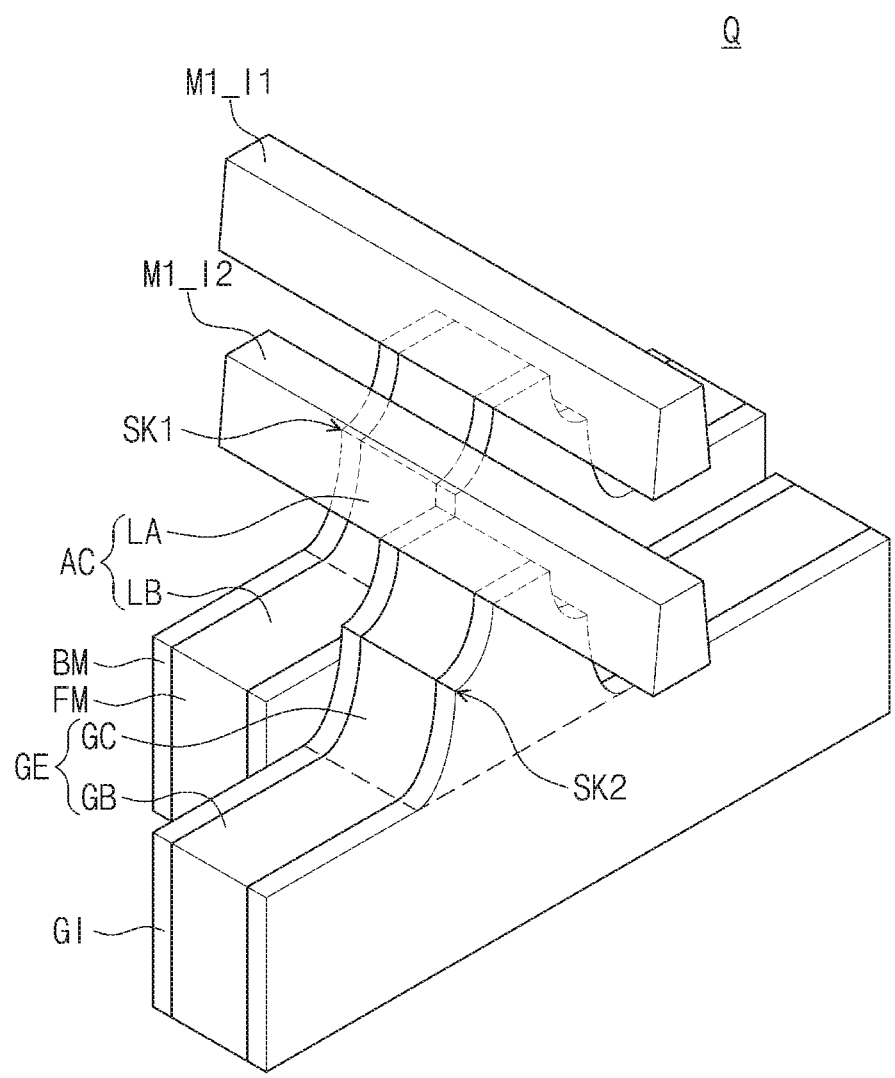
FIG. 3A is a perspective view illustrating region Q of FIG. 1.
Figure 3B:
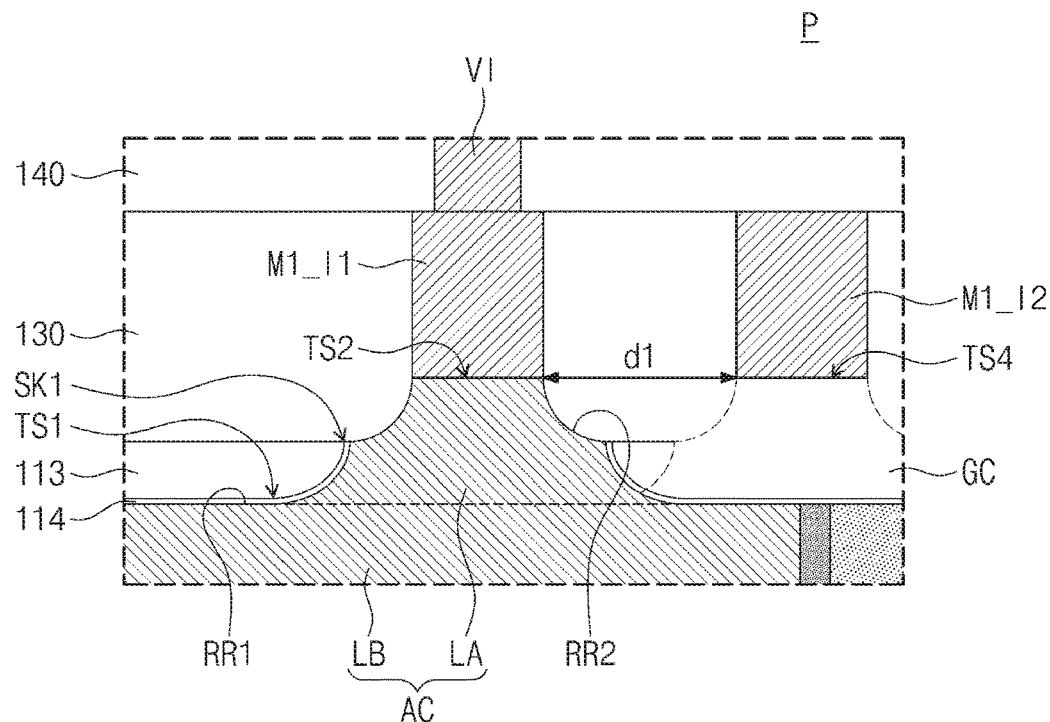
FIG. 3B is an enlarged view illustrating region P of FIG. 2C.
Figure 3C:
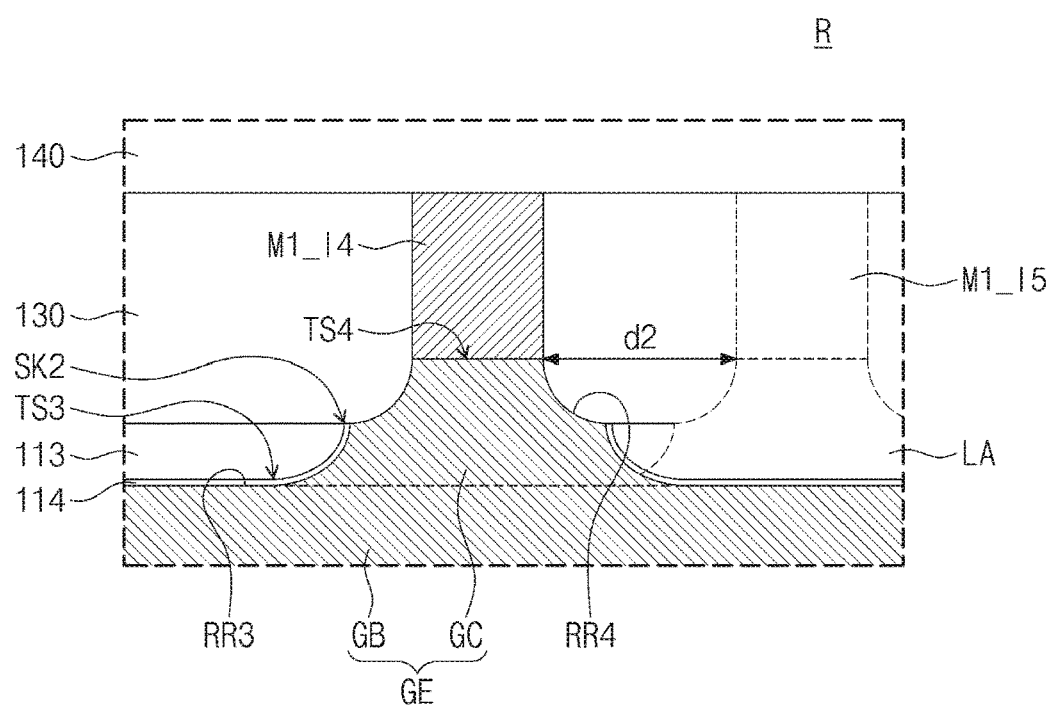
FIG. 3C is an enlarged view illustrating region R of FIG. 2D.
Figure 3D:
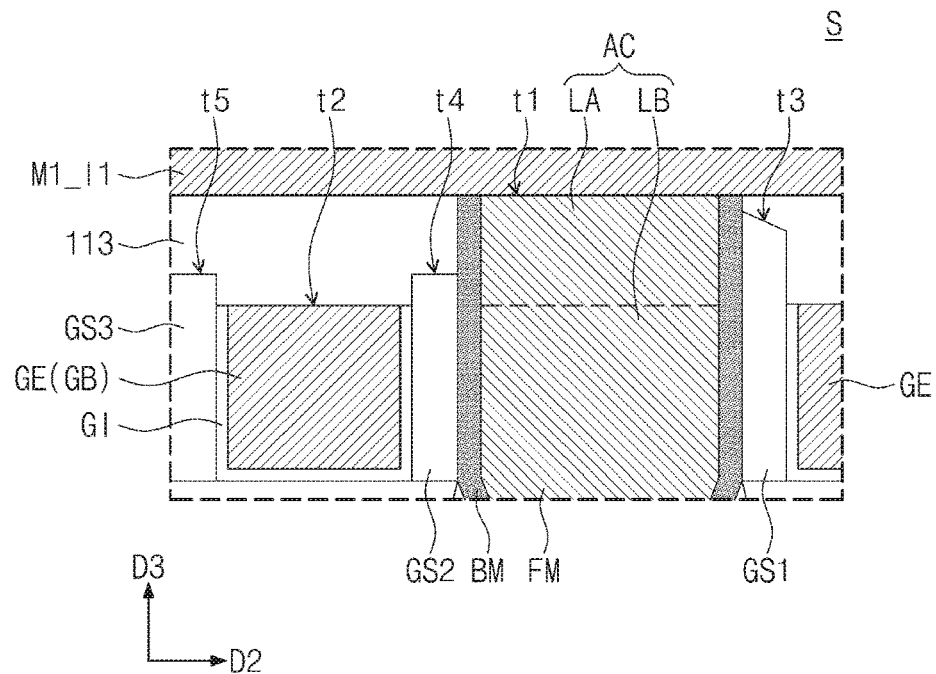
FIG. 3D is an enlarged view illustrating region S of FIG. 2A.
Figure 3E:
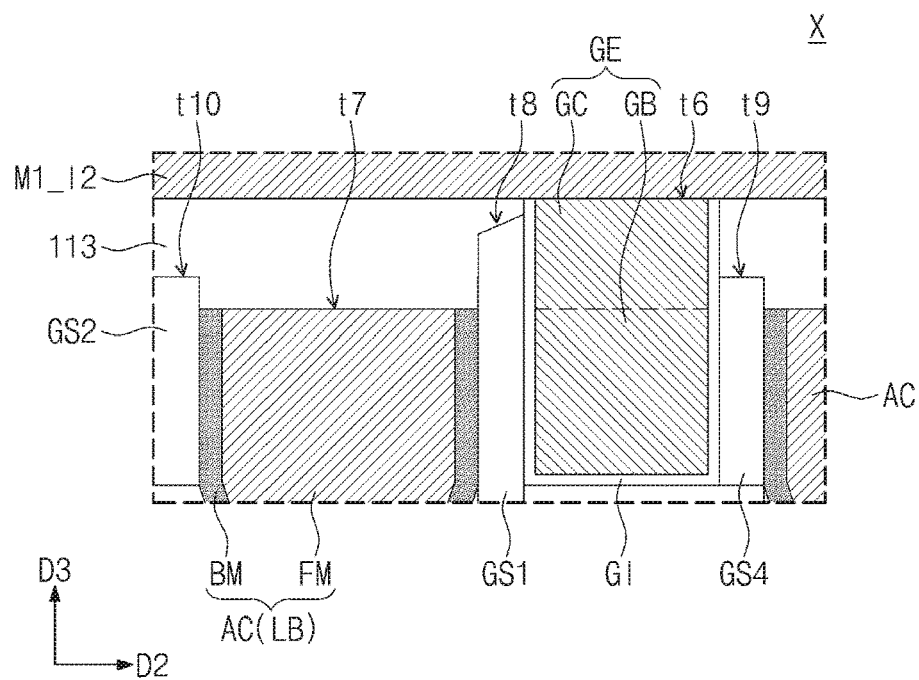
FIG. 3E is an enlarged view illustrating region X of FIG. 2E.
Figure 3F:
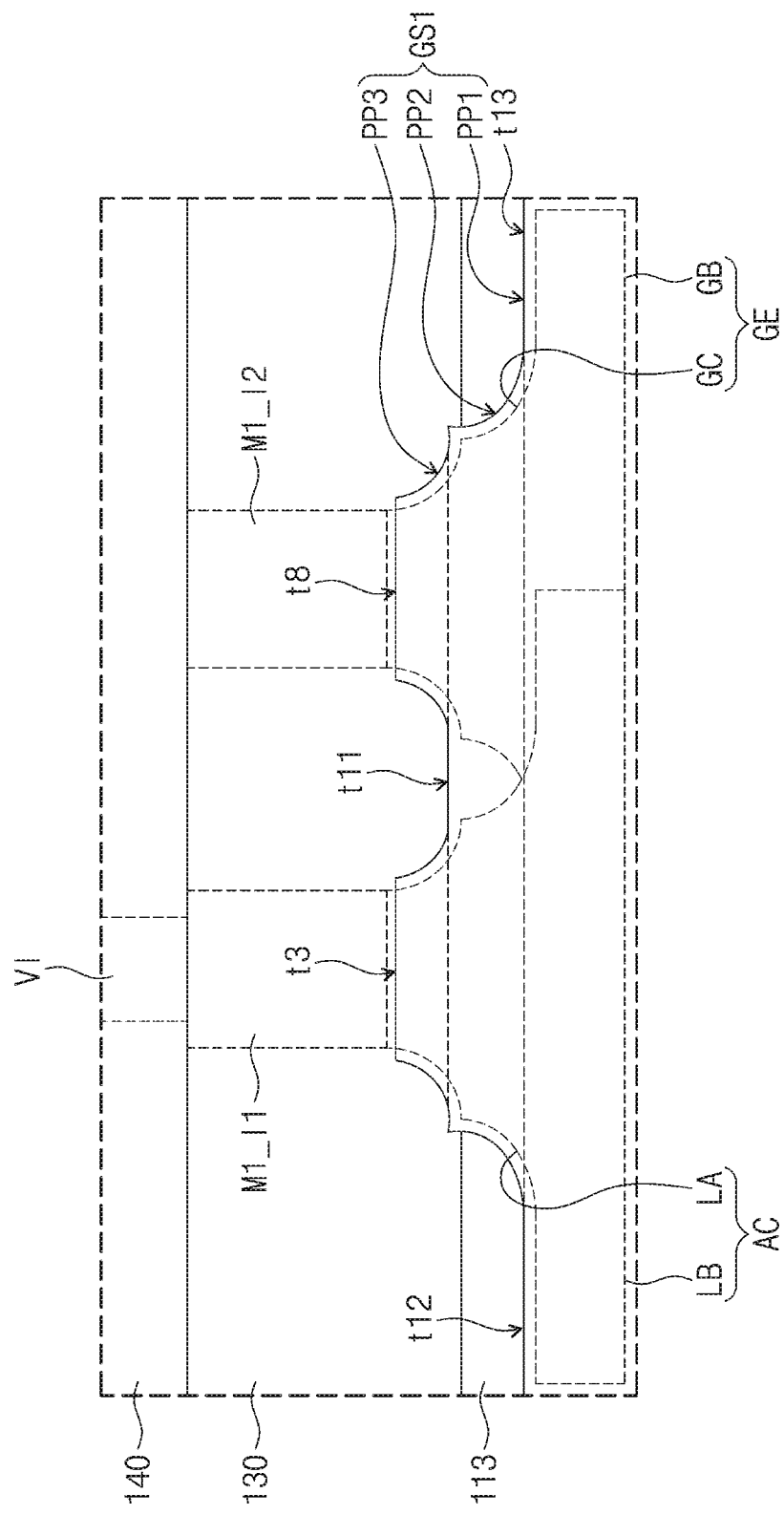
FIG. 3F is a conceptual diagram illustrating a first spacer and a region adjacent thereto.

FIG. 1 is a plan view illustrating a semiconductor device according to an example embodiment of the present inventive concept. FIGS. 2A to 2E are cross-sectional views taken along lines A-A', B-B', C-C', D-D', and E-E', respectively, of FIG. 1. FIG. 3A is a perspective view illustrating region Q of FIG. 1. FIG. 3B is an enlarged view illustrating region P of FIG. 2C. FIG. 3C is an enlarged view illustrating region R of FIG. 2D. FIG. 3D is an enlarged view illustrating region S of FIG. 2A. FIG. 3E is an enlarged view illustrating region X of FIG. 2E. FIG. 3F is a conceptual diagram illustrating a first spacer and a region adjacent thereto.

Referring to FIGS. 1 and 2A to 2E, a logic cell LC may be provided on a substrate 100. Logic transistors constituting a logic circuit may be disposed on the logic cell LC. The substrate 100 may be a semiconductor substrate that is formed of or includes silicon (Si), germanium (Ge), a compound semiconductor material such as, for example, silicon carbide (SiC), silicon-germanium (SiGe), silicon germanium carbide (SiGeC), gallium arsenide (GaAs), gallium antimonide (GaSb), gallium phosphide (GaP), indium arsenide (InAs), indium phosphide (InP), indium antimonide (InSb), lead tellurium (PbTe) compounds, or indium gallium arsenide (InGaAs), or the like. Also, the substrate 100 may include one or more semiconductor layers or structures and may include active or operable portions of semiconductor devices. In an example embodiment of the present inventive concept, the substrate 100 may be a silicon (Si) substrate.

The logic cell LC may include a P-type metal-oxide-semiconductor field effect transistor (PMOSFET) region PR and an N-type MOSFET (NMOSFET) region NR. The PMOSFET and NMOSFET regions PR and NR may be defined by a second trench TR2, which is formed in an upper portion of the substrate 100. In other words, the second trench TR2 may be placed between the PMOSFET and NMOSFET regions PR and NR. The PMOSFET and NMOSFET regions PR and NR may be spaced apart from each other, in a first direction D1, with the second trench TR2 interposed therebetween.

A first active pattern AP1 and a second active pattern AP2 may be defined by a first trench TR1, which is formed in an upper portion of the substrate 100. In other words, the first active pattern AP1 and the second active pattern AP2 may each correspond to a portion of the substrate 100 that is defined by the first trench TR1. The first and second active patterns AP1 and AP2 may be provided on the PMOSFET and NMOSFET regions PR and NR, respectively. The first trench TR1 may be shallower than the second trench TR2. The first and second active patterns AP1 and AP2 may be arranged in the first direction D1, and may extend in parallel with each other in a second direction D2. The first and second active patterns AP1 and AP2 may be vertically protruding portions of the substrate 100.

A device isolation layer ST may be provided to fill the first and second trenches TR1 and TR2. The device isolation layer ST may be formed of or include silicon oxide ($SiO_2$). Upper portions of the first and second active patterns AP1 and AP2 may protrude vertically above the device isolation layer ST (e.g., see FIG. 2D). The device isolation layer ST may not cover the upper portions of the first and second active patterns AP1 and AP2, and may cover lower side surfaces of the first and second active patterns AP1 and AP2. A liner insulating layer may be provided between the device isolation layer ST and the first and second active patterns AP1 and AP2. The liner insulating layer may be conformally provided along the first and second trenches TR1 and TR2. The liner insulating layer may be formed of or include, for example, silicon nitride ($Si_3N_4$) or silicon oxynitride (SiON).

The first active pattern AP1 may include a first channel pattern CH1. The second active pattern AP2 may include a second channel pattern CH2. Each of the first and second channel patterns CH1 and CH2 may include a first semiconductor pattern SP1, a second semiconductor pattern SP2, and a third semiconductor pattern SP3, which are sequentially stacked. The first to third semiconductor patterns SP1, SP2, and SP3 may be spaced apart from each other in a vertical direction (i.e., a third direction D3). Although the number of semiconductor patterns in each of the first and second channel patterns CH1 and CH2 is shown as three, this is only for convenience of explanation, and the number thereof is not limited thereto. For example, the number of semiconductor patterns included in each of the first and second channel patterns CH1 and CH2 may be two or more than three.

Each of the first to third semiconductor patterns SP1, SP2, and SP3 may be formed of or include at least one of, for example, silicon (Si), germanium (Ge), or silicon-germanium (SiGe). In an example embodiment of the present inventive concept, each of the first to third semiconductor patterns SP1, SP2, and SP3 may be formed of or include crystalline silicon (c-Si).

A plurality of first recesses RS1 may be formed in the upper portion of the first active pattern AP1. First source/drain patterns SD1 may be provided in the first recesses RS1, respectively. The first source/drain patterns SD1 may be impurity regions of a first conductivity type (e.g., p-type). The first channel pattern CH1 may be interposed between each pair of the first source/drain patterns SD1 and connected to each pair of the first source/drain patterns SD1. In other words, each pair of the first source/drain patterns SD1 may be connected to each other by the stacked first to third semiconductor patterns SP1, SP2, and SP3 of the first channel pattern CH1.

A plurality of second recesses RS2 may be formed in the upper portion of the second active pattern AP2. Second source/drain patterns SD2 may be provided in the second recesses RS2, respectively. The second source/drain patterns SD2 may be impurity regions of a second conductivity type (e.g., n-type). The second channel pattern CH2 may be interposed between each pair of the second source/drain patterns SD2 and connected to each pair of the second source/drain patterns SD2. In other words, the pair of the second source/drain patterns SD2 may be connected to each other by the first to third semiconductor patterns SP1, SP2, and SP3 stacked.

The first and second source/drain patterns SD1 and SD2 may be epitaxial patterns, which are formed by a selective epitaxial growth (SEG) process. For example, the first source/drain patterns SD1 may be formed by performing an SEG process in the first recesses RS1. The second source/drain patterns SD2 may be formed by performing an SEG process in the second recesses RS2. As an example, each of the first and second source/drain patterns SD1 and SD2 may have a top surface that is located at a level substantially the same as that of a top surface of the third semiconductor pattern SP3. However, in an example embodiment of the present inventive concept, the top surface of each of the first and second source/drain patterns SD1 and SD2 may be higher than the top surface of the third semiconductor pattern SP3.

The first source/drain patterns SD1 may include a semiconductor material (e.g., SiGe) having a lattice constant greater than that of a semiconductor element (e.g., Si) of the substrate 100. In this case, the pair of the first source/drain patterns SD1 may exert a compressive stress on the first channel patterns CH1 interposed therebetween. For example, silicon-germanium (SiGe) in the PMOSFET source and drain (e.g., the first source/drain pattern SD1) causes uniaxial compressive strain in the channel (e.g., the first channel pattern CH1), thereby increasing hole mobility. The second source/drain patterns SD2 may be formed of or include a semiconductor material (e.g., Si) the same as that of the substrate 100. In an example embodiment of the present inventive concept, the second source/drain patterns SD2 may be formed of or include single-crystalline silicon (sc-Si). Alternatively, the second source/drain patterns SD2 may include silicon carbide (SiC).

Each of the first source/drain patterns SD1 may include a first semiconductor layer SEL1 and a second semiconductor layer SEL2, which are sequentially stacked. A cross-sectional shape of the first source/drain pattern SD1 taken parallel to the second direction D2 will be described with reference to FIG. 2A.

The first semiconductor layer SEL1 may cover an inner surface of the first recess RS1. The first semiconductor layer SEL1 may have a 'U'-shaped cross-section, due to a cross-sectional profile of the first recess RS1. In an example embodiment of the present inventive concept, the width of the first recess RS1 in the second direction D2 may increase than decrease in the third direction D3 away from the substrate 100. However, the present inventive concept is not limited thereto. The second semiconductor layer SEL2 may fill a remaining space of the first recess RS1 covered with the first semiconductor layer SEL1. A volume of the second semiconductor layer SEL2 may be larger than a volume of the first semiconductor layer SEL1. In other words, a ratio of a volume of the second semiconductor layer SEL2 to a total volume of the first source/drain pattern SD1 may be greater than a ratio of a volume of the first semiconductor layer SEL1 to the total volume of the first source/drain pattern SD1.

Each of the first and second semiconductor layers SEL1 and SEL2 may be formed of or include silicon-germanium (SiGe). In detail, the first semiconductor layer SEL1 may be provided to have a relatively low germanium (Ge) concentration. In an example embodiment of the present inventive concept, the first semiconductor layer SEL1 may be provided to contain only silicon (Si) and not germanium (Ge). Alternatively, the first semiconductor layer SEL1 may be provided to contain small amount of germanium (Ge) in silicon-germanium (SiGe). The germanium (Ge) concentration of the first semiconductor layer SEL1 may range from 0 at % to about 10 at %. "About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

The second semiconductor layer SEL2 may be provided to have a relatively high germanium (Ge) concentration. As an example, the germanium concentration of the second semiconductor layer SEL2 may range from about 30 at % to about 70 at %. The germanium (Ge) concentration of the second semiconductor layer SEL2 may increase with increasing distance in the third direction D3 from the substrate 100. For example, the germanium concentration of the second semiconductor layer SEL2 may be about 40 at % near the first semiconductor layer SEL1 but may be about 60 at % at its top level. With gradient germanium (Ge) concentration, each of the first source/drain patterns SD1 may provide gradient compressive stress, and with this combination of stress, higher mobility and, thus, higher device performance may be achieved.

The first and second semiconductor layers SEL1 and SEL2 may include impurities (e.g., boron (B)), allowing the first source/drain pattern SD1 to have the p-type conductivity. In an example embodiment of the present inventive concept, a concentration of impurities in the second semiconductor layer SEL2 (in at %) may be higher than that in the first semiconductor layer SEL1.

Gate electrodes GE may be provided to cross the first and second active patterns AP1 and AP2 and to extend in the first direction D1, and may be arranged with a first pitch P1 in the second direction D2. Each of the gate electrodes GE may be vertically overlapped with the first and second channel patterns CH1 and CH2.

The gate electrode GE may include a first portion P01 interposed between the substrate 100 and the first semiconductor pattern SP1, a second portion P02 interposed between the first semiconductor pattern SP1 and the second semiconductor pattern SP2, a third portion P03 interposed between the second semiconductor pattern SP2 and the third semiconductor pattern SP3, and a fourth portion P04 on the third semiconductor pattern SP3.

Referring back to FIG. 2A, the first to third portions P01, P02, and P03 of the gate electrode GE on the PMOSFET region PR may have different widths from each other. For example, the largest width of the third portion P03 in the second direction D2 may be larger than the largest width of the second portion P02 in the second direction D2. The largest width of the first portion P01 in the second direction D2 may be larger than the largest width of the third portion P03 in the second direction D2. For example, since the width of the first recess RS1 in the second direction D2 may increase than decrease in the third direction D3 away from the substrate 100, and the first to third portions P01, P02, and P03 of the gate electrode GE are interposed between two adjacent first recesses RS1, the largest width of the second portion P02 may be the smallest among the largest widths of the first to third portions P01, P02, and P03. However, the present inventive concept is not limited thereto.

Referring back to FIG. 2D, the gate electrode GE may be provided to face top surface, bottom surface and opposite side surfaces of each of the first to third semiconductor patterns SP1, SP2, and SP3. In other words, the logic transistor according to the present example embodiment may be a three-dimensional field-effect transistor (e.g., multi-bridge channel field-effect transistor (MBCFET)), in which the gate electrode GE is provided to three-dimensionally surround the channel pattern.

Referring back to FIGS. 1 and 2A to 2D, a pair of spacers GS may be respectively disposed on opposite side surfaces of the fourth portion P04 of the gate electrode GE. The spacers GS may be used to electrically separate the gate electrode GE from active contacts, which will be described below. The spacers GS may extend along the gate electrode GE and in the first direction D1. The spacers GS may be formed of or include at least one of, for example, silicon carbonitride (SiCN), silicon carbon oxynitride (SiCON), or silicon nitride ($Si_3N_4$). In an example embodiment of the present inventive concept, the spacers GS may have a multi-layered structure, which includes at least two different materials selected from, for example, silicon carbonitride (SiCN), silicon carbon oxynitride (SiCON), and silicon nitride ($Si_3N_4$).

A gate insulating layer GI may be interposed between the gate electrode GE and the first channel pattern CH1 and between the gate electrode GE and the second channel pattern CH2. The gate insulating layer GI may cover top, bottom, and opposite side surfaces of each of the first to third semiconductor patterns SP1, SP2, and SP3. The gate insulating layer GI may cover a top surface of the device isolation layer ST below the gate electrode GE (e.g., see FIG. 2D).

In an example embodiment of the present inventive concept, the gate insulating layer GI may include, for example, a silicon oxide ($SiO_2$) layer, a silicon oxynitride (SiON) layer, and/or a high-k dielectric layer. The high-k dielectric layer may be formed of or include at least one of high-k dielectric materials whose dielectric constants are higher than that of silicon oxide ($SiO_2$). For example, the high-k dielectric material may include at least one of, for example, hafnium oxide ($HfO_2$), hafnium silicon oxide ($HfSiO_4$), hafnium zirconium oxide ($HfZrO_4$), hafnium tantalum oxide ($Hf_2Ta_2O_9$), hafnium aluminum oxide ($HfAlO_3$), lanthanum oxide ($La_2O_3$), lanthanum aluminum oxide ($LaAlO_3$), zirconium oxide ($ZrO_2$), zirconium silicon oxide ($ZrSiO_4$), tantalum oxide ($Ta_2O_5$), titanium oxide ($TiO_2$), barium strontium titanium oxide ($BaSrTi_2O_6$), barium titanium oxide ($BaTiO_3$), strontium titanium oxide ($SrTiO_3$), lithium oxide ($Li_2O$), aluminum oxide ($Al_2O_3$), lead scandium tantalum oxide ($Pb(Sc,Ta)O_3$), or lead zinc niobate [$Pb(Zn_{1/3}Nb_{2/3})O_3$]. In an example embodiment of the present inventive concept, the semiconductor device may include a negative capacitance (NC) FET using a negative capacitor. For example, the gate insulating layer GI may include a ferroelectric layer exhibiting a ferroelectric property and a paraelectric layer exhibiting a paraelectric property.

The ferroelectric layer may have a negative capacitance, and the paraelectric layer may have a positive capacitance. In the case where two or more capacitors are connected in series and each capacitor has a positive capacitance, a total capacitance may be reduced to a value that is less than a capacitance of each of the capacitors. By contrast, in the case where at least one of serially connected capacitors has a negative capacitance, a total capacitance of the serially connected capacitors may have a positive value and may be greater than an absolute value of each capacitance.

In the case where a ferroelectric layer having a negative capacitance and a paraelectric layer having a positive capacitance are connected in series, a total capacitance of the serially connected ferroelectric and paraelectric layers may increase. Due to such an increase of the total capacitance, a transistor including the ferroelectric layer may have a sub-threshold swing (SS), which is less than 60 mV/decade, at room temperature. For example, in a negative capacitance FET (NC-FET), the insulating ferroelectric material layer served as a negative capacitor so that channel surface potential can be amplified more than the gate voltage, and hence the device can operate with SS less than 60 mV/decade at room temperature.

The ferroelectric layer may have the ferroelectric property. The ferroelectric layer may be formed of or include at least one of, for example, hafnium oxide ($HfO_2$), hafnium zirconium oxide (HfZrO$_4$), barium strontium titanium oxide (BaSrTi$_2$O$_6$), barium titanium oxide (BaTiO$_3$), and/or lead zirconium titanium oxide (Pb(Ti,Zr)O$_3$). Each of the ferroelectric materials described above, the ratio between metals may vary and the composition may be nonstoichiometric. For example, the hafnium zirconium oxide (HfZrO$_4$) may be hafnium oxide (HfO$_2$) that is doped with zirconium (Zr). Alternatively, the hafnium zirconium oxide may be a compound composed of hafnium (Hf), zirconium (Zr), and/or oxygen (O). In other words, hafnium zirconium oxide may be represented by Hf$_x$Zr$_y$O$_z$ with various combinations of numerical values of x, y and z instead of being represented by HfZrO$_4$ The ferroelectric layer may further include dopants. For example, the dopants may include at least one of, for example, aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and/or tin (Sn). The kind of the dopants in the ferroelectric layer may vary, depending on which type of ferroelectric material is included in the ferroelectric layer.

In the case where the ferroelectric layer includes hafnium oxide (HfO$_2$), the dopants in the ferroelectric layer may include at least one of, for example, gadolinium (Gd), silicon (Si), zirconium (Zr), aluminum (Al), and/or yttrium (Y). However, the present inventive concept is not limited thereto. For example, other dopants such as, for example, strontium (Sr), lanthanum (La), titanium (Ti) and tantalum (Ta) may also be used to dope the ferroelectric material layer including hafnium oxide (HfO$_2$).

In the case where the dopants are aluminum (Al), a content of aluminum (Al) in the ferroelectric layer may range from about 3 to about 8 at % (atomic percentage). Here, the content of the aluminum (Al) as the dopants may be a ratio of the number of aluminum (Al) atoms to the number of hafnium (Hf) and aluminum (Al) atoms.

In the case where the dopants are silicon (Si), a content of silicon in the ferroelectric layer may range from about 2 at % to about 10 at %. In the case where the dopants are yttrium (Y), a content of yttrium (Y) in the ferroelectric layer may range from about 2 at % to about 10 at %. In the case where the dopants are gadolinium (Gd), a content of gadolinium (Gd) in the ferroelectric layer may range from about 1 at % to about 7 at %. In the case where the dopants are zirconium (Zr), a content of zirconium (Zr) in the ferroelectric layer may range from about 50 at % to about 80 at %.

The paraelectric layer may have the paraelectric property. The paraelectric layer may be formed of or include at least one of, for example, silicon oxide (SiO$_2$) and/or high-k metal oxides. The metal oxides, which can be used as the paraelectric layer, may include at least one of, for example, hafnium oxide (HfO$_2$), barium strontium titanium oxide (BaSrTi$_2$O$_6$), zirconium oxide (ZrO$_2$), and/or aluminum oxide (Al$_2$O$_3$), but the present inventive concept is not limited thereto.

The ferroelectric layer and the paraelectric layer may be formed of or include the same material. The ferroelectric layer may have the ferroelectric property, but the paraelectric layer may not have the ferroelectric property. For example, in the case where the ferroelectric and paraelectric layers contain hafnium oxide (HfO$_2$), a crystal structure of the hafnium oxide (HfO$_2$) in the ferroelectric layer may be different from a crystal structure of the hafnium oxide (HfO$_2$) in the paraelectric layer.

The ferroelectric layer may exhibit the ferroelectric property, only when its thickness is in a specific range. In an example embodiment of the present inventive concept, the ferroelectric layer may have a thickness ranging from about 0.5 to about 10 nm, but the present inventive concept is not limited thereto. Since a critical thickness associated with the occurrence of the ferroelectric property varies depending on the kind of the ferroelectric material, the thickness of the ferroelectric layer may be changed depending on the kind of the ferroelectric material.

In an example embodiment of the present inventive concept, the gate insulating layer GI may include a single ferroelectric layer. In an example embodiment of the present inventive concept, the gate insulating layer GI may include a plurality of ferroelectric layers, which are spaced apart from each other. The gate insulating layer GI may have a multi-layered structure, in which a plurality of ferroelectric layers and a plurality of paraelectric layers are alternately stacked.

The gate electrode GE may include a first metal pattern and a second metal pattern formed on the first metal pattern. The first metal pattern may be provided on the gate insulating layer GI and may be adjacent to the first to third semiconductor patterns SP1, SP2, and SP3. The first metal pattern may include a work function metal, which can be used to adjust a threshold voltage of the transistor. By adjusting a thickness and composition of the first metal pattern, a transistor having a desired threshold voltage may be obtained. For example, the first to third portions P01, P02, and P03 of the gate electrode GE may be composed of the first metal pattern or the work function metal.

The first metal pattern may include a metal nitride layer. For example, the first metal pattern may include nitrogen (N) and at least one metal, which is selected from a group including, for example, titanium (Ti), tantalum (Ta), aluminum (Al), tungsten (W) and molybdenum (Mo). In an example embodiment of the present inventive concept, the first metal pattern may further include carbon (C). In an example embodiment of the present inventive concept, the first metal pattern may control a work function, and may include one or more selected from, for example, titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), titanium aluminum carbonitride (TiAlCN), titanium aluminum carbide (TiAlC), titanium carbide (TiC), tantalum carbonitride (TaCN), niobium nitride (NbN), niobium carbide (NbC), molybdenum nitride (MoN), molybdenum carbide (MoC), tungsten carbide (WC), and a combination thereof. The first metal pattern may include a plurality of work function metal layers, which are stacked.

The second metal pattern may include a metallic material whose resistance is lower than the first metal pattern. For example, the second metal pattern may include at least one metal selected from a group including, for example, tungsten (W), aluminum (Al), titanium (Ti), tantalum (Ta), ruthenium (Ru), titanium aluminum (TiAl), copper (Cu), cobalt (Co), nickel (Ni), platinum (Pt), nickel platinum (NiPt), niobium (Nb), molybdenum (Mo), rhodium (Rh), palladium (Pd), iridium (Ir), osmium (Os), silver (Ag), gold (Au), zinc (Zn), vanadium (V), and a combination thereof. In an example embodiment of the present inventive concept, the fourth portion P04 of the gate electrode GE may include the first metal pattern and the second metal pattern on the first metal pattern.

Referring back to FIG. 2B, inner spacers IP may be provided on the NMOSFET region NR. The inner spacers IP may be respectively interposed between the second source/drain pattern SD2 and the first to third portions P01, P02, and P03 of the gate electrode GE. The inner spacers IP may be in direct contact with the second source/drain pattern SD2. Each of the first to third portions P01, P02, and P03 of the gate electrode GE may be spaced apart from the second source/drain pattern SD2 by the inner spacer IP. The inner spacers IP may be formed of or include at least one of, for example, silicon nitride ($Si_3N_4$), silicon carbonitride (SiCN), or silicon oxycarbonitride (SiOCN). Referring back to FIG. 2B, the first to third portions P01, P02, and P03 of the gate electrode GE on the NMOSFET region NR may have the same width. However, the present inventive concept is not limited thereto.

A first interlayer insulating layer 110 may be provided on the substrate 100. The first interlayer insulating layer 110 may cover the spacers GS and the first and second source/drain patterns SD1 and SD2. A second interlayer insulating layer 113 may be disposed on the first interlayer insulating layer 110. In an example embodiment of the present inventive concept, the first and second interlayer insulating layers 110 and 113 may be formed of or include silicon oxide ($SiO_2$).

A pair of division structures DB, which are opposite to each other in the second direction D2, may be provided at both sides of the logic cell LC. The division structure DB may extend in the first direction D1, and may be parallel to the gate electrodes GE. A pitch between the division structure DB and the gate electrode GE adjacent thereto may be equal to the first pitch P1.

The division structure DB may be provided to penetrate the first and second interlayer insulating layers 110 and 113, and may extend into the first and second active patterns AP1 and AP2. The division structure DB may penetrate an upper portion of each of the first and second active patterns AP1 and AP2. The division structure DB may separate the PMOSFET and NMOSFET regions PR and NR of the logic cell LC from an active region of another logic cell adjacent thereto.

Sacrificial layers SAL adjacent to the division structure DB may be provided on each of the first and second active patterns AP1 and AP2, and may be stacked to be spaced apart from each other. Each of the sacrificial layers SAL may be located at a level the same as that of a corresponding one of the first to third portions P01, P02, and P03 of the gate electrode GE. The division structure DB may be provided to penetrate the sacrificial layers SAL.

The sacrificial layers SAL may be formed of or include silicon-germanium (SiGe). A germanium (Ge) concentration in each of the sacrificial layers SAL may range from about 10 at % to about 30 at %. The germanium (Ge) concentration of the sacrificial layer SAL may be higher than the germanium (Ge) concentration of the first semiconductor layer SEL1 described above.

Active contacts AC may be provided to penetrate the first and second interlayer insulating layers 110 and 113 and may be electrically connected to the first and second source/drain patterns SD1 and SD2, respectively. A pair of the active contacts AC may be respectively provided at both sides of the gate electrode GE. For example, the pair of the active contacts AC may be arranged in the second direction D2, and may be spaced apart from each other with the gate electrode GE interposed therebetween. When viewed in a plan view, the active contact AC may be a bar-shaped pattern that is elongated in the first direction D1. The active contacts AC, which are arranged in the first direction D1, may be spaced apart from each other with fence patterns 111 interposed therebetween, as shown in FIG. 2C. The fence patterns 111 may be formed of or include at least one of, for example, silicon oxide ($SiO_2$), silicon nitride ($Si_3N_4$), silicon carbide (SiC), silicon oxycarbide (SiOC), or aluminum oxide ($Al_2O_3$).

The active contact AC may be a self-aligned contact. In other words, the active contact AC may be formed by a self-alignment process using the gate electrode GE and the spacer GS. For example, the active contact AC may cover at least a portion of the side surface of the spacer GS.

The active contact AC may include a conductive pattern FM and a barrier pattern BM enclosing the conductive pattern FM. The conductive pattern FM may be formed of or include at least one of metallic materials (e.g., aluminum (Al), copper (Cu), tungsten (W), molybdenum (Mo), cobalt (Co), etc.). The barrier pattern BM may cover side and bottom surfaces of the conductive pattern FM. In an example embodiment of the present inventive concept, the barrier pattern BM may include two layers such as a metal layer and a metal nitride layer. The metal layer may be formed of or include a metal or a metal alloy including at least one of, for example, titanium (Ti), tantalum (Ta), tungsten (W), nickel (Ni), cobalt (Co), or platinum (Pt). The metal nitride layer may be formed of or include at least one of, for example, titanium nitride (TiN), tantalum nitride (TaN), tungsten nitride (WN), nickel nitride (NiN), cobalt nitride (CoN), or platinum nitride (PtN).

Hereinafter, the active contact AC will be described in more detail with reference to FIGS. 3A and 3B. The active contact AC may include a contact body portion LB and a contact protruding portion LA. The contact body portion LB may be a bar-shaped pattern, which extends in the first direction D1, and may have a first top surface TS1, which is located at a first height. The contact protruding portion LA may have a shape which protrudes from the first top surface TS1 of the contact body portion LB in the third direction D3. The contact protruding portion LA may have a second top surface TS2, which is located at a second height. The second top surface TS2 of the contact protruding portion LA may be in direct contact with a first metal layer M1 (e.g., a bottom surface of a first lower interconnection line M1_I1). In other words, a top surface (e.g., the second top surface TS2) of the active contact AC may be directly connected to the first lower interconnection line M1_I1 without an additional structure interposed therebetween.

The first metal layer M1 may be provided in a third interlayer insulating layer 130. The first metal layer M1 may include first to fifth lower interconnection lines M1_I1 to M1_I5 and sixth and seventh lower interconnection lines M1_R1 and M1_R2. Each of the lower interconnection lines M1_I1 to M1_I5, M1_R1, and M1_R2 may extend in the second direction D2 to cross the logic cell LC. The lower interconnection lines M1_I1 to M1_I5, M1_R1, and M1_R2 may also be referred to as first interconnection lines. In an example embodiment of the present inventive concept, a drain voltage VDD and a source voltage VSS may be applied to the sixth and seventh lower interconnection lines M1_R1 and M1_R2, respectively.

The contact protruding portion LA may include a first stepwise structure SK1 having a side surface whose slope is discontinuously changed. As an example, the contact protruding portion LA may include a recessed side surface. In detail, a lower side surface of the contact protruding portion LA connected to the contact body portion LB may be defined by a first recess region RR1, and an upper side surface of the contact protruding portion LA connected to the first lower interconnection line M1_I1 may be defined by a second recess region RR2. The first and second recess regions RR1 and RR2 may be empty spaces, which are formed by partially removing an upper portion of the active contact AC and are not connected to the first metal layer M1. The first recess region RR1 may be formed during a patterning process for forming the contact protruding portion LA in the upper portion of the active contact AC, and the lower portion of the active contact AC below the contact protruding portion LA and/or below the first recess region RR1 may then be defined as the contact body portion LB. The first stepwise structure SK1 may be defined near a boundary between the first and second recess regions RR1 and RR2. The second interlayer insulating layer 113 may be provided to fill the first recess region RR1. A liner insulating layer 114 may be provided between the second interlayer insulating layer 113 and the contact body portion LB, but the present inventive concept is not limited thereto. The liner insulating layer 114 may also be provided between the second interlayer insulating layer 113 and the contact protruding portion LA in the first recess region RR1. The third interlayer insulating layer 130 may be provided on the second interlayer insulating layer 113 to fill the second recess region RR2. The second recess region RR2 may be formed during a patterning process for forming the first lower interconnection line M1_I1 and may be aligned to a side surface of the first lower interconnection line M1_I1. Accordingly, the contact protruding portion LA may include a side surface aligned to the side surface of the first lower interconnection line M1_I1. As an example, a width of the second top surface TS2 of the contact protruding portion LA in the first direction D1 may be substantially equal to a width of a bottom surface of the first lower interconnection line M1_I1.

The third interlayer insulating layer 130 may extend into a region between the lower interconnection lines M1_I1 to M1_I5, M1_R1, and M1_R2. For example, a bottom surface of the third interlayer insulating layer 130 may be lower than a bottom surface of the first metal layer M1. Each of the second interlayer insulating layer 113, the third interlayer insulating layer 130, and the liner insulating layer 114 may be formed of or include at least one of, for example, silicon oxide ($SiO_2$), silicon nitride ($Si_3N_4$), silicon carbide (SiC), silicon oxycarbide (SiOC), or aluminum oxide ($Al_2O_3$).

The contact body portion LB and the contact protruding portion LA may be provided to have no interface therebetween and to form a single object. In other words, the contact body portion LB and the contact protruding portion LA may be two portions of a structure that is simultaneously formed of the same material. To be described latter with reference to FIGS. 11A to 13D, the contact body portion LB and the contact protruding portion LA may be formed by etching an upper portion of the active contact AC exposed through a mask pattern HM and by partially etching the contact protruding portion LA during a process of etching a metal layer to form the first lower interconnection line M1_I1. The barrier pattern BM may extend from a region on side surface of the contact body portion LB to a region on a side surface of the contact protruding portion LA.

Hereinafter, the gate electrode GE will be described in more detail with reference to FIGS. 3A and 3C. The gate electrode GE may include an electrode body portion GB and an electrode protruding portion GC. The electrode body portion GB may be a line- or bar-shaped pattern, which extends in the first direction D1, and may have a third top surface TS3, which is located at a third height. The electrode protruding portion GC may have a shape which protrudes from the third top surface TS3 of the electrode body portion GB in the third direction D3. The electrode protruding portion GC may have a fourth top surface TS4, which is located at a fourth height. The fourth top surface TS4 of the electrode protruding portion GC may be in direct contact with the first metal layer M1 (e.g., a bottom surface of fourth lower interconnection line M1_I4). In other words, a top surface (e.g., the fourth top surface TS4) of the gate electrode GE may be directly connected to the fourth lower interconnection line M1_I4 without an additional structure interposed therebetween.

The electrode protruding portion GC may include a second stepwise structure SK2 having a side surface whose slope is discontinuously changed. As an example, the electrode protruding portion GC may include a recessed side surface. In detail, a lower side surface of the electrode protruding portion GC connected to the electrode body portion GB may be defined by a third recess region RR3, and an upper side surface of the electrode protruding portion GC connected to the fourth lower interconnection line M1_I4 may be defined by a fourth recess region RR4. The third and fourth recess regions RR3 and RR4 may be empty spaces, which are formed by partially removing an upper portion of the gate electrode GE and are not connected to the first metal layer M1. The third recess region RR3 may be formed during a patterning process for forming the electrode protruding portion GC in the upper portion of the gate electrode GE, and the lower portion of the gate electrode GE below the electrode protruding portion GC and/or below the third recess region RR3 may then be defined as the electrode body portion GB. The second stepwise structure SK2 may be defined near a boundary between the third and fourth recess regions RR3 and RR4. The second interlayer insulating layer 113 may be provided to fill the third recess region RR3. The liner insulating layer 114 may be provided between the second interlayer insulating layer 113 and the electrode body portion GB, however, the presentive inventive concept is not limited thereto. The liner insulating layer 114 may also be provided between the second interlayer insulating layer 113 and the electrode protruding portion GC in the third recess region RR3. The third interlayer insulating layer 130 may be provided on the second interlayer insulating layer 113 to fill the fourth recess region RR4. The fourth recess region RR4 may be formed during a patterning process for forming the fourth lower interconnection line M1_I4 and may be aligned to a side surface of the fourth lower interconnection line M1_I4. Accordingly, the electrode protruding portion GC may include a side surface aligned to the side surface of the fourth lower interconnection line M1_I4. As an example, a width of the fourth top surface TS4 of the electrode protruding portion GC in the first direction D1 may be substantially equal to a width of a bottom surface of the fourth lower interconnection line M1_I4.

The electrode body portion GB and the electrode protruding portion GC may be provided to have no interface therebetween and to form a single object. In other words, the electrode body portion GB and the electrode protruding portion GC may be two portions of a structure that is simultaneously formed of the same material. To be described latter with reference to FIGS. 11A to 13D, the electrode body portion GB and the electrode protruding portion GC may be formed by etching an upper portion of the gate electrode GE exposed through a mask pattern HM and by partially etching the electrode protruding portion GC during a process of etching a metal layer to form the fourth lower interconnection line M1_I4. The gate insulating layer GI may extend from a region on a side surface of the electrode body portion GB to a region on a side surface of the electrode protruding portion GC.

As shown in FIG. 3B, the contact protruding portion LA of the active contact AC may be adjacent to the electrode protruding portion GC of the gate electrode GE connected to a second lower interconnection line M1_I2. In more detail, the second top surface TS2 of the contact protruding portion LA, which is connected to the first lower interconnection line M1_I1, may be spaced apart from the fourth top surface TS4 of the electrode protruding portion GC, which is connected to the second lower interconnection line M1_I2, by a first distance d1. The first lower interconnection line M1_I1 and the second lower interconnection line M1_I2 may be interconnection lines, which extend in a direction (e.g., the second direction D2) crossing an extension direction of the gate electrodes GE, and are adjacent and parallel to each other. The second lower interconnection line M1_I2 may be provided on the gate electrode GE and disposed at a level the same as that of the first lower interconnection line M1_I1.

Similarly, as shown in FIG. 3C, the electrode protruding portion GC of the gate electrode GE may be adjacent to the contact protruding portion LA connected to the fifth lower interconnection line M1_I5. In more detail, the fourth top surface TS4 of the electrode protruding portion GC, which is connected to the fourth lower interconnection line M1_I4, may be spaced apart from the second top surface TS2 of the contact protruding portion LA, which is connected to the fifth lower interconnection line M1_I5, by a second distance d2. The second distance d2 and the first distance d1 may be equal or may be different from each other. The first top surface TS1 may be located at a level the same as that of the third top surface TS3, but the present inventive concept is not limited thereto. The second top surface TS2 may be located at a level the same as that of the fourth top surface TS4, but the present inventive concept is not limited thereto.

As an integration density of a semiconductor device increases, a distance between the active contact AC and the gate electrode GE may decrease, and thus, there is an increasing risk of a process failure, such as unintended connection between vias or contacts. According to an example embodiment of the present inventive concept, by forming the contact protruding portion LA from an upper portion of the active contact AC and forming the electrode protruding portion GC from an upper portion of the gate electrode GE, it may be possible to connect the active contact AC and the gate electrode GE to lower interconnection lines, without an additional via or contact for connection with the lower interconnection lines. Accordingly, a misalignment issue or a connection failure, which may occur when the additional via or contact is formed, may be prevented. In addition, due to the recess regions, it may be possible to separate the contact protruding portion LA from the electrode protruding portion GC by a sufficient large distance and thereby to prevent a process failure (e.g., a contact or short issue between the contact protruding portion LA and the electrode protruding portion GC).

Silicide patterns SC may be respectively interposed between the active contact AC and the first source/drain pattern SD1 and between the active contact AC and the second source/drain pattern SD2 to provide reliable metal-semiconductor contact and reduce electrical resistance between the active contact AC and the first source/drain pattern SD1 and between the active contact AC and the second source/drain pattern SD2. The active contact AC may be electrically connected to the source/drain pattern SD1 or SD2 through the silicide pattern SC. The bottom surface of the active contact AC may be lower than the top surfaces of the first and second source/drain patterns SD1 and SD2. However, the present inventive concept is not limited thereto. For example, in an example embodiment of the present inventive concept, the bottom surface of the active contact AC may be formed on a plane the same as those of the top surfaces of the first and second source/drain patterns SD1 and SD2. The silicide pattern SC may be formed of or include at least one of metal silicide materials (e.g., titanium silicide ($TiSi_2$), tantalum silicide ($TaSi_2$), tungsten silicide ($WSi_2$), nickel silicide ($NiSi_2$), or cobalt silicide ($CoSi_2$)).

Hereinafter, the gate electrode GE, the active contact AC, and the spacers GS in the cross-section taken along the second direction D2 will be described in more detail with reference to FIGS. 3D and 3E.

Referring to FIG. 3D, a top surface t1 of the active contact AC (for example, the contact protruding portion LA of the active contact AC) may be higher than a top surface t2 of the gate electrode GE (for example, the electrode body portion GB of the gate electrode GE). The top surface t1 may correspond to the second top surface TS2 of FIG. 3B, and the top surface t2 may correspond to the third top surface TS3 of FIG. 3C. However, the present inventive concept is not limited thereto.

Referring to FIG. 3E, a top surface t6 of the gate electrode GE (for example, the electrode protruding portion GC of the gate electrode GE) may be higher than a top surface t7 of the active contact AC (for example, the contact body portion LB of the active contact AC). The top surface t6 may correspond to the fourth top surface TS4 of FIG. 3C, and the top surface t7 may correspond to the first top surface TS1 of FIG. 3B. However, the present inventive concept is not limited thereto.

Referring to FIGS. 3D and 3E, the spacers GS may include first to fourth spacers GS1 to GS4. The third spacer GS3, the second spacer GS2, the first spacer GS1, and the fourth spacer GS4 may be sequentially provided in the second direction D2. The first spacer GS1 may extend into a region between the contact protruding portion LA and the electrode protruding portion GC. The second to fourth spacers GS2 to GS4 may not extend into the region between the contact protruding portion LA and the electrode protruding portion GC, unlike the first spacer GS1. In an example embodiment of the present inventive concept, the second spacer GS2 may be spaced apart from the first spacer GS1 with the active contact AC interposed therebetween. The third spacer GS3 may be spaced apart from the second spacer GS2 in an opposite direction, which is with respect to the first spacer GS1 located at the opposite side, of the second direction D2, with the gate electrode GE interposed therebetween. In other words, the second spacer GS2 and the third spacer GS3 may be provided on opposite side surfaces of the gate electrode GE. The fourth spacer GS4 may be spaced apart from the first spacer GS1 in the second direction D2, with the gate electrode GE interposed therebetween.

Referring to FIG. 3D, a height of a top surface t3 of the first spacer GS1 may be equal to or lower than a height of the top surface t1 of the contact protruding portion LA. To be described latter, with a bridge mask pattern disposed above and covering the first spacer GS1, the first spacer GS1 may be protected from being etched in the etching process. However, a portion (e.g., top portion) of the first spacer GS1 may be removed during the etching process. The amount of the first spacer GS1 being removed may differ depending on the degree of etching, so the first spacer GS1 may have its top surface t3 located at a height equal to or lower than that of the top surface t1 of the contact protruding portion LA. The top surface t3 of the first spacer GS1 may be higher than a top surface t4 of the second spacer GS2 and a top surface t5 of the third spacer GS3. The top surface t2 of the electrode body portion GB may be lower than the top surface t4 of the second spacer GS2 and the top surface t5 of the third spacer GS3.

Referring to FIG. 3E, a height of a top surface t8 of the first spacer GS1 may be equal to or lower than a height of the top surface t6 of the electrode protruding portion GC. Since a portion (e.g., top portion) of the first spacer GS1 may be removed during the etching process, the amount of the first spacer GS1 being removed may differ depending on the degree of etching, so the first spacer GS1 may have its top surface t8 located at a height equal to or lower than that of the top surface t6 of the electrode protruding portion GC. The top surface t8 of the first spacer GS1 may be higher than a top surface t10 of the second spacer GS2 and a top surface t9 of the fourth spacer GS4. The top surface t7 of the contact body portion LB may be lower than the top surface t10 of the second spacer GS2 and the top surface t9 of the fourth spacer GS4. The height of the top surface t8 of the first spacer GS1 may be equal to the height of the top surface t3 of the first spacer GS1, but the present inventive concept is not limited thereto.

FIG. 3F illustrates a profile of the first spacer GS1 in the first direction D1. The first spacer GS1 may have a profile that is similar to those of the gate electrode GE and the active contact AC. For example, the first spacer GS1 may include a portion, which is provided between the top surfaces t3 and t8, which are respectively provided near the contact protruding portion LA and the electrode protruding portion GC and has a top surface t11 whose height is lower than those of the top surfaces t3 and t8. The first spacer GS1 may further have a top surface t12 and a top surface t13, which are respectively placed near the contact body portion LB and the electrode body portion GB and are lower than the top surface t3 near the contact protruding portion LA, the top surface t8 near the electrode protruding portion GC, and the top surface t11 therebetween. In other words, the first spacer GS1 may include a first part (or portion) adjacent to the electrode protruding portion GC, a second part adjacent to the contact protruding portion LA, and a third part between the first part and the second part, in which a top surface t8 of the first part and a top surface t3 of the second part are higher than a top surface t11 of the third part. The first spacer may further include a fourth part spaced apart from the third part with the first or second part interposed therebetween, and the top surface t11 of the third part may be higher than a top surface t12 or t13 of the fourth part.

In other respects, the first spacer GS1 may include a first portion PP1, which has a height and profile similar to those of the contact body portion LB and the electrode body portion GB, and second and third portions PP2 and PP3, which have a height and profile similar to those of the contact protruding portion LA and the electrode protruding portion GC. A stepwise structure, which is similar to the first stepwise structure SK1 and the second stepwise structure SK2, may be provided between the second portion PP2 and the third portion PP3.

Referring back to FIG. 1, a first cell boundary CB1, which extends in the second direction D2, may be defined in a portion of the logic cell LC. A second cell boundary CB2, which extends in the second direction D2, may be defined in another portion of the logic cell LC, which is opposite to the first cell boundary CB1. The sixth lower interconnection line M1_R1, to which the drain voltage VDD (i.e., a power voltage) is applied, may be disposed on the first cell boundary CB1. The sixth lower interconnection line M1_R1 applied with the drain voltage VDD may extend along the first cell boundary CB1 and in the second direction D2. The seventh lower interconnection line M1_R2, to which the source voltage VSS (i.e., a ground voltage) is applied, may be disposed on the second cell boundary CB2. The seventh lower interconnection line M1_R2 applied with the source voltage VSS may extend along the second cell boundary CB2 and in the second direction D2. The first to fifth lower interconnection lines M1_I1 to M1_I5 may be arranged between the sixth lower interconnection line M1_R1 and the seventh lower interconnection line M1_R2, and spaced apart with a second pitch P2 in the first direction D1. The second pitch P2 may be smaller than the first pitch P1.

A second metal layer M2 may be provided in a fourth interlayer insulating layer 140. The second metal layer M2 may include upper interconnection lines M2_I. The upper interconnection lines M2_I may also be referred to as second interconnection lines. Each of the upper interconnection lines M2_I may be a line- or bar-shaped pattern extending in the first direction D1. In other words, the upper interconnection lines M2_I may extend in the first direction D1 and may be parallel to each other. When viewed in a plan view, the upper interconnection lines M2_I may be parallel to the gate electrodes GE. The upper interconnection lines M2_I may be arranged with a third pitch P3 in the second direction D2. The third pitch P3 may be smaller than the first pitch P1, and may be larger than the second pitch P2.

The second metal layer M2 may further include upper vias VI. The upper vias VI may be provided below the upper interconnection lines M2_I. The upper vias VI may connect the lower interconnection lines to the upper interconnection lines M2_I. The upper interconnection line M2_I of the second metal layer M2 and the upper via VI thereunder may be formed by the same process and may form a single object. For example, the upper interconnection line M2_I and the upper via VI thereunder may be formed of the same material.

The lower interconnection lines M1_R1, M1_R2, and M1_I1 to M1_I5 of the first metal layer M1 and the upper interconnection lines M2_I of the second metal layer M2 may include the same conductive material or may include conductive materials different from each other. For example, the lower interconnection lines M1_R1, M1_R2, and M1_I1 to M1_I5 and the upper interconnection lines M2_I may be formed of or include at least one of metallic materials (e.g., aluminum (Al), copper (Cu), tungsten (W), molybdenum (Mo), and cobalt (Co)).

In an example embodiment of the present inventive concept, additional metal layers may be further stacked on the fourth interlayer insulating layer 140. Each of the stacked metal layers may include routing lines constituting an interconnection structure.

FIGS. 4A to 13D are diagrams illustrating a method of fabricating a semiconductor device, according to an example embodiment of the present inventive concept. In detail, FIGS. 4A to 9A, 10B, and 11A to 13A are cross-sectional views corresponding to line A-A' of FIG. 1. FIGS. 5B, 6B, and 7B are cross-sectional views corresponding to line B-B' of FIG. 1. FIGS. 5C, 6C, 7C, 8B, 9B, 10D, 11C, 12C, and 13C are cross-sectional views corresponding to line C-C' of FIG. 1. FIGS. 4B, 5D, 6D, 7D, 8C, 9C, 10E, 11D, 12D, and 13D are cross-sectional views corresponding to line D-D' of FIG. 1. FIGS. 10C, 11B, 12B, and 13B are cross-sectional views corresponding to line E-E' of FIG. 1. FIG. 10A is a plan view corresponding to FIG. 1 and illustrates mask patterns.

Figure 4A:
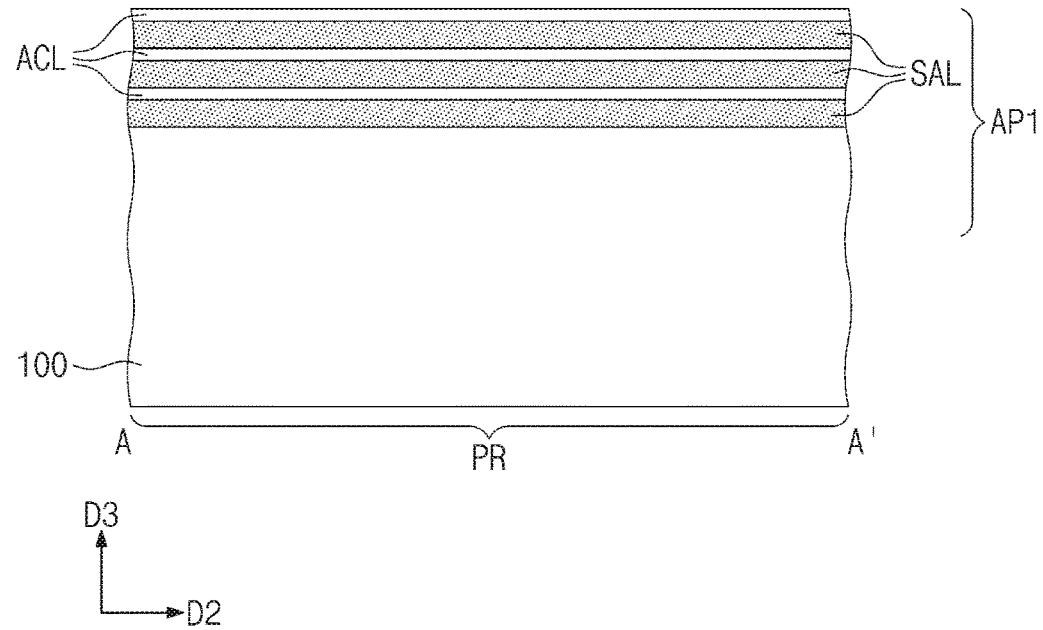
FIGS. 4A, 4B, 5A to 5D, 6A to 6D, 7A to 7D, 8A to 8C, 9A to 9C, 10B to 10E, 11A to 11D, 12A to 12D, and 13A to 13D are cross-sectional views illustrating a method of fabricating a semiconductor device, according to an example embodiment of the present inventive concept.
Figure 4B:
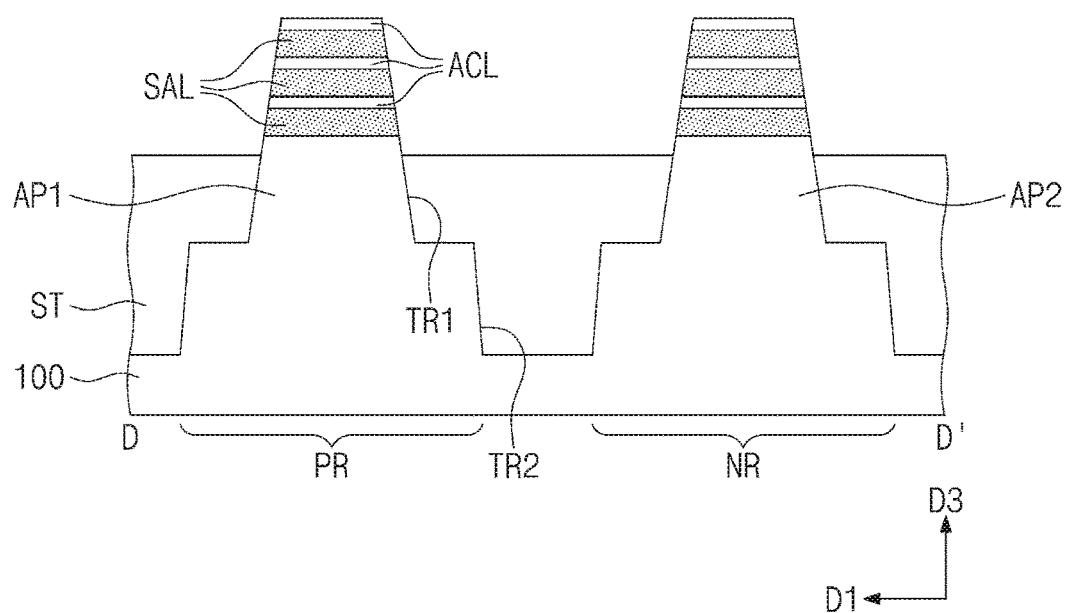
Figure 5A:
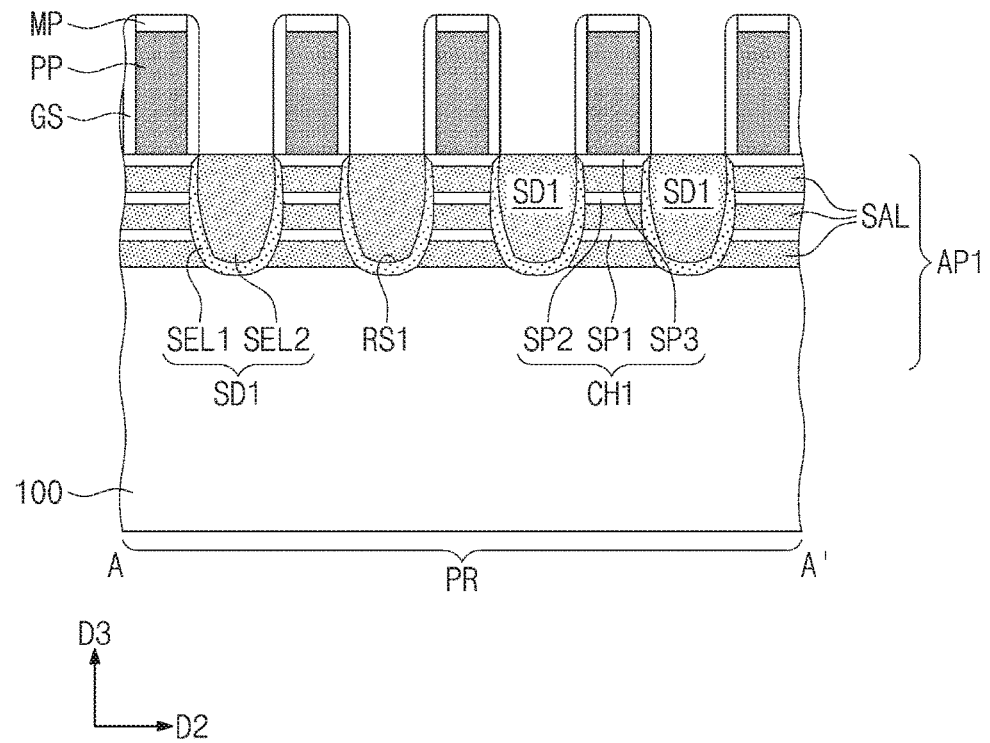
Figure 5B:
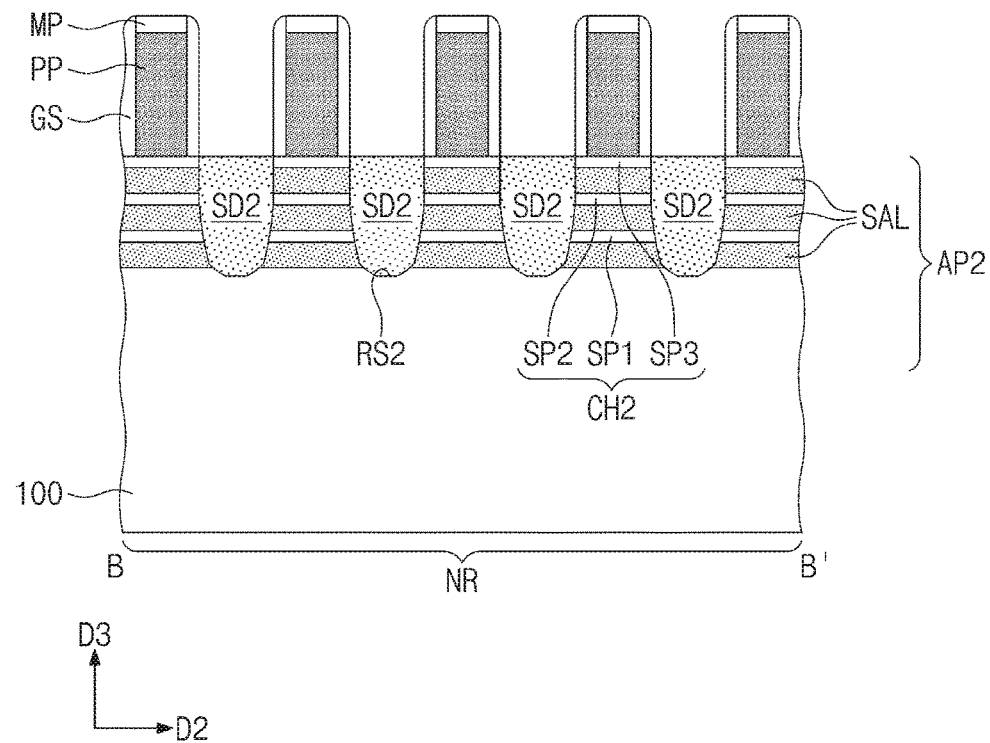
Figure 5C:
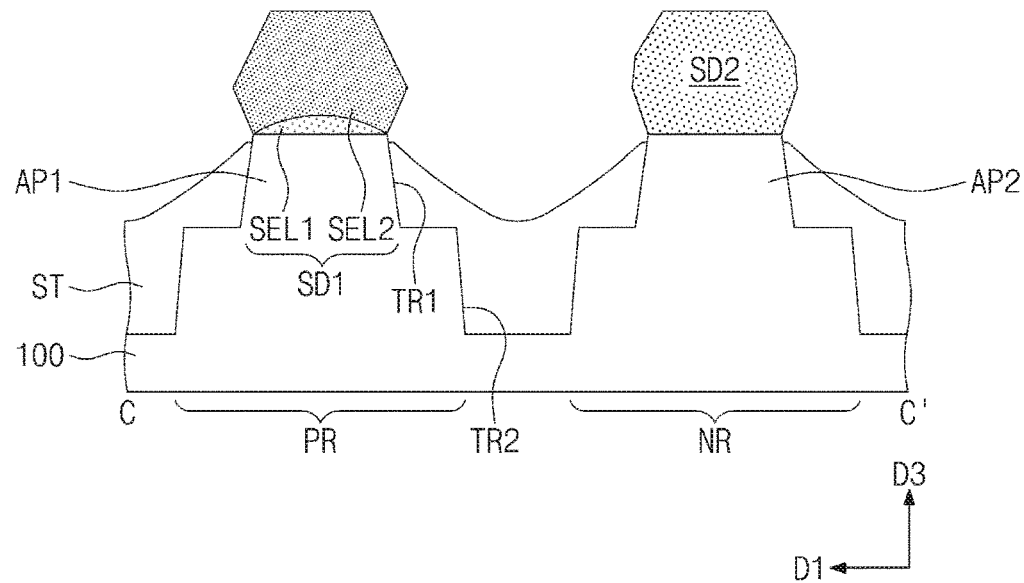
Figure 5D:
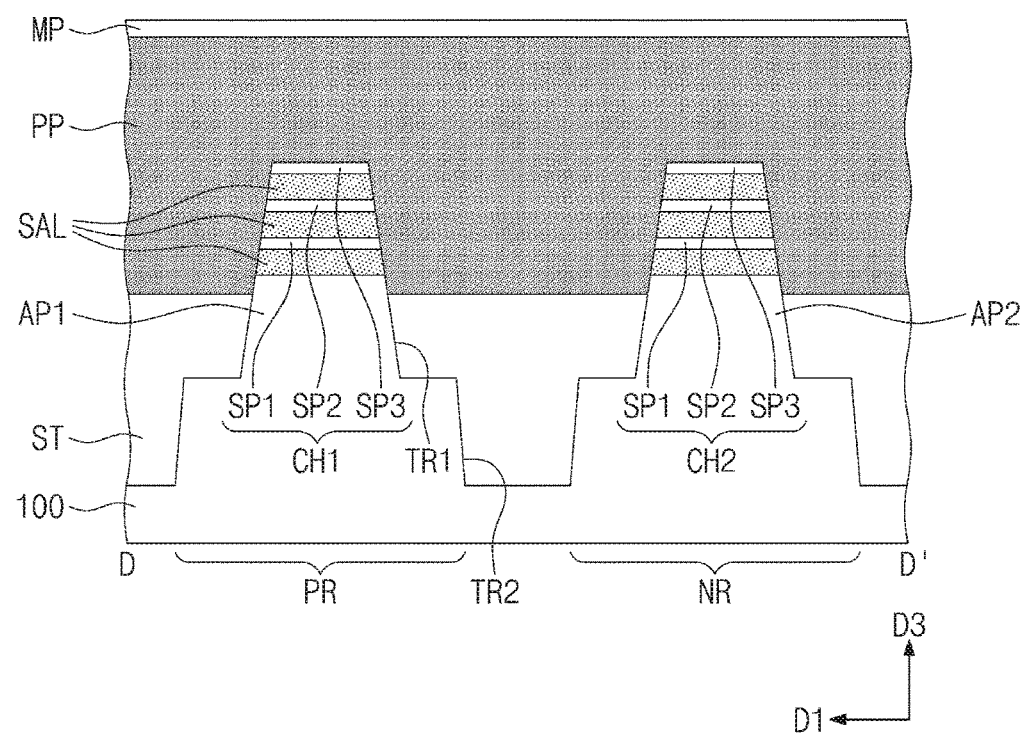
Figure 6A:
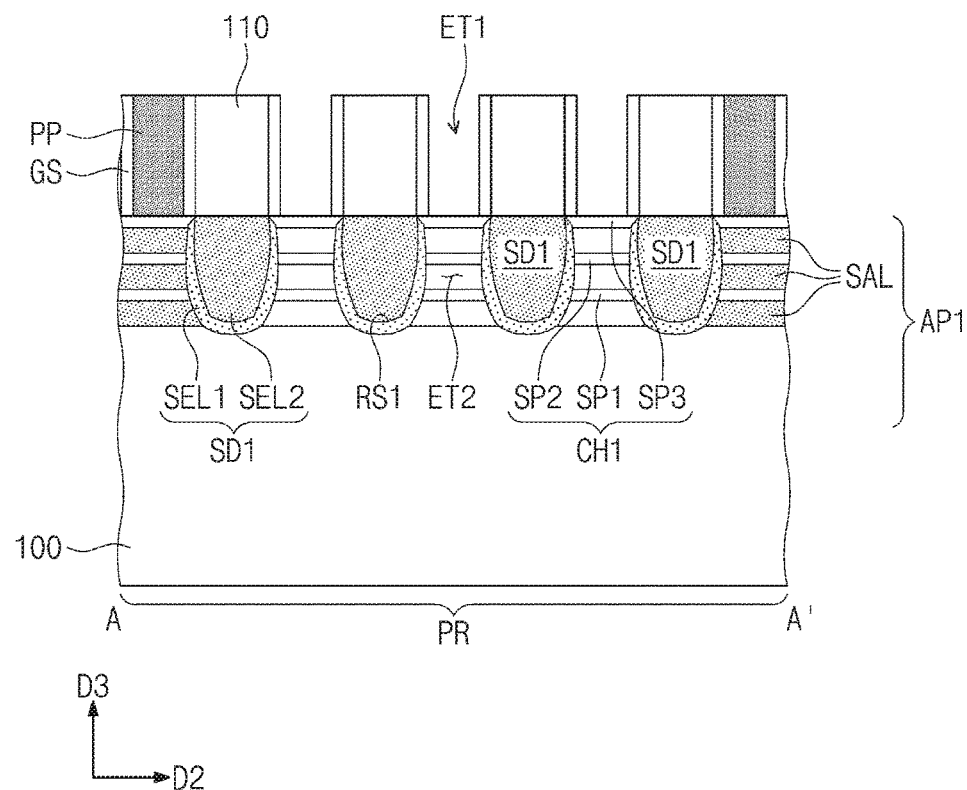
Figure 6B:
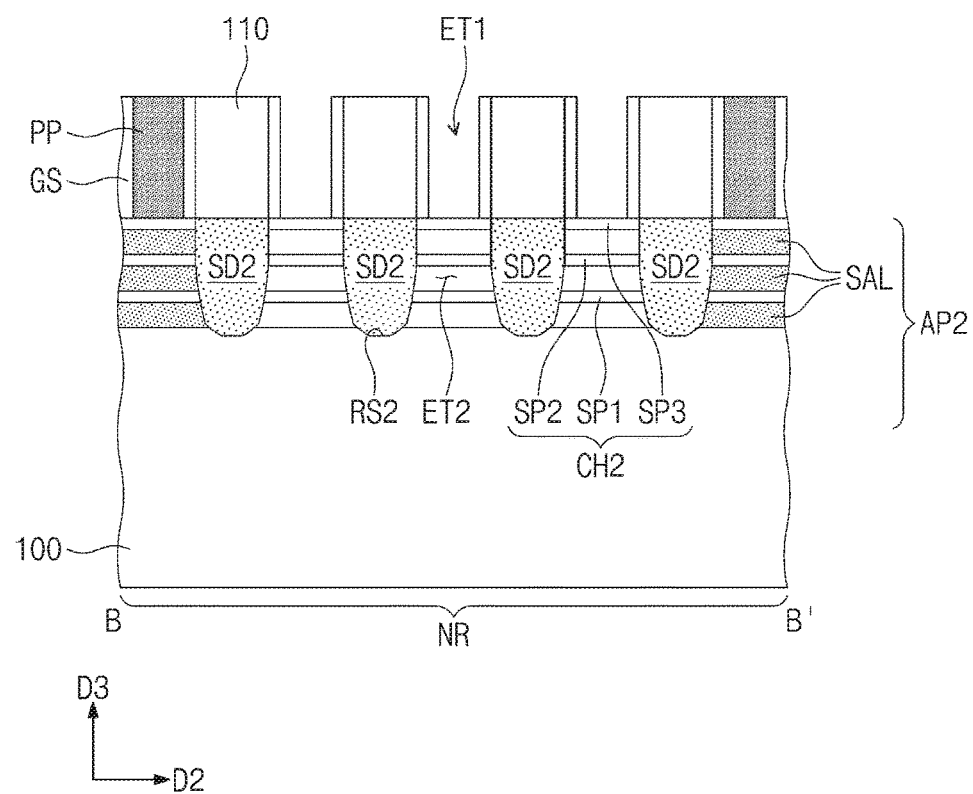
Figure 6C:
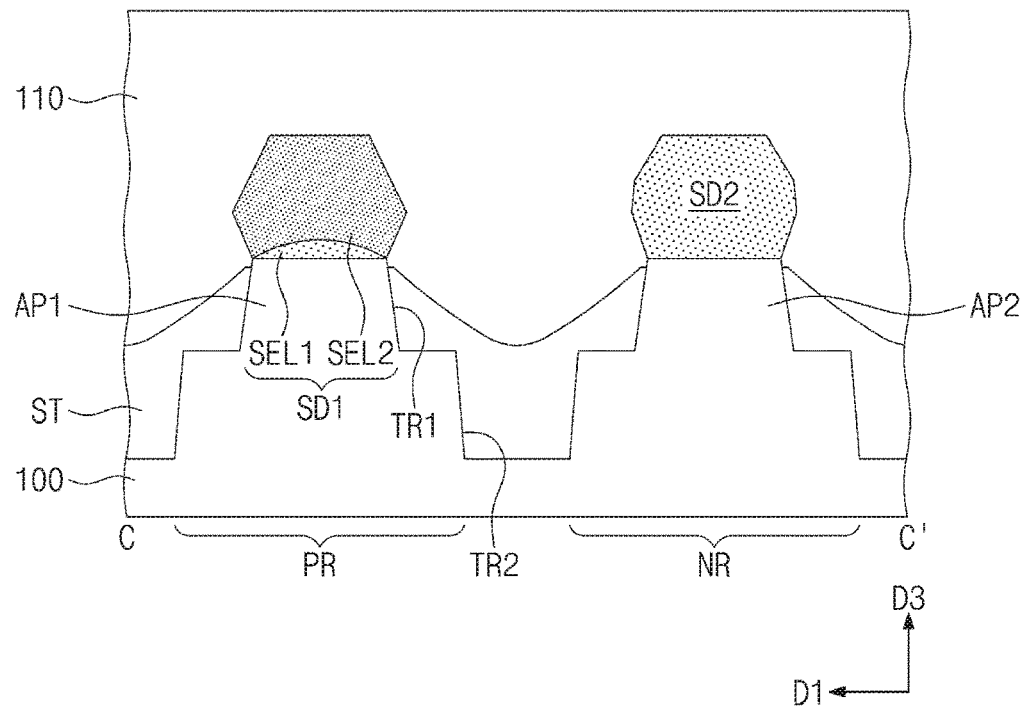
Figure 6D:
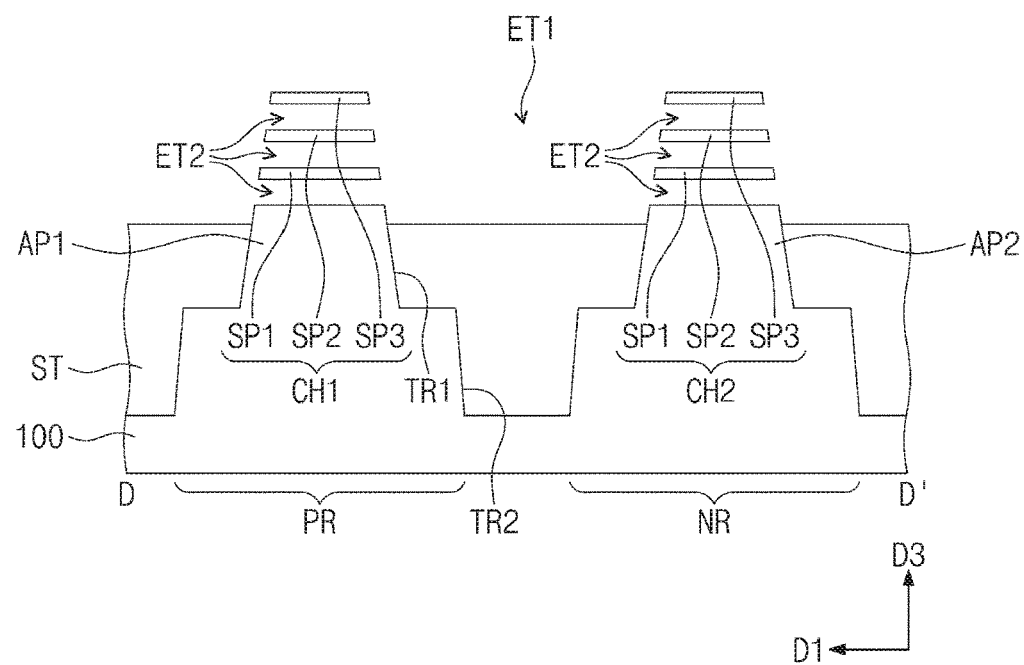
Figure 7A:
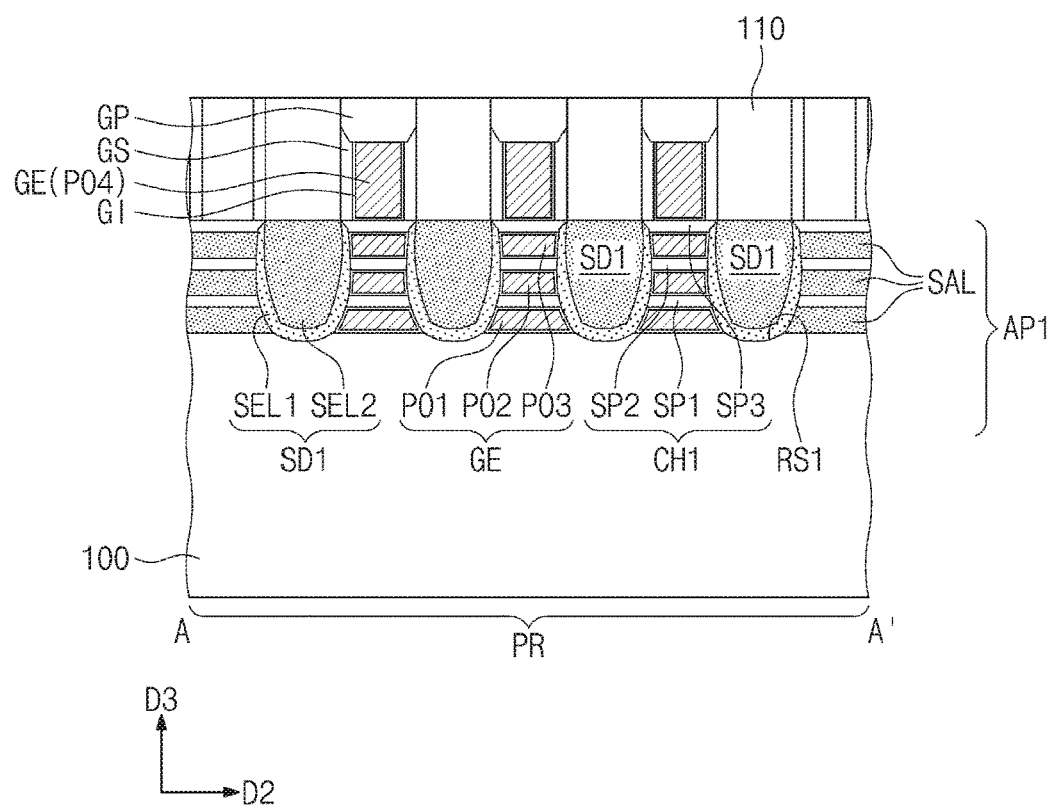
Figure 7B:
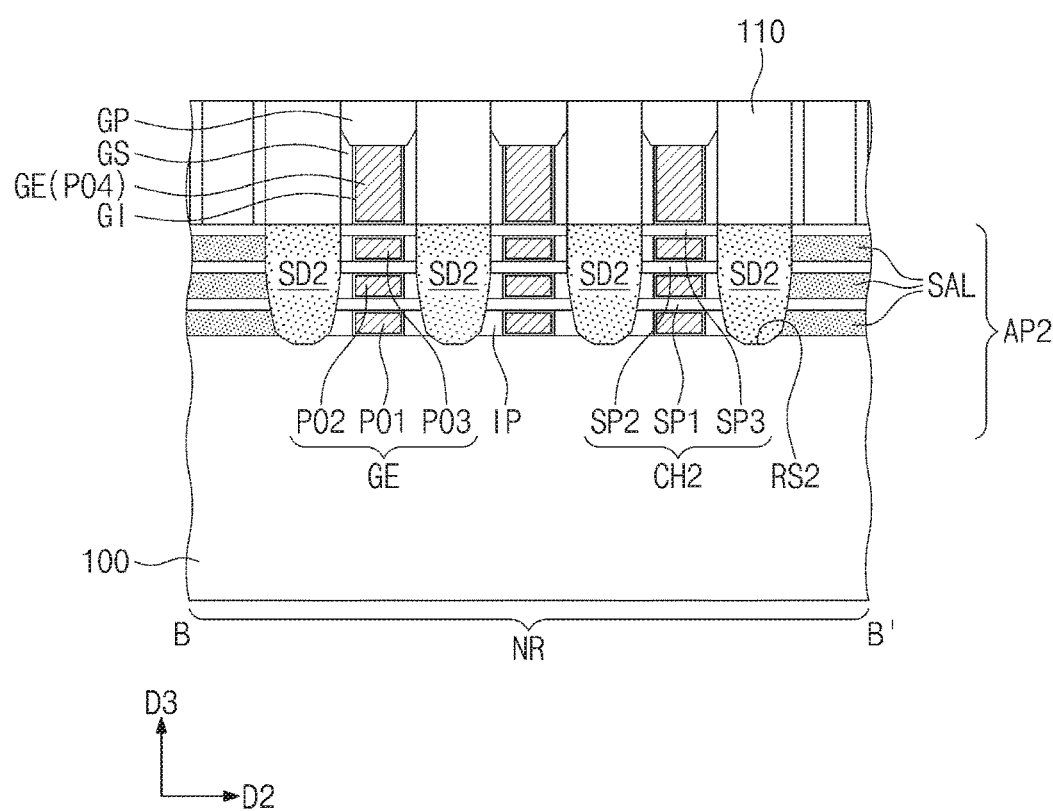
Figure 7C:
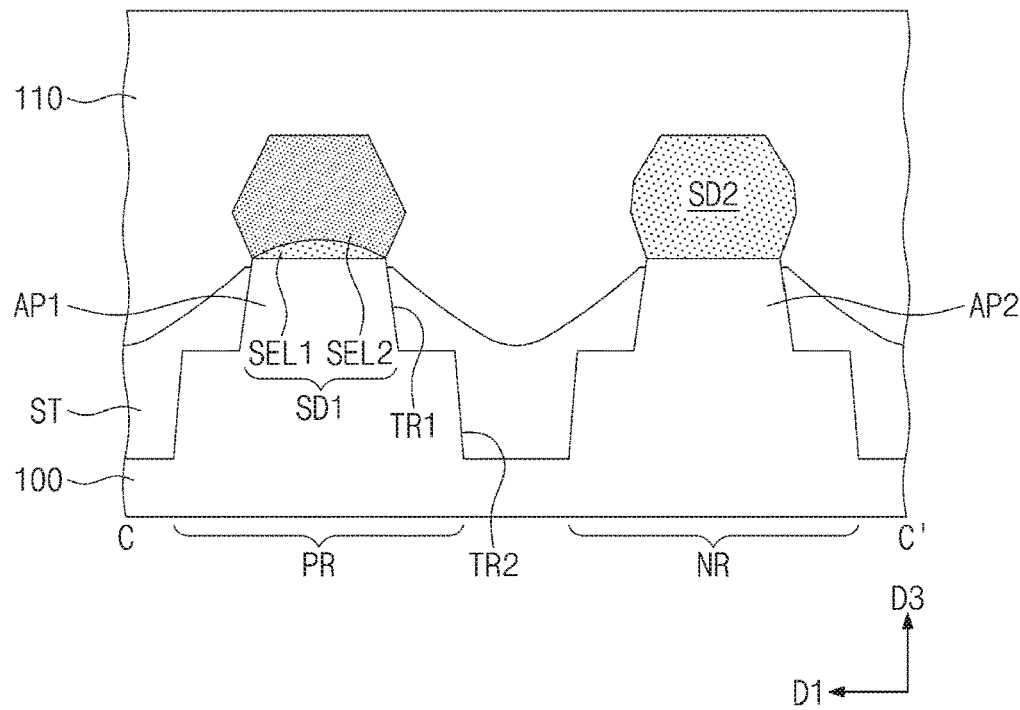
Figure 7D:
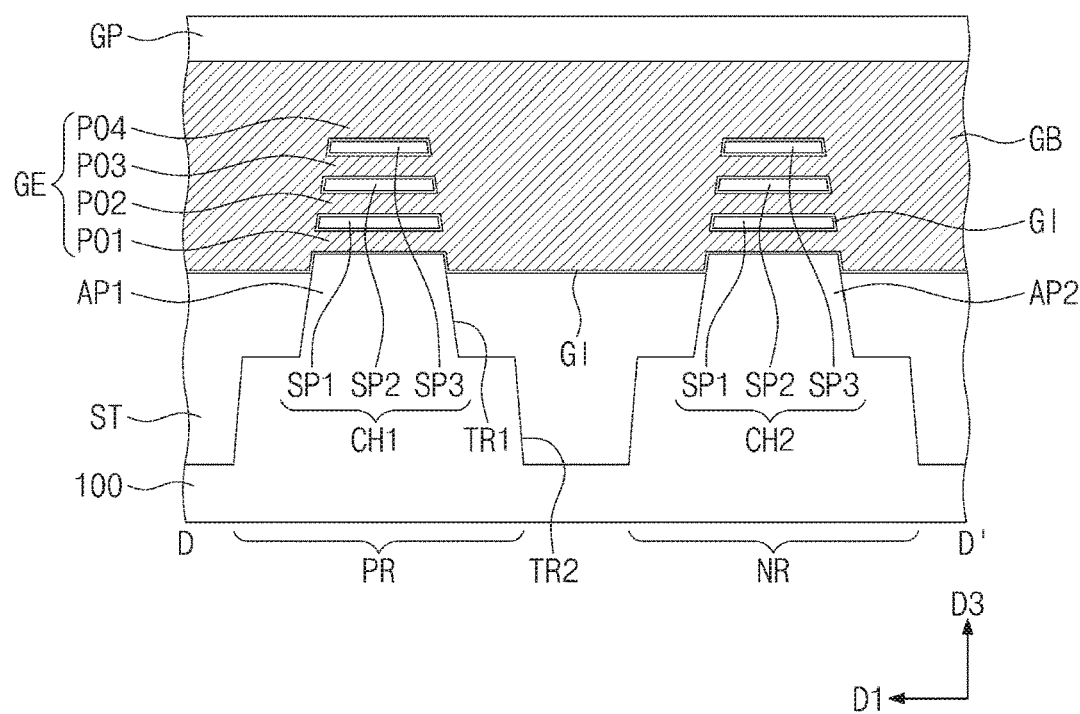

Referring to FIGS. 1, 4A, and 4B, the substrate 100 including the PMOSFET and NMOSFET regions PR and NR may be provided. The sacrificial layers SAL and active layers ACL may be alternately stacked on the substrate 100. For example, the sacrificial layers SAL may extend in parallel with each other in the second direction D2, and may be arranged and spaced apart from each other in the first direction D1. The sacrificial layers SAL may be formed of or include one of, for example, silicon (Si), germanium (Ge), or silicon-germanium (SiGe), and the active layers ACL may be formed of or include another one of, for example, silicon (Si), germanium (Ge), or silicon-germanium (SiGe). In an example embodiment of the present inventive concept, the sacrificial layers SAL may be formed of or include silicon-germanium (SiGe), and the active layers ACL may be formed of or include silicon (Si). A germanium (Ge) concentration of each of the sacrificial layers SAL may range from about 10 at % to about 30 at %.

Mask patterns may be respectively formed on the PMOSFET and NMOSFET regions PR and NR of the substrate 100. The mask pattern may be a line- or bar-shaped pattern extending in the second direction D2. A first patterning process, in which the mask patterns are used as an etch mask, may be performed to form the first trench TR1 defining the first and second active patterns AP1 and AP2. The first patterning process may include a photolithography process and an etch process. The first and second active patterns AP1 and AP2 may be formed on the PMOSFET and NMOSFET regions PR and NR, respectively. Each of the first and second active patterns AP1 and AP2 may include the sacrificial and active layers SAL and ACL, which are provided in an upper portion thereof and are alternately stacked.

A second patterning process may be performed on the substrate 100 to form the second trench TR2 defining the PMOSFET and NMOSFET regions PR and NR. The second patterning process may include a photolithography process and an etch process. The second trench TR2 may be formed between the PMOSFET region PR and the NMOSFET region NR and may separate the PMOSFET region PR and the NMOSFET region NR. The second trench TR2 may be formed to be deeper than the first trench TR1. Thereafter, the device isolation layer ST may be formed on the substrate 100 to fill the first and second trenches TR1 and TR2. For example, an insulating layer may be formed on the substrate 100 to cover the first and second active patterns AP1 and AP2. The device isolation layer ST may be formed by recessing the insulating layer until the sacrificial layers SAL are exposed. For example, the device isolation layer ST may be formed on the substrate 100 to define the first and second active patterns AP1 and AP2. The device isolation layer ST may be formed of or include at least one of insulating materials (e.g., silicon oxide ($SiO_2$)). Each of the first and second active patterns AP1 and AP2 may include an upper portion protruding above the device isolation layer ST.

Referring to FIGS. 5A to 5D, sacrificial patterns PP may be formed on the substrate 100 to cross the first and second active patterns AP1 and AP2. Each of the sacrificial patterns PP may be a line- or bar-shaped pattern that extends in the first direction DL. The sacrificial patterns PP may be arranged, with a specific pitch, in the second direction D2.

The formation of the sacrificial patterns PP may include forming a sacrificial layer on the substrate 100, forming hard mask patterns MP on the sacrificial layer, and patterning the sacrificial layer using the hard mask patterns MP as an etch mask. The sacrificial patterns PP may extend in parallel with each other in the first direction D1, and may be arranged and spaced apart from each other in the second direction D2. The sacrificial layer may be formed of or include poly silicon (p-Si).

A pair of the spacers GS may be formed on both side surfaces of each of the sacrificial patterns PP and the hard mask patterns MP. The formation of the spacers GS may include conformally forming a spacer layer on the substrate 100 and anisotropically etching the spacer layer. To form the spacers GS, a process such as, for example, an atomic layer deposition (ALD) process, a chemical vapor deposition (CVD) process, or a combination thereof may be used. The spacer layer may be formed of or include at least one of, for example, silicon carbonitride (SiCN), silicon carbon oxynitride (SiCON), or silicon nitride ($Si_3N_4$). Alternatively, the spacer layer may be a multi-layered structure including at least two of, for example, silicon carbonitride (SiCN), silicon carbon oxynitride (SiCON), or silicon nitride ($Si_3N_4$).

The first recesses RS1 may be formed in an upper portion of the first active pattern AP1. Portions of the device isolation layer ST, which are located at both sides of each of the first active patterns AP1, may be recessed during the formation of the first recesses RS1. The first recesses RS1 may be formed by etching an upper portion of the first active pattern AP1 using the hard mask patterns MP and the spacers GS as an etch mask. The first source/drain patterns SD1 may be formed in the first recesses RS1, respectively. For example, a first SEG process, in which an inner surface of the first recess RS1 is used as a seed layer, may be performed to form a first semiconductor layer SEL1. The first semiconductor layer SEL1 may be grown using the first to third semiconductor patterns SP1, SP2, and SP3 and the substrate 100, which are exposed through the first recesses RS1, as a seed. As an example, the first SEG process may include a chemical vapor deposition (CVD) process or a molecular beam epitaxy (MBE) process.

The first semiconductor layer SEL1 may be formed of or include a semiconductor material (e.g., SiGe) having a lattice constant greater than that of a semiconductor element (e.g., Si) of the substrate 100. The first semiconductor layer SEL1 may be formed to have a relatively low germanium (Ge) concentration. In an example embodiment of the present inventive concept, the first semiconductor layer SEL1 may contain only silicon (Si), not germanium (Ge). Alternatively, the first semiconductor layer SEL1 may be provided to contain small amount of germanium (Ge). The germanium concentration of the first semiconductor layer SEL1 may range from 0 at % to about 10 at %.

The second semiconductor layer SEL2 may be formed by performing a second SEG process on the first semiconductor layer SEL1. The second semiconductor layer SEL2 may be formed to completely fill the first recess RS1. The second semiconductor layer SEL2 may be formed to have a relatively high germanium (Ge) concentration. As an example, the germanium (Ge) concentration of the second semiconductor layer SEL2 may range from about 30 at % to about 70 at %.

The first and second semiconductor layers SEL1 and SEL2 may constitute the first source/drain pattern SD1. The first and second semiconductor layers SEL1 and SEL2 may be doped with impurities in situ during the first and second SEG processes. Alternatively, after the formation of the first source/drain pattern SD1, the first source/drain pattern SD1 may be doped with impurities through an ion injection process. For example, an ion implantation process may be used to inject the dopants into the first source/drain patterns SD1 after the SEG process. The first source/drain pattern SD1 may be doped to have a first conductivity type (e.g., p-type). In an example embodiment of the present inventive concept, each of the first source/drain patterns SD1 may include a silicon germanium (SiGe) layer doped with P-type dopants such as, for example, boron (B), aluminum (Al), gallium (Ga), and/or indium (In).

The second recesses RS2 may be formed in an upper portion of the second active pattern AP2. The second source/drain patterns SD2 may be formed in the second recesses RS2, respectively. For example, the second source/drain pattern SD2 may be formed by an SEG process using an inner surface of the second recess RS2 as a seed layer. In an example embodiment of the present inventive concept, the second source/drain pattern SD2 may be formed of or include a semiconductor material (e.g., Si) the same as that of the substrate 100. The second source/drain pattern SD2 may be doped to have a second conductivity type (e.g., n-type). In an example embodiment of the present inventive concept, each of the second source/drain patterns SD2 may include a silicon (Si) layer doped with N-type dopants such as, for example, phosphorus (P), arsenic (As), antimony (Sb) and/or bismuth (Bi).

Referring to FIGS. 6A to 6D, the first interlayer insulating layer 110 may be formed to cover the first source/drain pattern SD1, the second source/drain pattern SD2, the hard mask patterns MP and the spacers GS, and then, a planarization process may be performed on the first interlayer insulating layer 110 to expose at least a portion of the sacrificial patterns PP. The planarization process of the first interlayer insulating layer 110 may be performed using an etch-back process or a chemical mechanical polishing (CMP) process. The hard mask patterns MP may be completely removed during the planarization process. Next, upper trenches ET1 may be formed to expose side surfaces of the sacrificial layers SAL. The sacrificial layers SAL, which are provided on the PMOSFET and NMOSFET regions PR and NR of the logic cell LC and are exposed through the upper trenches ET1, may be selectively removed, while the sacrificial layers SAL on the side regions of the logic cell LC may not be removed. In detail, an etching process of selectively etching only the sacrificial layers SAL may be performed to remove only the sacrificial layers SAL and to leave the first to third semiconductor patterns SP1, SP2, and SP3. Since the sacrificial layers SAL are selectively removed, only the first to third semiconductor patterns SP1, SP2, and SP3 may be left on each of the first and second active patterns AP1 and AP2. Hereinafter, empty regions, which are formed by removing the sacrificial layers SAL, will be referred to as third recesses ET2. For example, to form the third recesses ET2, the sacrificial layers SAL may be selectively etched by using an etching selectivity difference between the sacrificial layers SAL and the first to third semiconductor patterns SP1, SP2, and SP3. In an example embodiment of the present inventive concept, the third recesses ET2 may be formed by a wet etching process. The third recesses ET2 may be defined between the first to third semiconductor patterns SP1, SP2, and SP3.

Referring to FIGS. 7A to 7D, the inner spacers IP may be formed in the third recesses ET2. In an example embodiment of the present inventive concept, the inner spacers IP may be formed by forming an insulating layer to cover the second source/drain patterns SD2 and performing an etching process on the insulating layer. The inner spacers IP may be formed of or include at least one of, for example, silicon oxide ($SiO_2$), silicon nitride ($Si_3N_4$), silicon carbide (SiC), silicon oxycarbide (SiOC), or aluminum oxide ($Al_2O_3$).

The gate insulating layer GI may be conformally formed in the upper trenches ET1 and the third recesses ET2. The gate electrode GE may be formed on the gate insulating layer GI. The gate electrode GE may be formed to fill the upper trenches ET1 and the third recesses ET2. In detail, the gate electrode GE may include the first to third portions P01, P02, and P03 filling the third recesses ET2. The gate electrode GE may further include the fourth portion P04 filling the upper trench ET1. A gate capping pattern GP may be formed on the gate electrode GE.

Figure 8A:
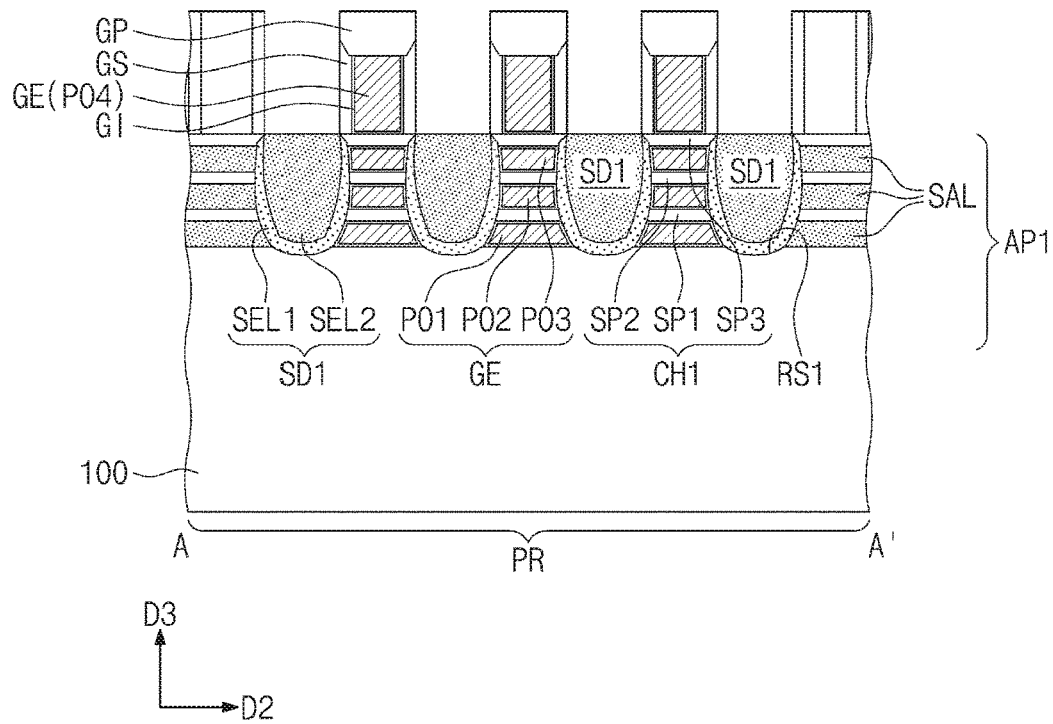
Figure 8B:
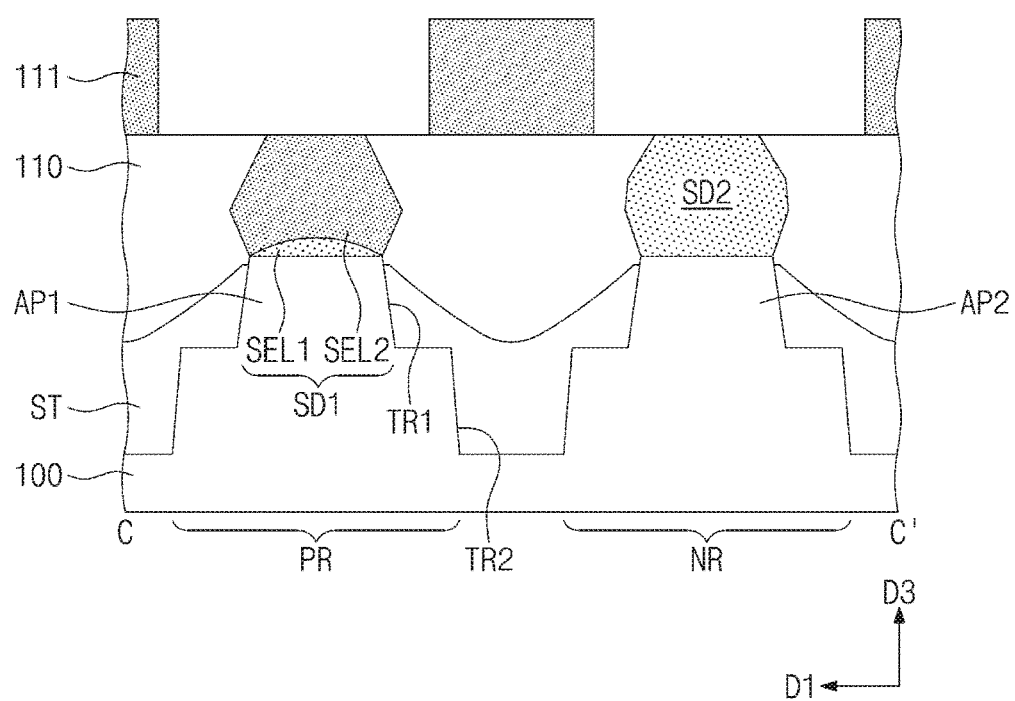
Figure 8C:
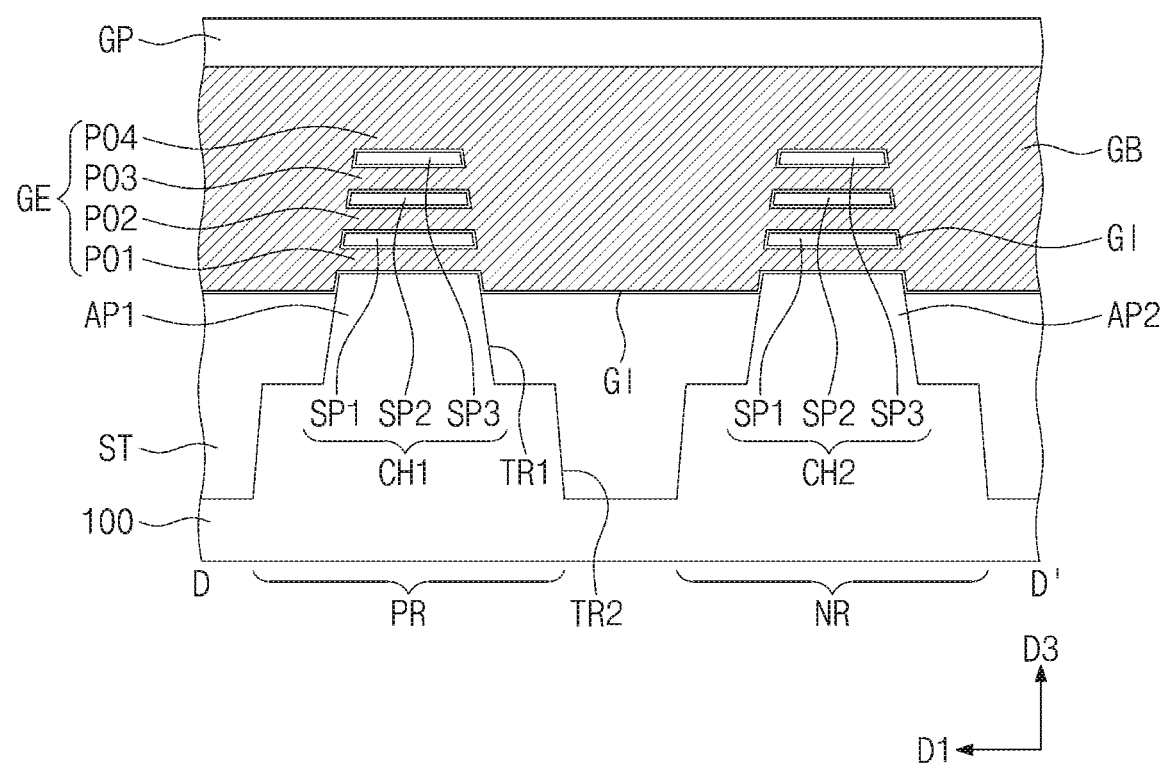

Referring to FIGS. 8A to 8C, an upper portion of the first interlayer insulating layer 110 between the gate electrodes GE may be removed, and the fence patterns 111, which are used to define regions for the active contacts AC, may be formed between the gate electrodes GE. The fence patterns 111 may be formed of or include at least one of, for example, silicon oxide ($SiO_2$), silicon nitride ($Si_3N_4$), silicon carbide (SiC), silicon oxy carbide (SiOC), or aluminum oxide ($Al_2O_3$).

Figure 9A:
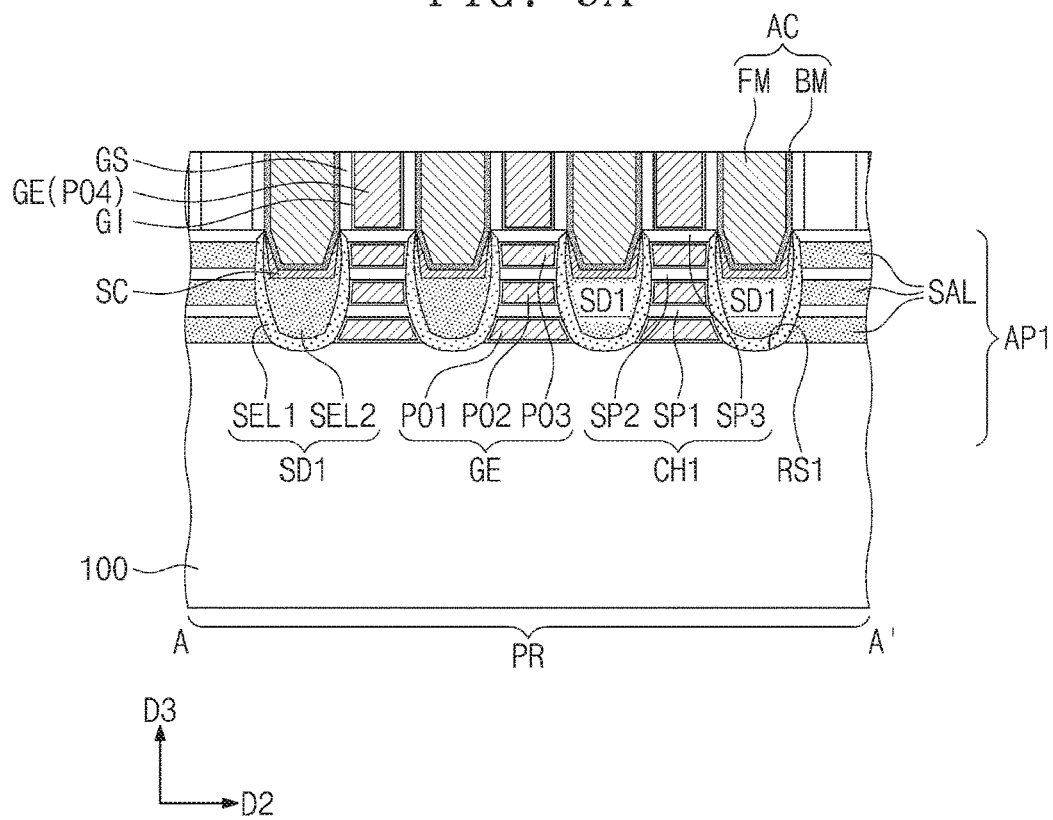
Figure 9B:
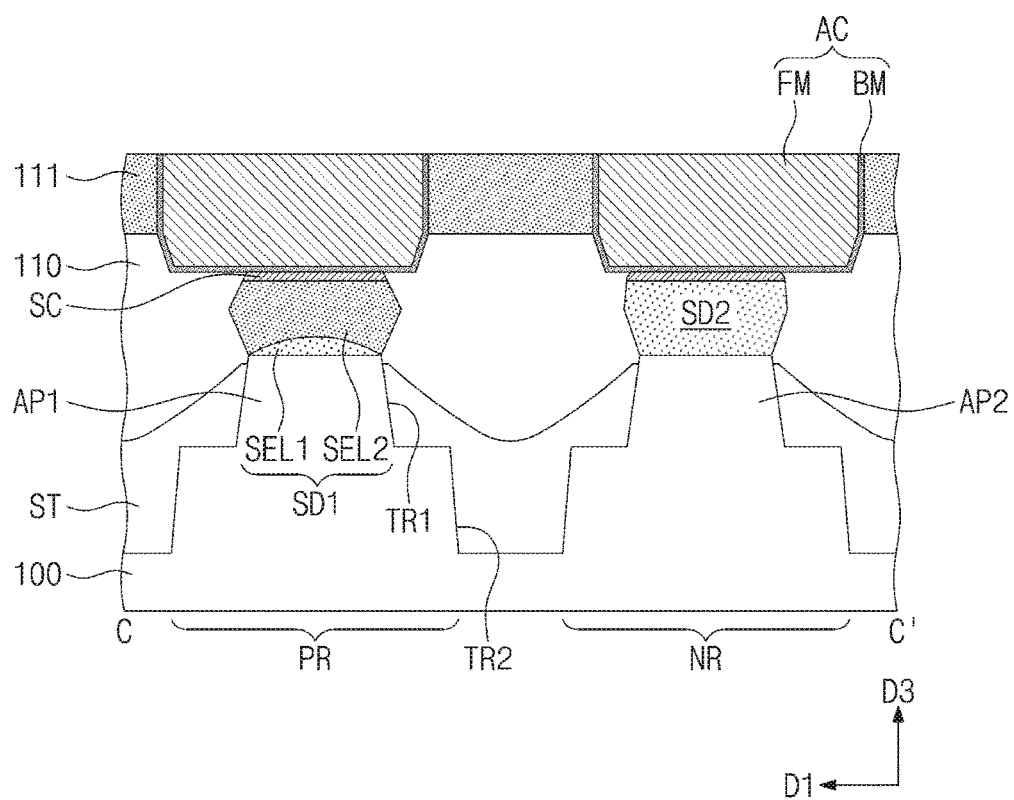
Figure 9C:
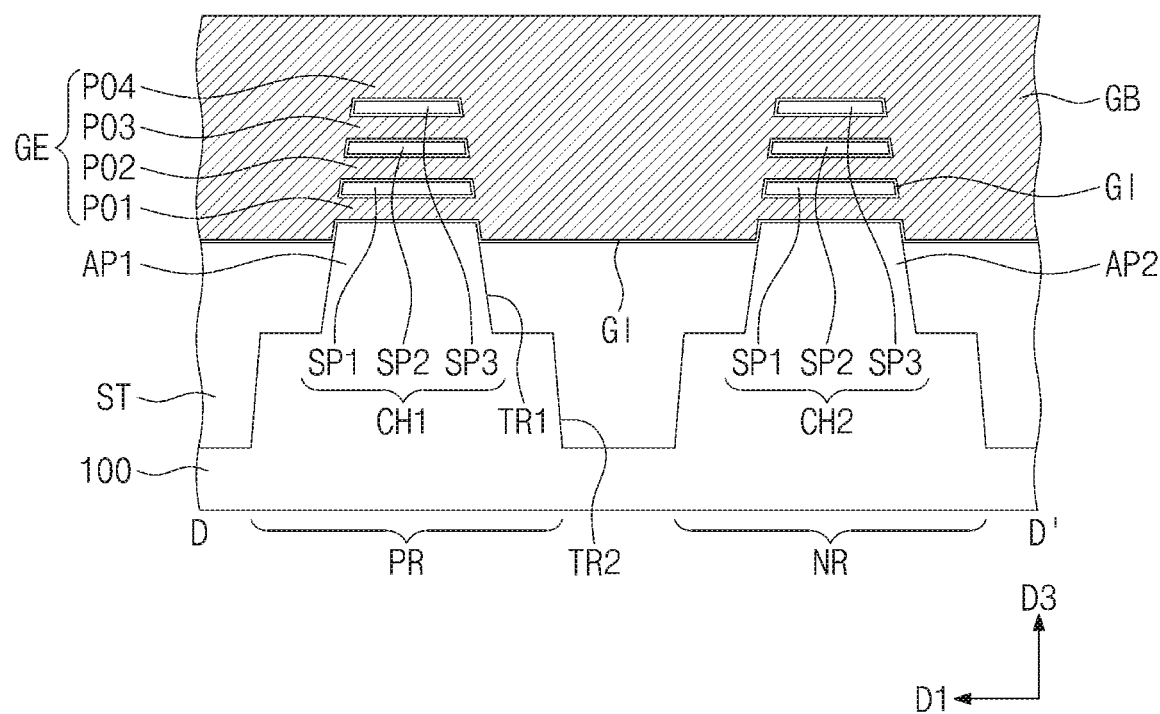

Referring to FIGS. 9A to 9C, the first interlayer insulating layer 110 between the fence patterns 111 may be removed to expose the first source/drain pattern SD1 and the second source/drain pattern SD2, and then, the active contact AC may be formed on the first source/drain pattern SD1 and the second source/drain pattern SD2. The formation of the active contact AC may include sequentially forming the barrier pattern BM and the conductive pattern FM and performing a planarization process. The planarization process may be performed to expose the top surfaces of the gate electrodes GE. The barrier pattern BM may be formed to include a metal layer and a metal nitride layer. The conductive pattern FM may be formed of or include at least one of metallic materials (e.g., aluminum (Al), copper (Cu), tungsten (W), molybdenum (Mo), and cobalt (Co)). During the formation of the active contacts AC, the silicide patterns SC may be respectively formed between the active contact AC and the first source/drain pattern SD1 and between the active contact AC and the second source/drain pattern SD2 to provide reliable metal-semiconductor contact and reduce electrical resistance between the active contact AC and the first source/drain pattern SD1 and between the active contact AC and the second source/drain pattern SD2. In an example embodiment of the present inventive concept, the silicide pattern SC may be formed of or include at least one of, for example, titanium silicide ($TiSi_2$), tantalum silicide ($TaSi_2$), tungsten silicide ($WSi_2$), nickel silicide ($NiSi_2$), or cobalt silicide ($CoSi_2$).

Referring to FIGS. 10A to 10E, a blocking insulating layer 120 may be formed, and mask patterns HM may be formed to define the electrode protruding portion GC in an upper portion of the gate electrode GE and the contact protruding portion LA in an upper portion of the active contact AC. In an example embodiment of the present inventive concept, the blocking insulating layer 120 may be formed of or include at least one of, for example, silicon nitride ($Si_3N_4$) or silicon oxynitride (SiON). The mask patterns HM may be formed of or include at least one of, for example, photoresist materials, silicon nitride ($Si_3N_4$), or silicon oxynitride (SiON).

Figure 10A:
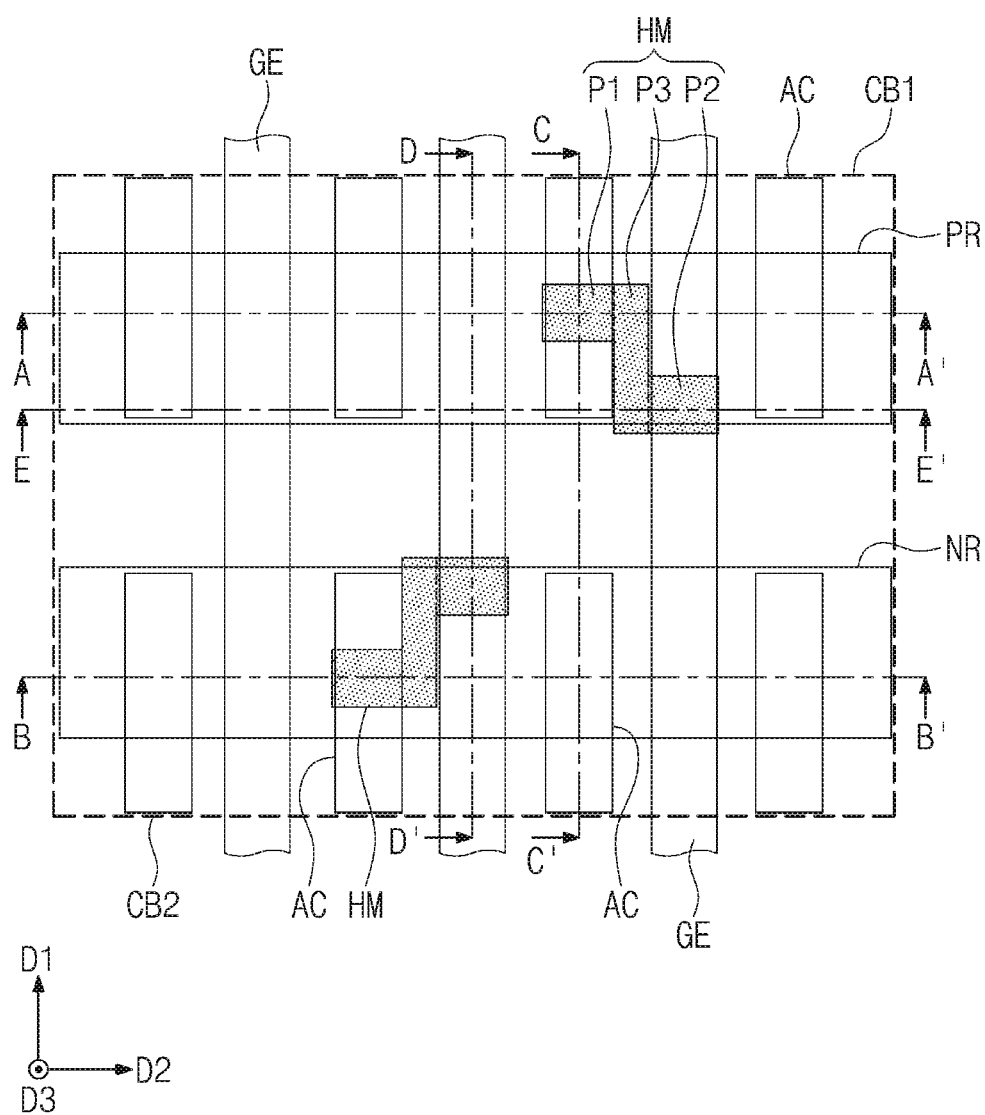
FIG. 10A is a plan view corresponding to FIG. 1.
Figure 10B:
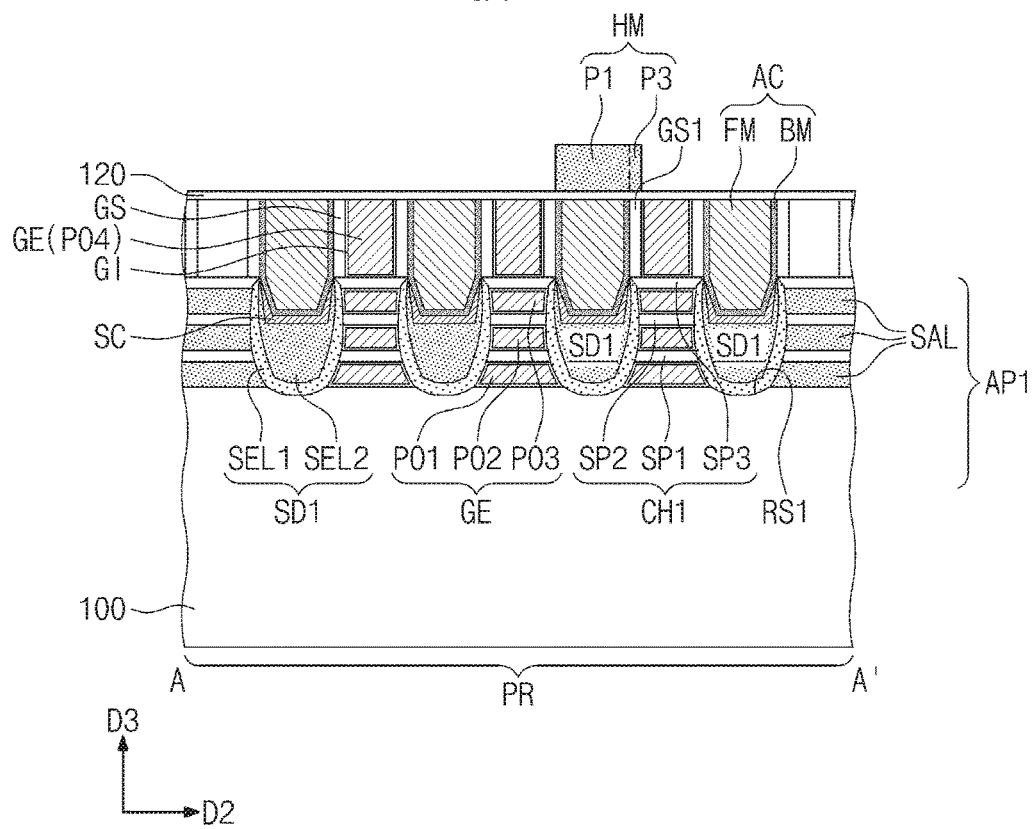
Figure 10C:
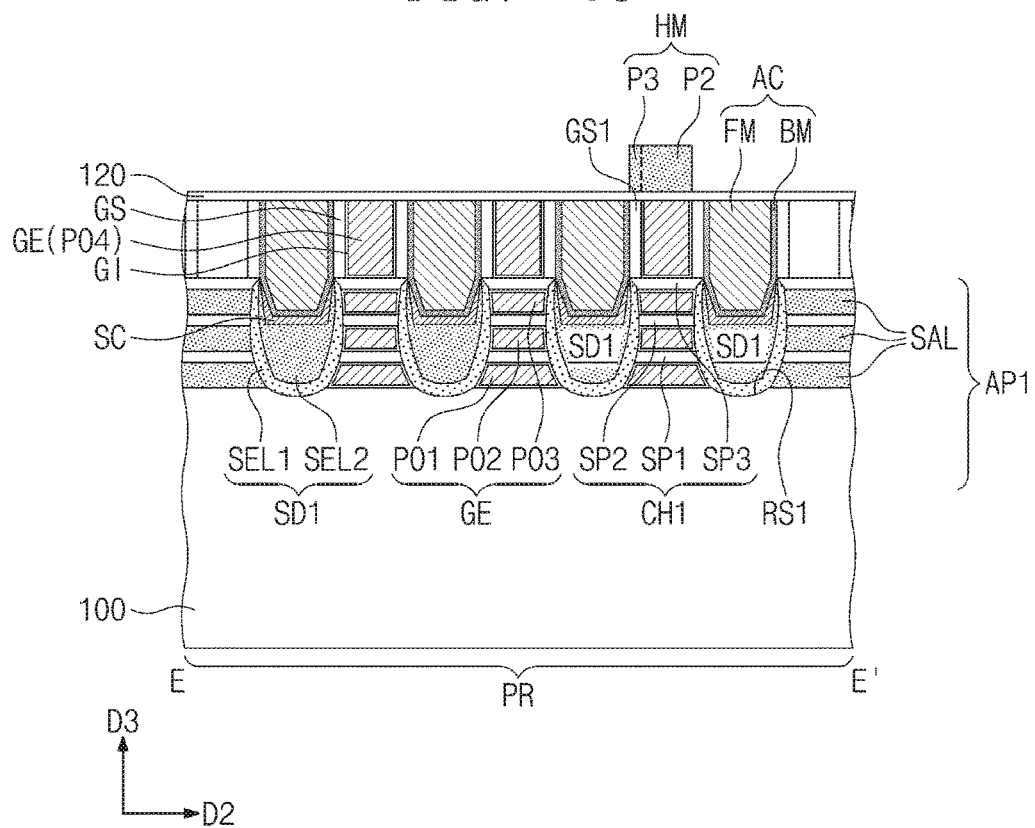
Figure 10D:
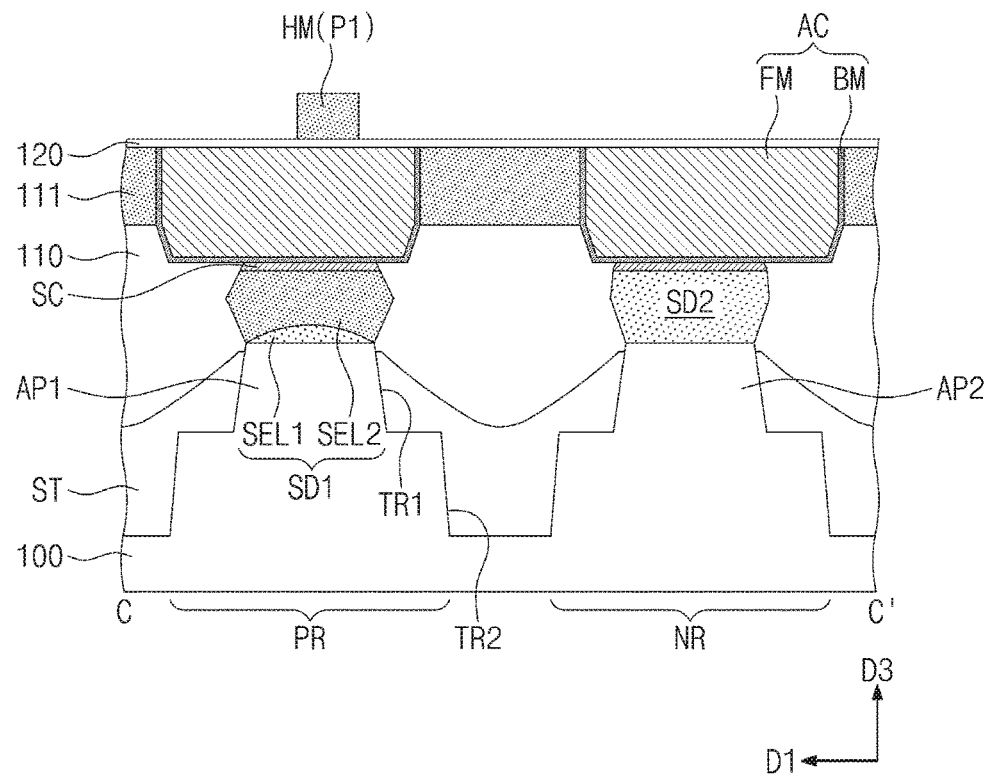
Figure 10E:
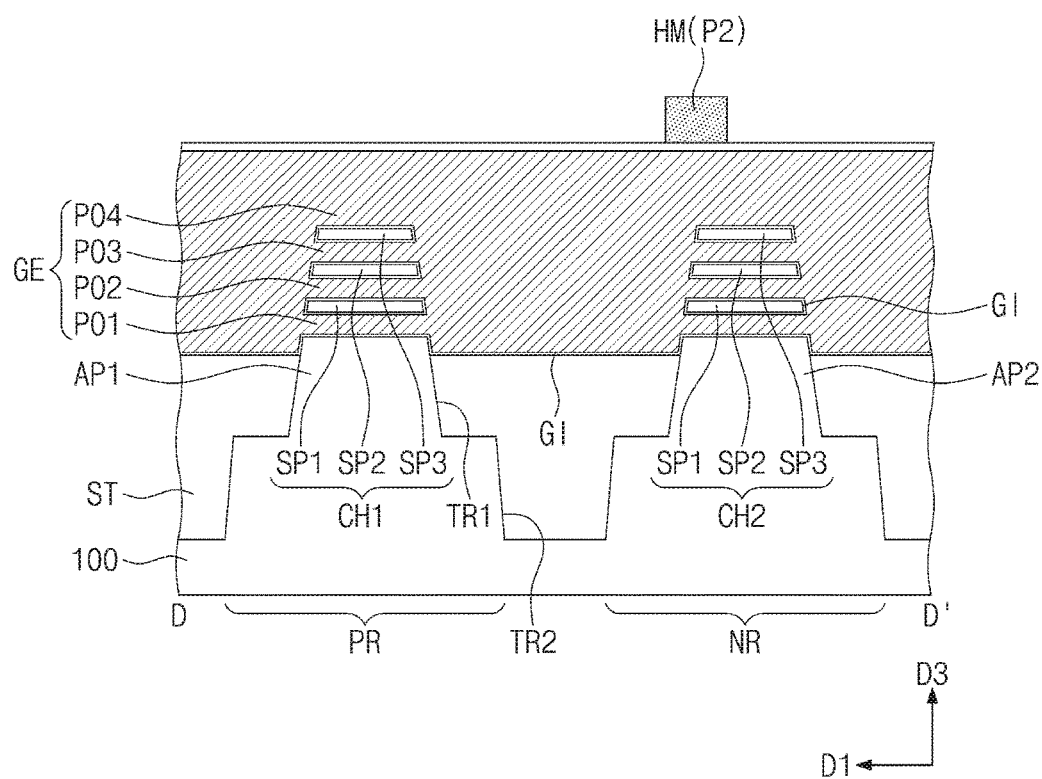
Figure 11A:
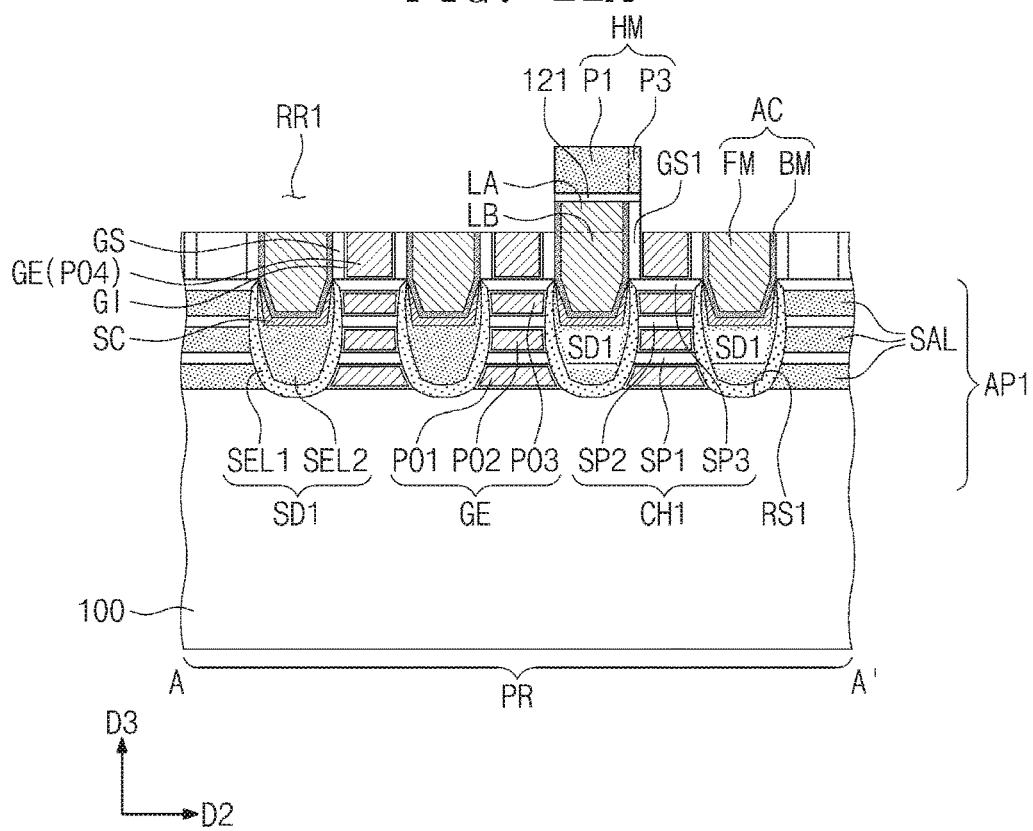
Figure 11B:
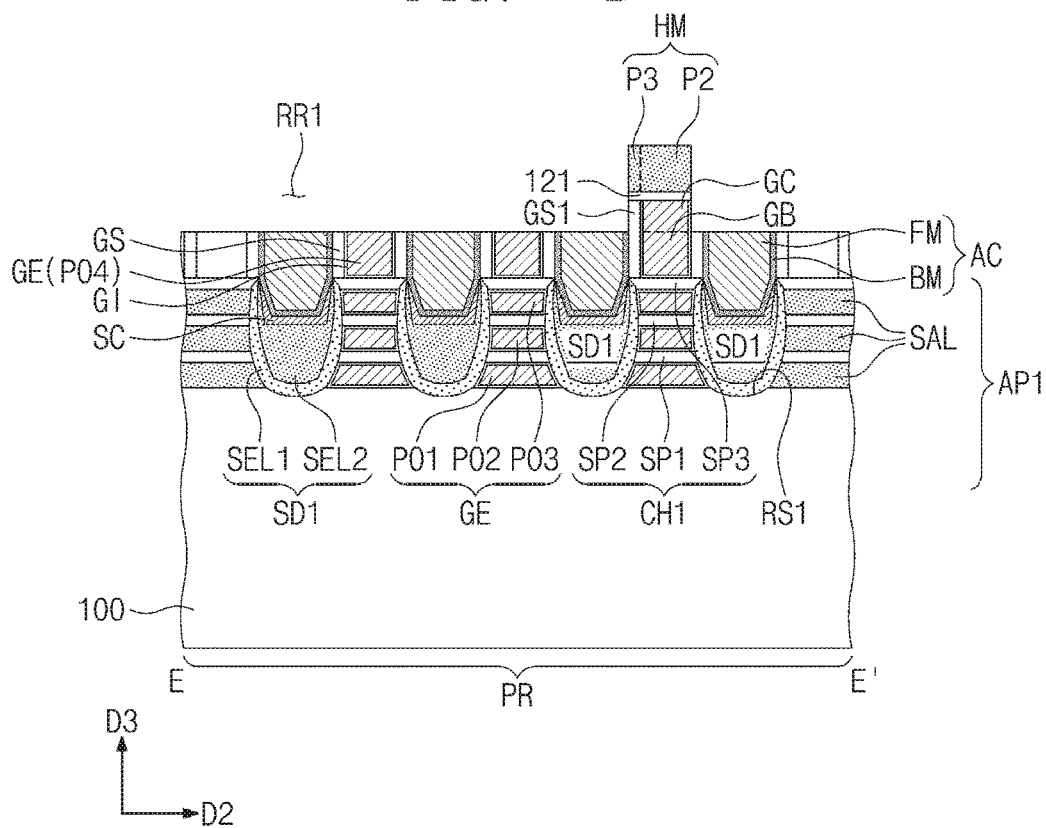
Figure 11C:
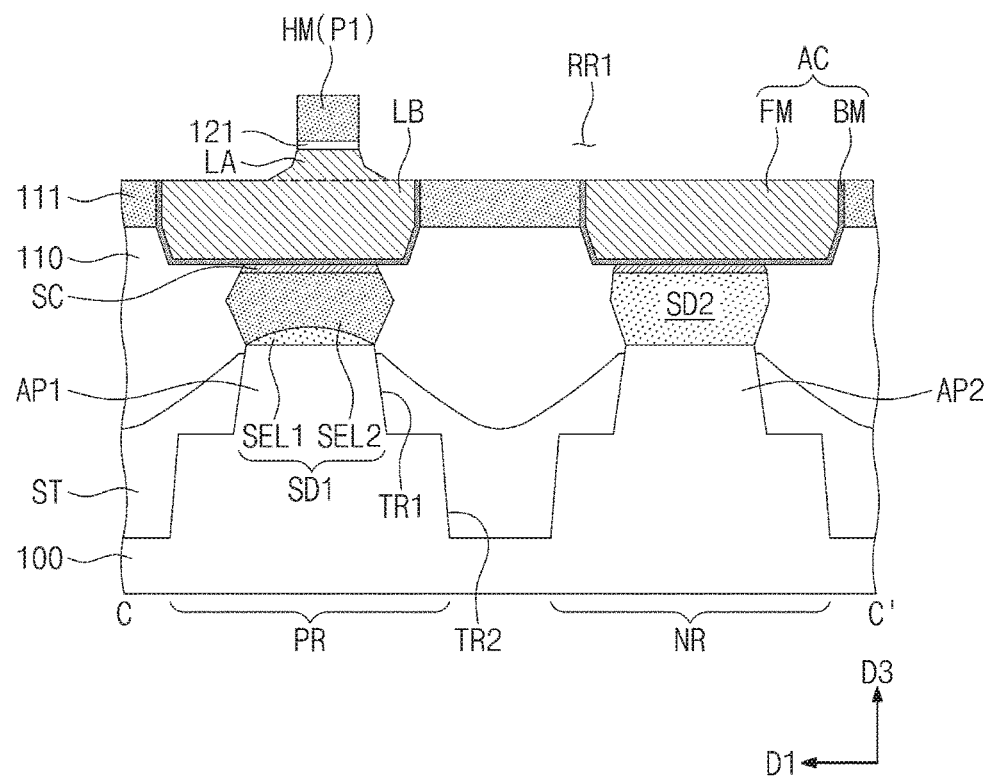
Figure 11D:
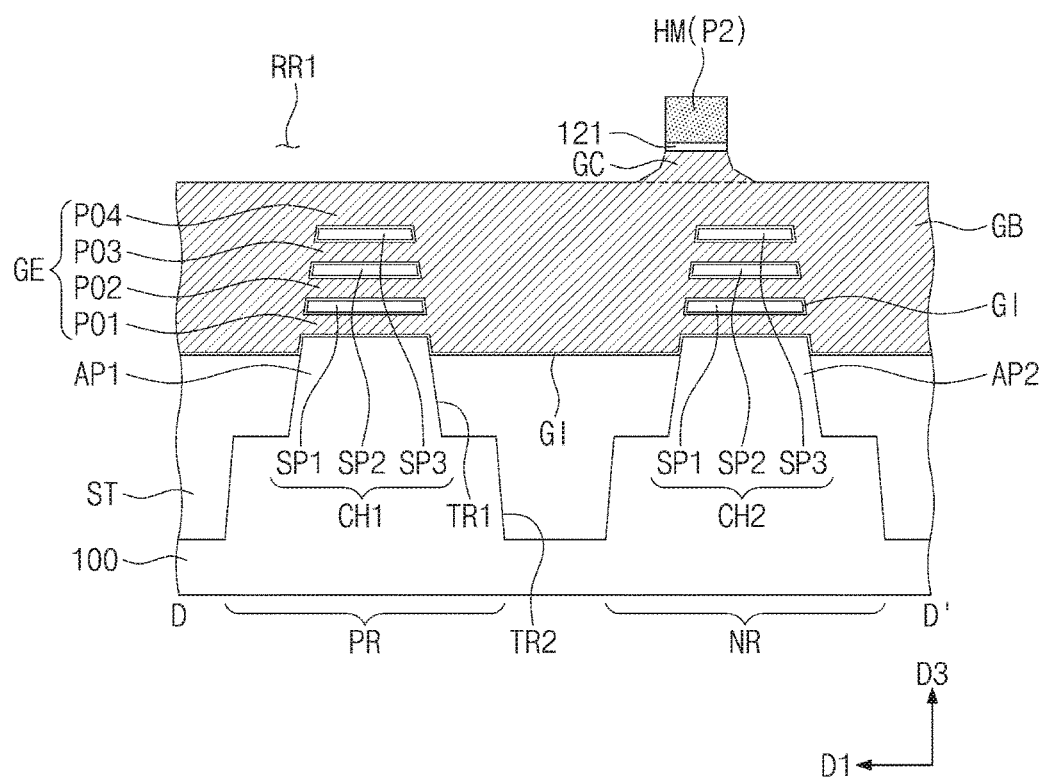
Figure 12A:
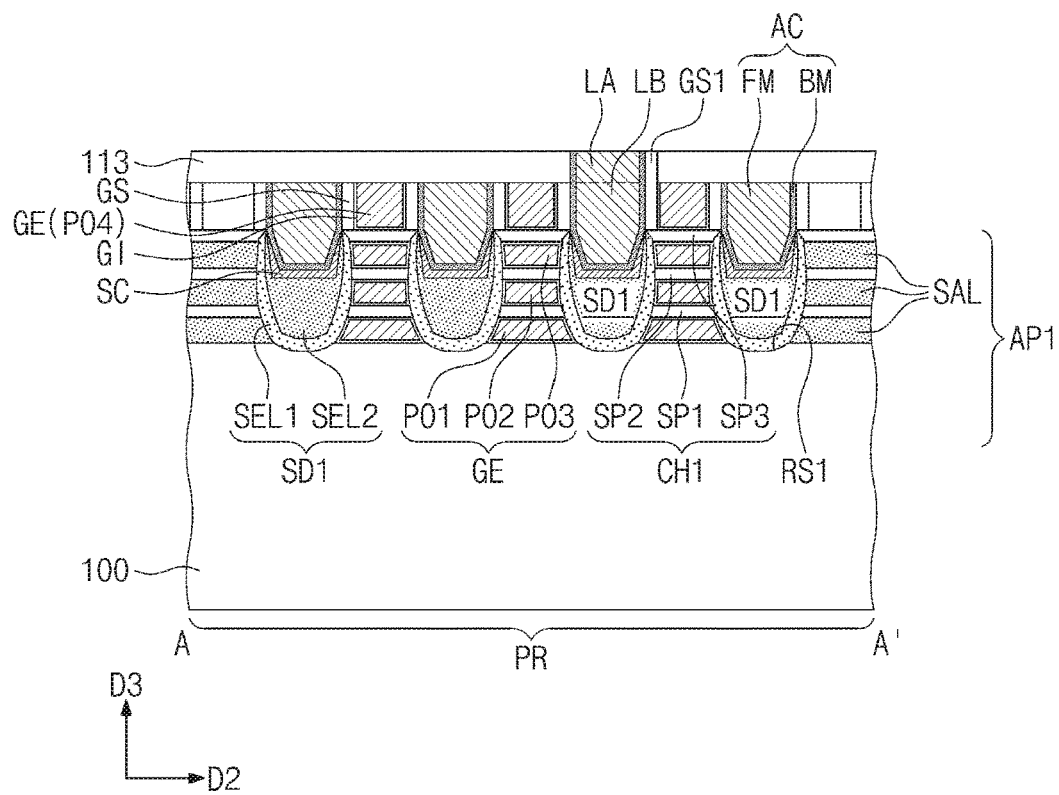
Figure 12B:
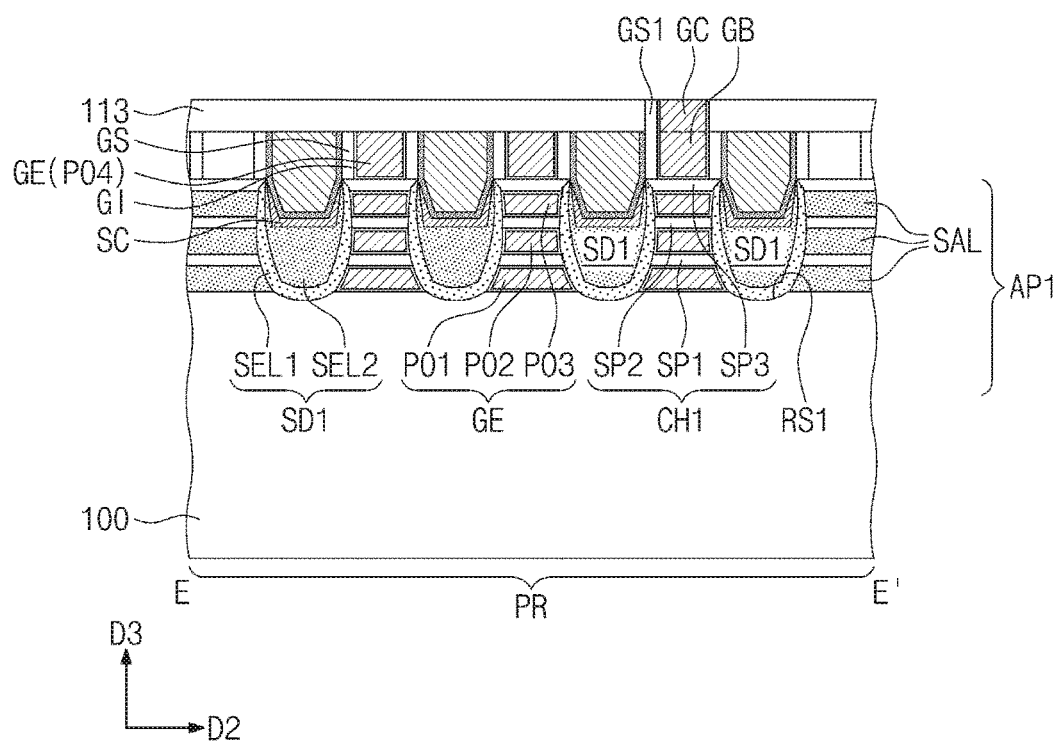
Figure 12C:
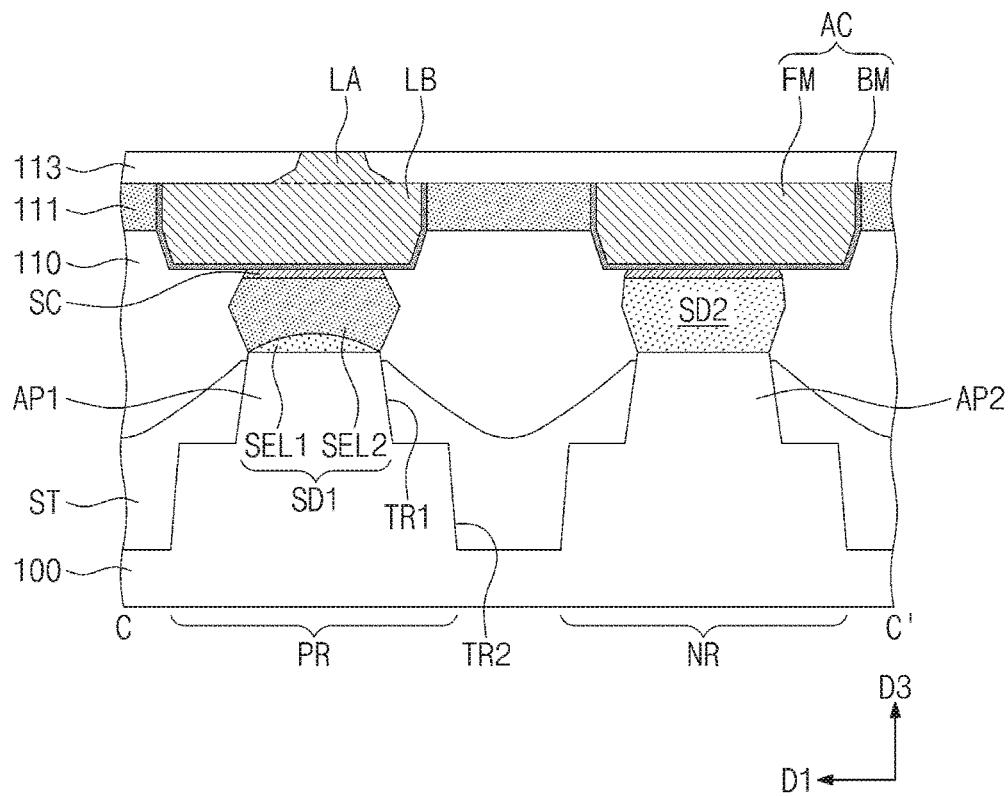
Figure 12D:
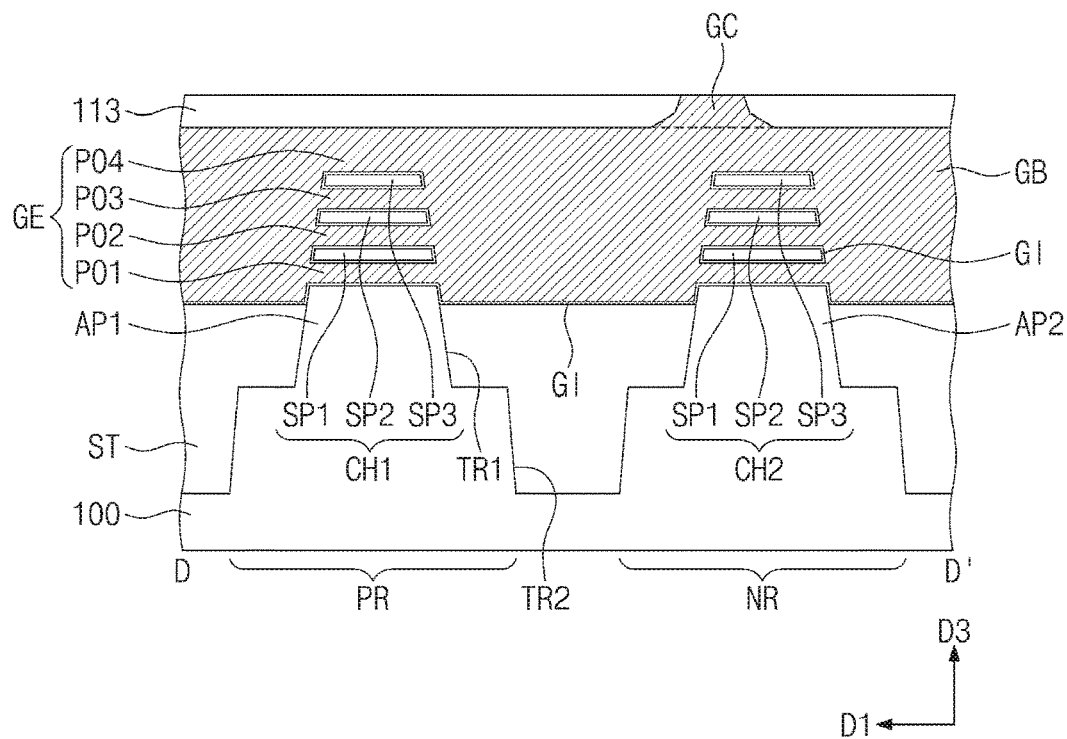
Figure 13A:
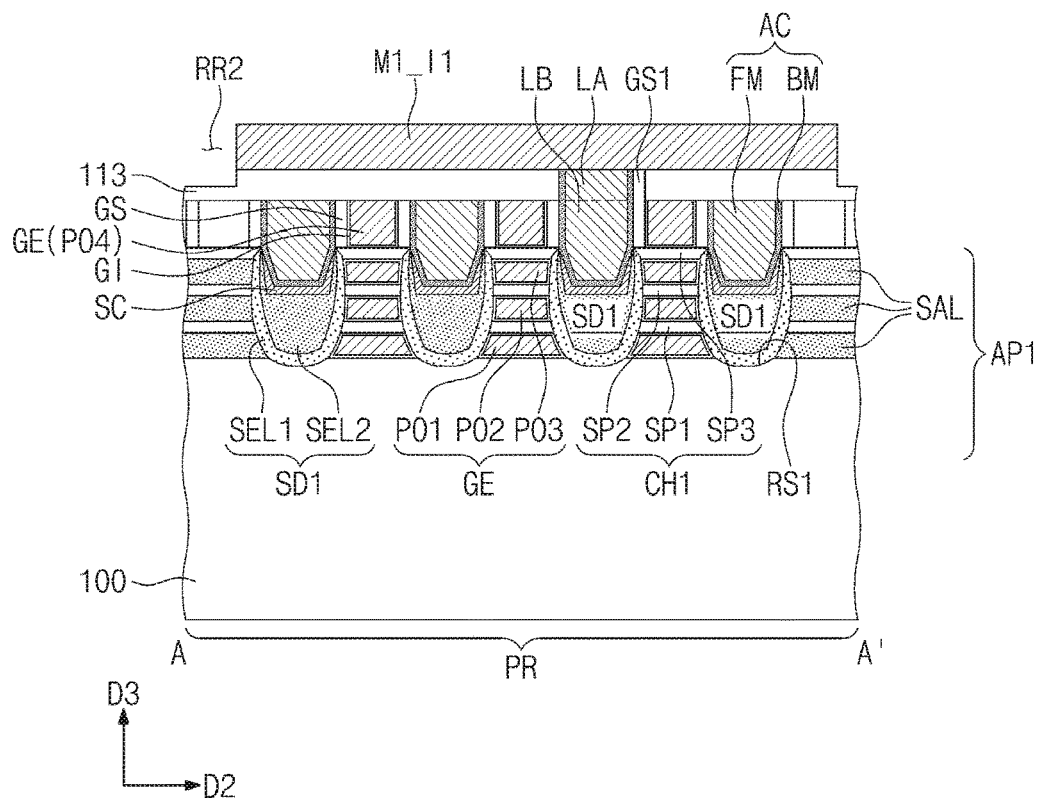
Figure 13B:
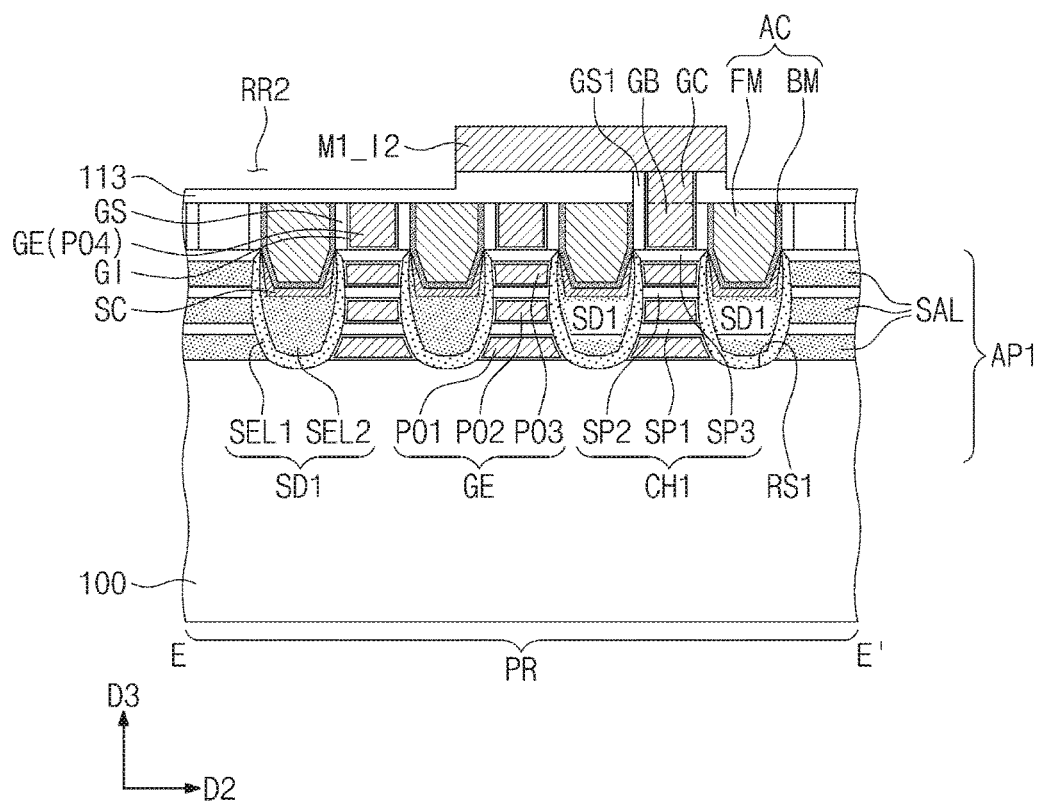
Figure 13C:
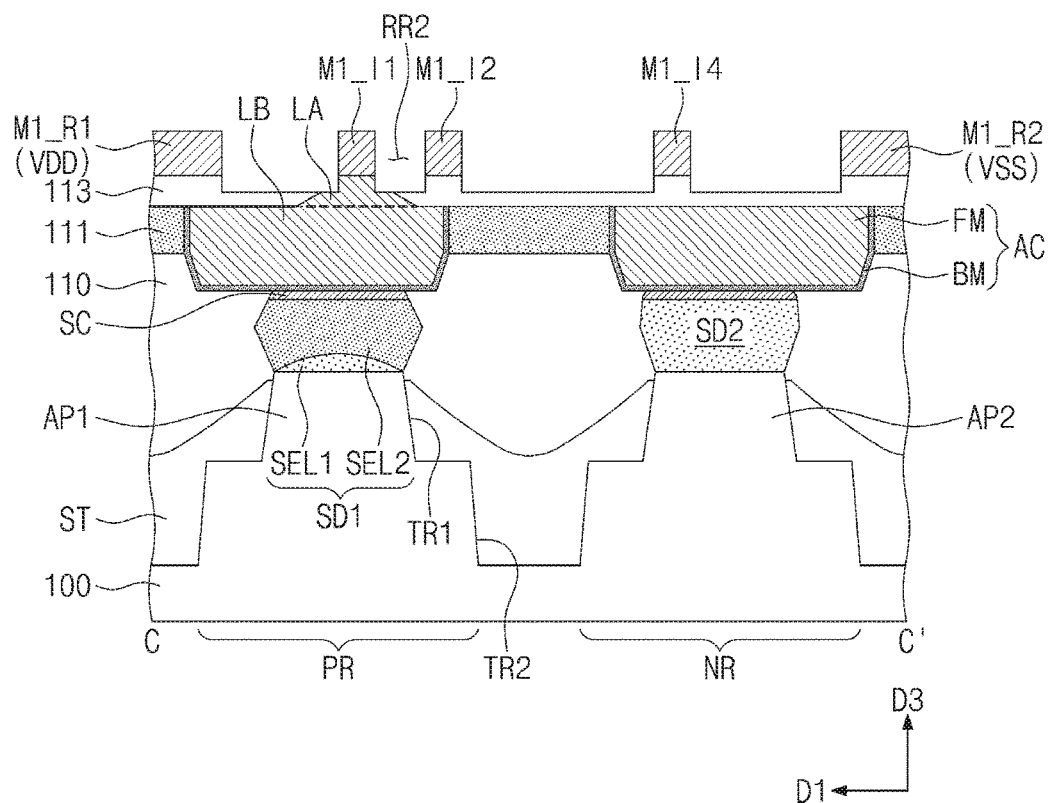
Figure 13D:
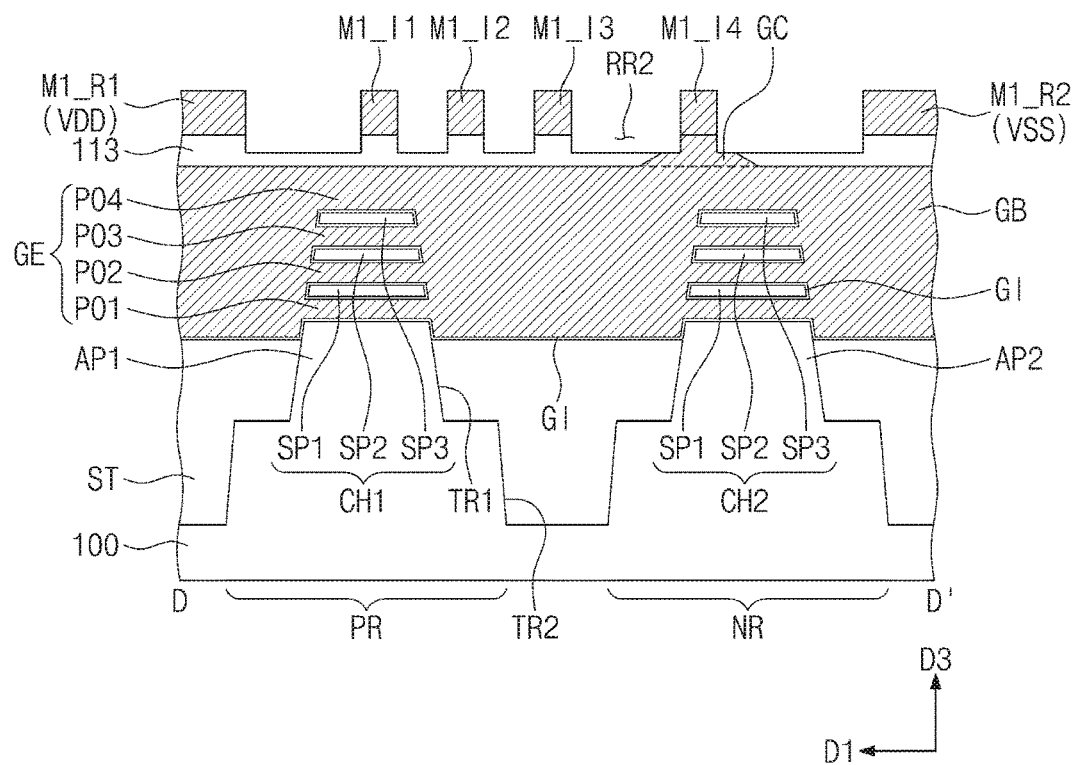

Each of the mask patterns HM may include a first portion P1 for defining the contact protruding portion LA (e.g., see FIG. 11A), a second portion P2 for defining the electrode protruding portion GC (e.g., see FIG. 11B), and a third portion P3 connecting the first portion P1 to the second portion P2. The third portion P3 may cover the first spacer GS1, which is a portion of the spacer GS placed between regions for the contact protruding portion LA and the electrode protruding portion GC. The first portion P1 and the second portion P2 may be offset from each other in the first direction D1, with the third portion P3 interposed therebetween. Since the sizes of the first portion P1 and the second portion P2 may be small (for example, about 20 nm), there is a lifting problem, for example, the first portion P1 and/or the second portion P2 being detached from the blocking insulating layer 120 during an etching process. When a bridge mask pattern such as the third portion P3 is used to connect the first portion P1 and the second portion P2, mask lifting may be prevented from occurring during the etching process. FIG. 10A illustrates an example in which one first portion P1 and one second portion P2 are connected to each other through one third portion P3 interposed therebetween, but at least one of the first to third portions P1 to P3 may be provided in plural.

Referring to FIGS. 11A to 11D, first recess regions RR1 may be formed by etching the upper portions of the gate electrodes GE and the active contacts AC exposed through the mask patterns HM. For example, a patterning process may be performed on the gate electrode GE and the active contact AC using the mask patterns HM as an etch mask. As a result, the electrode protruding portions GC may be formed in the upper portions of the gate electrodes GE, and the contact protruding portions LA may be formed in the upper portions of the active contacts AC. Lower portions of the gate electrodes GE below the electrode protruding portions GC may be defined as the electrode body portions GB, and lower portions of the active contacts AC below the contact protruding portions LA may be defined as the contact body portions LB. The formation of the first recess region RR1 may include at least one of dry and/or wet etching process. The electrode protruding portions GC and the contact protruding portions LA may be formed through the same etching process, but the present inventive concept is not limited thereto. For example, in an example embodiment of the present inventive concept, the electrode protruding portions GC and the contact protruding portions LA may be separately formed by different etching processes. The first recess region RR1 may not be formed in a portion of the first spacer GS1 that is covered with the third portion P3. During the forming of the first recess region RR1, except for the first spacer GS1, upper portions of other portions of the spacers GS may be etched. For example, since the first spacer may not be etched, a top surface of the first spacer GS1 and top surfaces of the electrode protruding portions GC and the contact protruding portions LA may be located at the same height during the forming of the first recess RR1. During forming the first recess region RR1, the blocking insulating layer 120 may also be etched to form blocking insulating patterns 121.

Referring to FIGS. 12A to 12D, the mask patterns HM may be removed, an insulating layer may be formed to fill the first recess region RR1, and then, the second interlayer insulating layer 113 may be formed by performing a planarization process on the insulating layer. A top surface of the second interlayer insulating layer 113 may be formed at a level the same as that of top surfaces of the contact protruding portions LA and top surfaces of the electrode protruding portions GC. The second interlayer insulating layer 113 may be formed of or include at least one of, for example, silicon oxide ($SiO_2$), silicon nitride ($Si_3N_4$), silicon carbide (SiC), silicon oxycarbide (SiOC), or aluminum oxide ($Al_2O_3$).

Referring to FIGS. 13A to 13D, a metal layer may be formed on the second interlayer insulating layer 113 and may be patterned to form the lower interconnection lines M1_R1, M1_R2, and M1_I1 to M1_I5. During the patterning of the metal layer, the second interlayer insulating layer 113, the contact protruding portions LA, and the electrode protruding portions GC may also be partially etched to form the second recess region RR2. In an example embodiment of the present inventive concept, a portion of the first spacer GS1, which is disposed between the gate electrode GE and the active contact AC, may be removed during the forming of the lower interconnection lines M1_R1, M1_R2, and M1_I1 to M1_I5. Since a portion (e.g., top portion) of the first spacer GS1 may be removed, a height of a top surface t3 of the first spacer GS1 may be equal to or lower than a height of the top surface t1 of the contact protruding portion LA (e.g., see FIGS. 3D and 3E). Since a bridge mask pattern such as the third portion P3 of the mask pattern HM is used in an etching process according to an example embodiment of the present inventive concept, mask lifting can be prevented, and the first spacer GS1 disposed between the gate electrode GE and the active contact AC may be less recessed than an etching process having a mask pattern which does not have a bridge mask pattern (e.g., without the third portion P3), thereby enhancing short margin.

Referring back to FIGS. 2A to 2E, the second metal layer M2 including the upper vias VI and the upper interconnection lines M2_I may be formed. The second metal layer M2 may be formed in the fourth interlayer insulating layer 140. The upper interconnection line M2_I and the upper via VI of the second metal layer M2 may be formed at once by a dual damascene process. The lower interconnection lines M1_R1, M1_R2, and M1_I1 to M1_I5 and the upper interconnection lines M2_I may be formed of or include at least one of metallic materials (e.g., aluminum (Al), copper (Cu), tungsten (W), molybdenum (Mo), and cobalt (Co)).

As an integration density of a semiconductor device increases, a size of a mask pattern, which is used to form a fine structure, is decreasing. In this case, since a contact area between the mask pattern and an underlying layer is reduced, the mask pattern may be detached or misaligned from the underlying layer by various causes. This may lead to a process failure or reduction in reliability of a semiconductor device. According to an example embodiment of the present inventive concept, mask patterns, which are respectively used to form a contact protruding portion and an electrode protruding portion, may be formed to be connected to each other. In this case, the mask patterns being detached from the underlying layer and consequently a process failure in the semiconductor device may be prevented from occurring.

In a semiconductor device according to an example embodiment of the present inventive concept, since an upper portion of an active contact and an upper portion of a gate electrode are used as a contact protruding portion and an electrode protruding portion, it may be possible to connect the active contact and the gate electrode to lower interconnection lines without an additional via or contact for connection with the lower interconnection lines. Accordingly, a misalignment issue or a connection failure, which may occur when the additional via or contact is formed, may be prevented from occurring. In addition, due to recess regions, it may be possible to separate the contact protruding portion from the electrode protruding portion by a sufficient large distance and thereby to prevent a process failure (e.g., a contact or short issue between the contact protruding portion and the electrode protruding portion).

According to an example embodiment of the present inventive concept, mask patterns, which are respectively used to form the contact protruding portion and the electrode protruding portion, may be formed to be connected to each other. In this case, the mask patterns being detached from an underlying layer and consequently a process failure in the semiconductor device may be prevented from occurring.

While example embodiments of the present inventive concept have been particularly shown and described, it will be understood by one of ordinary skill in the art that variations in form and detail may be made therein without departing from the spirit and scope of the present inventive concept as defined in the appended claims.

What is claimed is:

1. A semiconductor device, comprising:
   an active pattern on a substrate;
   a source/drain pattern on the active pattern;
   a channel pattern connected to the source/drain pattern;
   a gate electrode on the channel pattern;
   a gate insulating layer interposed between the channel pattern and the gate electrode;
   an active contact on the source/drain pattern;
   a first lower interconnection line on the active contact;
   a second lower interconnection line provided on the gate electrode and disposed at a level the same as that of the first lower interconnection line;
   a first spacer between the gate electrode and the active contact; and
   a second spacer spaced apart from the first spacer with the gate electrode or the active contact interposed therebetween,
   wherein the gate electrode comprises an electrode body portion and an electrode protruding portion, which protrudes from a top surface of the electrode body portion and is in contact with a bottom surface of the second lower interconnection line,
   the active contact comprises a contact body portion and a contact protruding portion, which protrudes from a top surface of the contact body portion and is in contact with a bottom surface of the first lower interconnection line,
   the second spacer is separated from the gate electrode by the gate insulating layer, and
   a top surface of the first spacer is higher than a top surface of the second spacer.

2. The semiconductor device of claim 1, wherein the first spacer comprises:
   a first portion adjacent to the electrode protruding portion;
   a second portion adjacent to the contact protruding portion; and
   a third portion between the first portion and the second portion,
   wherein a top surface of the first portion and a top surface of the second portion are higher than a top surface of the third portion.

3. The semiconductor device of claim 2, wherein the first spacer further comprises a fourth portion spaced apart from the third portion with the first portion or the second portion interposed therebetween, and
   the top surface of the third portion is higher than a top surface of the fourth portion.

4. The semiconductor device of claim 1, wherein a height of a top surface of the contact protruding portion is equal to or higher than a height of the top surface of the first spacer.

5. The semiconductor device of claim 1, wherein a height of a top surface of the electrode protruding portion is equal to or higher than a height of the top surface of the first spacer.

6. The semiconductor device of claim 1, wherein a top surface of the electrode protruding portion is located at a level the same as that of a top surface of the contact protruding portion.

7. The semiconductor device of claim 1, wherein the electrode body portion and the electrode protruding portion are provided to have no interface therebetween and to form a single object.

8. The semiconductor device of claim 1, wherein the electrode protruding portion comprises a stepwise structure having a side surface whose slope is discontinuously changed.

9. The semiconductor device of claim 1, wherein the contact protruding portion comprises a side surface aligned to a side surface of the first lower interconnection line.

10. The semiconductor device of claim 1, wherein the contact body portion and the contact protruding portion are provided to have no interface therebetween and to form a single object.

11. The semiconductor device of claim 1, wherein the active contact comprises a barrier pattern, and
    the barrier pattern extends from a side surface of the contact body portion to a side surface of the contact protruding portion.

12. The semiconductor device of claim 1, wherein the contact protruding portion comprises a stepwise structure having a side surface whose slope is discontinuously changed.

13. A semiconductor device, comprising:
    an active pattern on a substrate;
    a source/drain pattern on the active pattern;
    a channel pattern connected to the source/drain pattern;
    a gate electrode on the channel pattern;
    an active contact on the source/drain pattern;
    a first lower interconnection line on the active contact;
    a second lower interconnection line provided on the gate electrode and disposed at a level the same as that of the first lower interconnection line; and
    a first spacer between the gate electrode and the active contact,
    wherein the gate electrode comprises an electrode body portion and an electrode protruding portion, which protrudes from a top surface of the electrode body portion and is in contact with a bottom surface of the second lower interconnection line,
    the active contact comprises a contact body portion and a contact protruding portion, which protrudes from a top surface of the contact body portion and is in contact with a bottom surface of the first lower interconnection line,
    the first spacer comprises:
    a first portion adjacent to the electrode protruding portion;
    a second portion adjacent to the contact protruding portion; and
    a third portion between the first portion and the second portion, and
    a top surface of the first portion and a top surface of the second portion are higher than a top surface of the third portion.

14. The semiconductor device of claim 13, wherein the first spacer further comprises a fourth portion spaced apart from the third portion with the first portion or the second portion interposed therebetween, and
    the top surface of the third portion is higher than a top surface of the fourth portion.

15. The semiconductor device of claim 13, wherein a height of a top surface of the contact protruding portion is equal to or higher than a height of a top surface of the first spacer.

16. The semiconductor device of claim 13, wherein a height of a top surface of the electrode protruding portion is equal to or higher than a height of a top surface of the first spacer.

17. The semiconductor device of claim 13, wherein a top surface of the electrode protruding portion is located at a level the same as that of a top surface of the contact protruding portion.

18. A semiconductor device, comprising:
- a substrate including a PMOSFET region and an NMOSFET region, which are adjacent to each other in a first direction;
- a first active pattern and a second active pattern provided on the PMOSFET and NMOSFET regions, respectively;
- a first source/drain pattern on the first active pattern and a second source/drain pattern on the second active pattern;
- active contacts on the first source/drain pattern and the second source/drain pattern;
- a first channel pattern and a second channel pattern, which are respectively connected to the first source/drain pattern and the second source/drain pattern, each of the first and second channel patterns comprising a first semiconductor pattern, a second semiconductor pattern, and a third semiconductor pattern, which are sequentially stacked and spaced apart from each other;
- a first gate electrode and a second gate electrode, which extend in the first direction to cross the first and second active patterns, respectively, and each of which includes a first portion interposed between the substrate and the first semiconductor pattern, a second portion interposed between the first semiconductor pattern and the second semiconductor pattern, a third portion interposed between the second semiconductor pattern and the third semiconductor pattern, and a fourth portion on the third semiconductor pattern;
- a first gate insulating layer and a second gate insulating layer, which are respectively interposed between the first channel pattern and the first gate electrode and between the second channel pattern and the second gate electrode;
- a first metal layer on the first and second gate electrodes, the first metal layer comprising first interconnection lines;
- a first spacer between the first gate electrode and one of the active contacts;
- a second spacer spaced apart from the first spacer with the first gate electrode or one of the active contacts interposed therebetween; and
- a second metal layer provided on the first metal layer, the second metal layer comprising second interconnection lines, which are electrically and respectively connected to the first interconnection lines,
- wherein each of the active contacts comprises a contact body portion and a contact protruding portion, which protrudes from a top surface of the contact body portion and is in contact with a bottom surface of one of the first interconnection lines,
- each of the first and second gate electrodes comprises an electrode body portion and an electrode protruding portion, which protrudes from a top surface of the electrode body portion and is in contact with a bottom surface of an other one of the first interconnection lines,
- the second spacer is separated from the first gate electrode by the first gate insulating layer, and
- a top surface of the first spacer is higher than a top surface of the second spacer.

19. The semiconductor device of claim 18, wherein the first spacer comprises:
- a first part adjacent to the electrode protruding portion;
- a second part adjacent to the contact protruding portion; and
- a third part between the first part and the second part,
- wherein a top surface of the first part and a top surface of the second part is higher than a top surface of the third part.

20. The semiconductor device of claim 19, wherein the first spacer further comprises a fourth part spaced apart from the third part with the first part or the second part interposed therebetween, and
the top surface of the third part is higher than a top surface of the fourth part.

* * * * *